(12) United States Patent
Yamazaki et al.

(10) Patent No.: US 10,217,776 B2
(45) Date of Patent: Feb. 26, 2019

(54) SEMICONDUCTOR DEVICE COMPRISING FIRST METAL OXIDE FILM AND SECOND METAL OXIDE FILM

(71) Applicant: Semiconductor Energy Laboratory Co., Ltd., Atsugi-shi, Kanagawa-ken (JP)

(72) Inventors: Shunpei Yamazaki, Tokyo (JP); Masahiro Katayama, Tochigi (JP); Ami Sato, Tochigi (JP); Yukinori Shima, Gunma (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/281,165

(22) Filed: Sep. 30, 2016

(65) Prior Publication Data

US 2017/0018578 A1 Jan. 19, 2017

Related U.S. Application Data

(63) Continuation of application No. 14/011,899, filed on Aug. 28, 2013, now Pat. No. 9,478,535.

(30) Foreign Application Priority Data

Aug. 31, 2012 (JP) .................................. 2012-192214
Mar. 15, 2013 (JP) .................................. 2013-054021

(51) Int. Cl.
*H01L 27/12* (2006.01)
*H01L 27/06* (2006.01)
(Continued)

(52) U.S. Cl.
CPC ........ *H01L 27/1255* (2013.01); *G02F 1/1368* (2013.01); *G02F 1/133345* (2013.01);
(Continued)

(58) Field of Classification Search
CPC .................................................. H01L 27/1255
See application file for complete search history.

(56) References Cited

U.S. PATENT DOCUMENTS 5,299,041 A 3/1994 Morin et al.
5,724,107 A 3/1998 Nishikawa et al.
(Continued)

FOREIGN PATENT DOCUMENTS

CN 101897031 A 11/2010
CN 101997007 A 3/2011
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Lex Malsawma
*Assistant Examiner* — Xia Cross
(74) *Attorney, Agent, or Firm* — Fish & Richardson P.C.

(57) ABSTRACT

A semiconductor device including a capacitor having an increased charge capacity without decreasing an aperture ratio is provided. The semiconductor device includes a transistor including a light-transmitting semiconductor film, a capacitor in which a dielectric film is provided between a pair of electrodes, and a pixel electrode electrically connected to the transistor. In the capacitor, a conductive film formed on the same surface as the light-transmitting semiconductor film in the transistor serves as one electrode, the pixel electrode serves as the other electrode, and a nitride insulating film and a second oxide insulating film which are provided between the light-transmitting semiconductor film and the pixel electrode serve as the a dielectric film.

22 Claims, 32 Drawing Sheets

(51) Int. Cl.
  *G02F 1/1333*   (2006.01)
  *G02F 1/1368*   (2006.01)
  *H01L 29/786*   (2006.01)
  *G02F 1/133*    (2006.01)
  *G02F 1/1343*   (2006.01)
  *G02F 1/1362*   (2006.01)
  *G06F 3/041*    (2006.01)

(52) U.S. Cl.
  CPC ........ *H01L 27/0629* (2013.01); *H01L 27/124* (2013.01); *H01L 27/1225* (2013.01); *H01L 29/7869* (2013.01); *G02F 1/13306* (2013.01); *G02F 1/13338* (2013.01); *G02F 1/134336* (2013.01); *G02F 1/136286* (2013.01); *G02F 2001/133302* (2013.01); *G02F 2201/121* (2013.01); *G02F 2201/123* (2013.01); *G06F 3/0412* (2013.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,421,101 B1 | 7/2002 | Zhang et al. |
| 6,545,305 B1 | 4/2003 | Randazzo |
| 6,559,477 B2 | 5/2003 | Tada et al. |
| 6,563,174 B2 | 5/2003 | Kawasaki et al. |
| 6,727,522 B1 | 4/2004 | Kawasaki et al. |
| 6,784,949 B1 | 8/2004 | Nagata et al. |
| 6,955,953 B2 | 10/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,142,260 B2 | 11/2006 | Yang |
| 7,211,825 B2 | 5/2007 | Shih et al. |
| 7,250,991 B2 | 7/2007 | Nagata et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,515,217 B2 | 4/2009 | Yang |
| 7,674,650 B2 | 3/2010 | Akimoto et al. |
| 7,732,819 B2 | 6/2010 | Akimoto et al. |
| 7,745,798 B2 | 6/2010 | Takahashi |
| 7,773,167 B2 | 8/2010 | Tsai et al. |
| 7,847,904 B2 | 12/2010 | Kimura |
| 7,872,261 B2 | 1/2011 | Ikeda |
| 8,039,842 B2 | 10/2011 | Jinbo |
| 8,102,476 B2 | 1/2012 | Son et al. |
| 8,237,162 B2 | 8/2012 | Arai |
| 8,368,066 B2 | 2/2013 | Yamazaki et al. |
| 8,384,077 B2 | 2/2013 | Yano et al. |
| 8,426,862 B2 | 4/2013 | Arai |
| 8,441,011 B2 | 5/2013 | Yamazaki et al. |
| 8,481,373 B2 | 7/2013 | Okabe et al. |
| 8,537,318 B2 | 9/2013 | Kimura |
| 8,546,180 B2 | 10/2013 | Yamazaki et al. |
| 8,610,862 B2 | 12/2013 | Kimura |
| 8,822,990 B2 | 9/2014 | Yamazaki et al. |
| 9,224,870 B2 | 12/2015 | Yamazaki et al. |
| 9,293,601 B2 | 3/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189210 A1 | 10/2003 | Yamazaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0169991 A1 | 9/2004 | Nagata et al. |
| 2004/0183978 A1 | 9/2004 | Jeoung |
| 2004/0246424 A1 | 12/2004 | Sawasaki et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091399 A1 | 5/2006 | Lee |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0188671 A1 | 8/2007 | Hwang et al. |
| 2007/0194379 A1 | 8/2007 | Hosono et al. |
| 2007/0215945 A1 | 9/2007 | Tokunaga et al. |
| 2007/0236640 A1 | 10/2007 | Kimura |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141203 A1 | 6/2009 | Son et al. |
| 2009/0152506 A1 | 6/2009 | Umeda et al. |
| 2009/0152541 A1 | 6/2009 | Maekawa et al. |
| 2009/0189156 A1 | 7/2009 | Akimoto |
| 2009/0242888 A1 | 10/2009 | Hosoya |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0289256 A1 | 11/2009 | Jinbo |

(56) References Cited

U.S. PATENT DOCUMENTS

| | | |
|---|---|---|
| 2010/0044711 A1 | 2/2010 | Imai |
| 2010/0065844 A1 | 3/2010 | Tokunaga |
| 2010/0084655 A1 | 4/2010 | Iwasaki et al. |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2010/0123136 A1 | 5/2010 | Lee et al. |
| 2010/0159639 A1* | 6/2010 | Sakata ............. H01L 21/02565 438/104 |
| 2010/0163867 A1 | 7/2010 | Yamazaki et al. |
| 2010/0163874 A1 | 7/2010 | Koyama et al. |
| 2010/0289020 A1 | 11/2010 | Yano et al. |
| 2011/0024750 A1 | 2/2011 | Yamazaki et al. |
| 2011/0024751 A1 | 2/2011 | Yamazaki et al. |
| 2011/0031491 A1 | 2/2011 | Yamazaki et al. |
| 2011/0031492 A1* | 2/2011 | Yamazaki ........... H01L 27/1225 257/43 |
| 2011/0031497 A1 | 2/2011 | Yamazaki et al. |
| 2011/0032435 A1 | 2/2011 | Kimura |
| 2011/0037068 A1 | 2/2011 | Yamazaki et al. |
| 2011/0084271 A1 | 4/2011 | Yamazaki et al. |
| 2011/0284848 A1 | 11/2011 | Yamazaki |
| 2011/0297930 A1 | 12/2011 | Choi et al. |
| 2012/0062811 A1 | 3/2012 | Miyake |
| 2012/0062813 A1* | 3/2012 | Koyama ........... G02F 1/136213 349/43 |
| 2012/0108018 A1 | 5/2012 | Okabe et al. |
| 2012/0161820 A1 | 6/2012 | Koo et al. |
| 2012/0211745 A1 | 8/2012 | Ueda et al. |
| 2012/0273780 A1 | 11/2012 | Yamazaki et al. |
| 2012/0280230 A1 | 11/2012 | Akimoto et al. |
| 2013/0134424 A1 | 5/2013 | Kim et al. |
| 2013/0146452 A1 | 6/2013 | Yano et al. |
| 2013/0328044 A1 | 12/2013 | Yamazaki et al. |
| 2014/0014948 A1 | 1/2014 | Matsukura |
| 2014/0034954 A1 | 2/2014 | Yamazaki et al. |
| 2014/0042432 A1 | 2/2014 | Yamazaki |
| 2014/0042443 A1 | 2/2014 | Yamazaki |
| 2014/0061636 A1 | 3/2014 | Miyake et al. |
| 2014/0070209 A1 | 3/2014 | Yamazaki et al. |
| 2014/0098334 A1 | 4/2014 | Kimura |
| 2016/0190175 A1 | 6/2016 | Yamazaki et al. |

FOREIGN PATENT DOCUMENTS

| | | |
|---|---|---|
| CN | 102473362 A | 5/2012 |
| CN | 102906804 A | 1/2013 |
| EP | 1037095 A | 9/2000 |
| EP | 1737044 A | 12/2006 |
| EP | 1843194 A | 10/2007 |
| EP | 2192441 A | 6/2010 |
| EP | 2226847 A | 9/2010 |
| EP | 2458577 A | 5/2012 |
| EP | 2579237 A | 4/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-129234 A | 5/1989 |
| JP | 05-251705 A | 9/1993 |
| JP | 07-104312 A | 4/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-323698 A | 11/2000 |
| JP | 2001-051300 A | 2/2001 |
| JP | 2002-050761 A | 2/2002 |
| JP | 2002-076356 A | 3/2002 |
| JP | 2002-289859 A | 10/2002 |
| JP | 2002-359252 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-077822 A | 3/2005 |
| JP | 2007-096055 A | 4/2007 |
| JP | 2007-123861 A | 5/2007 |
| JP | 2007-298976 A | 11/2007 |
| JP | 2008-009425 A | 1/2008 |
| JP | 2010-004027 A | 1/2010 |
| JP | 5133468 | 1/2010 |
| JP | 2010-114213 A | 5/2010 |
| JP | 2010-171394 A | 8/2010 |
| JP | 2010-243741 A | 10/2010 |
| JP | 2011-049540 A | 3/2011 |
| JP | 2011-054949 A | 3/2011 |
| JP | 2012-018970 A | 1/2012 |
| JP | 2012-083738 A | 4/2012 |
| JP | 5074625 | 11/2012 |
| KR | 2004-0012208 A | 2/2004 |
| KR | 2010-0094509 A | 8/2010 |
| KR | 2011-0076372 A | 7/2011 |
| KR | 2012-0136426 A | 12/2012 |
| TW | 200937638 | 9/2009 |
| WO | WO-2001/033292 | 5/2001 |
| WO | WO-2004/114391 | 12/2004 |
| WO | WO-2009/075281 | 6/2009 |
| WO | WO-2011/010415 | 1/2011 |
| WO | WO-2011/013561 | 2/2011 |
| WO | WO-2011/148537 | 12/2011 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

(56) References Cited

OTHER PUBLICATIONS

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.

(56) References Cited

OTHER PUBLICATIONS

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '03 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTS", IDW'09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2013/070677) dated Sep. 17, 2013.

Written Opinion (Application No. PCT/JP2013/070677) dated Sep. 17, 2013.

International Search Report (Application No. PCT/JP2013/074167) dated Oct. 8, 2013.

Written Opinion (Application No. PCT/JP2013/074167) dated Oct. 8, 2013.

Allowed Claims (U.S. Appl. No. 13/957,819) Submitted Sep. 8, 2015.

Allowed Claims (U.S. Appl. No. 14/023,295) Submitted Jan. 28, 2016.

Taiwanese Office Action (Application No. 105142063), dated May 12, 2017.

Chinese Office Action (Application No. 201310390927.6), dated May 2, 2017.

\* cited by examiner

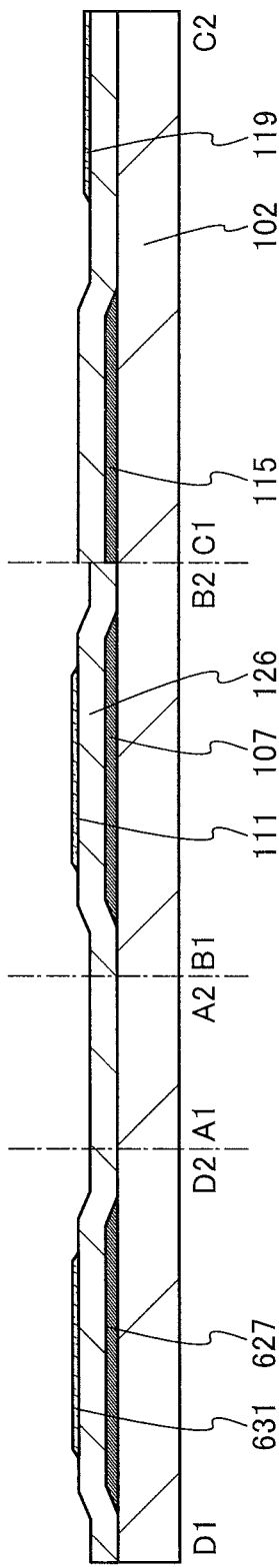
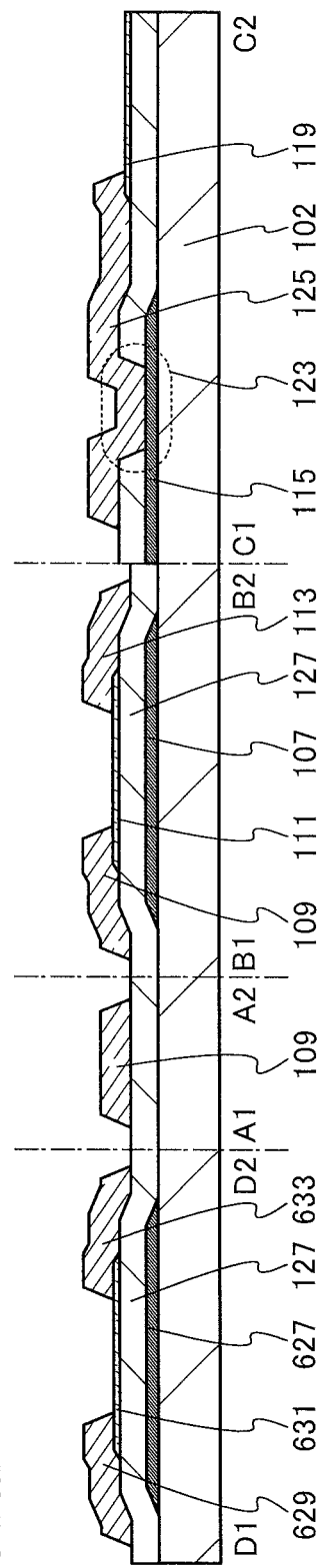
FIG. 4A
FIG. 4B

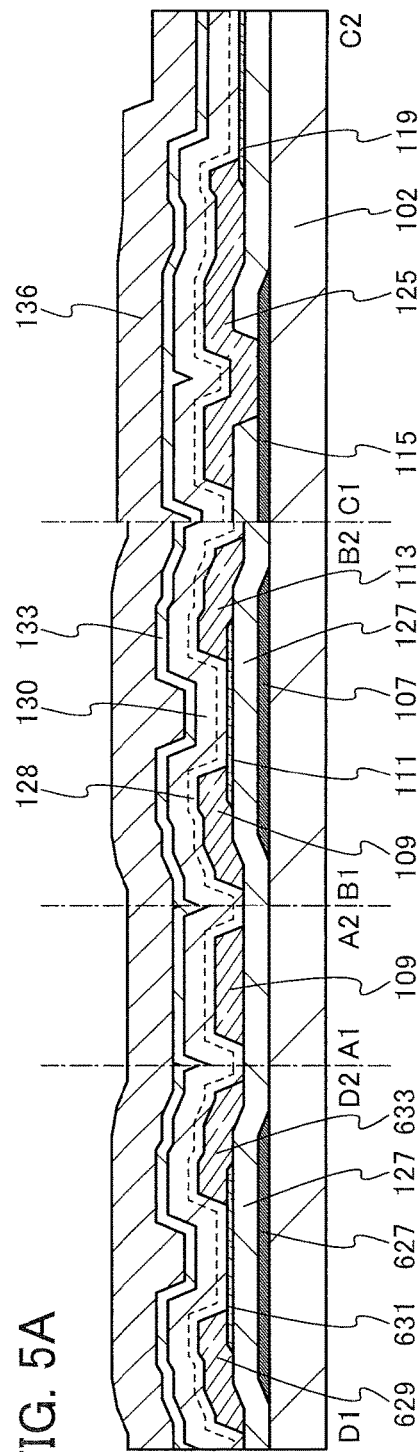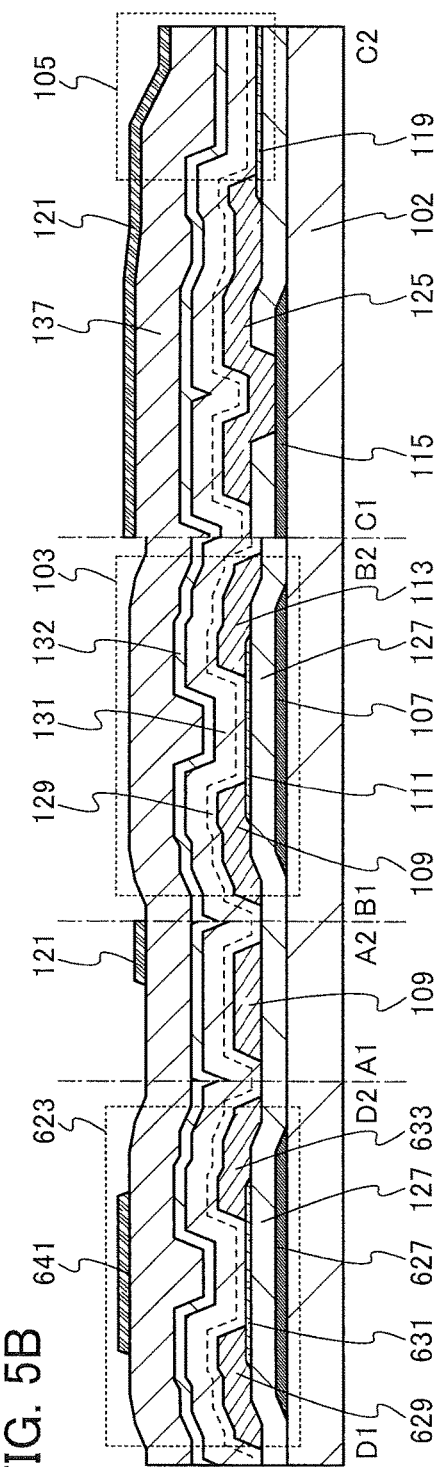

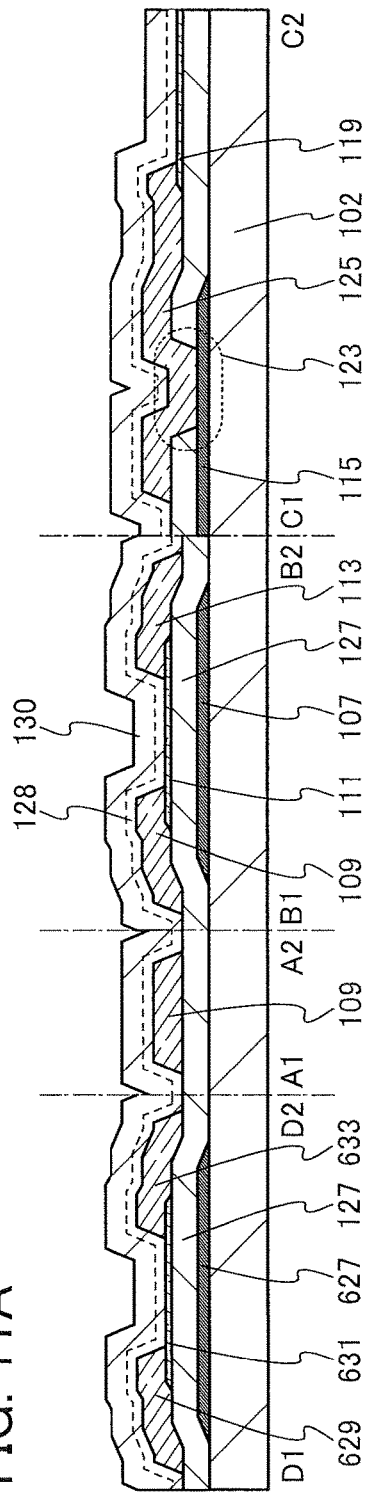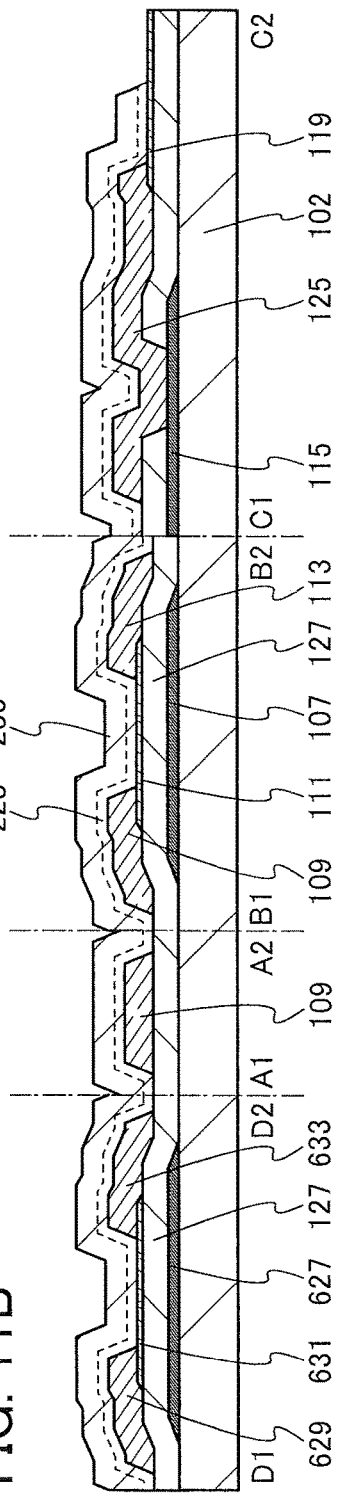

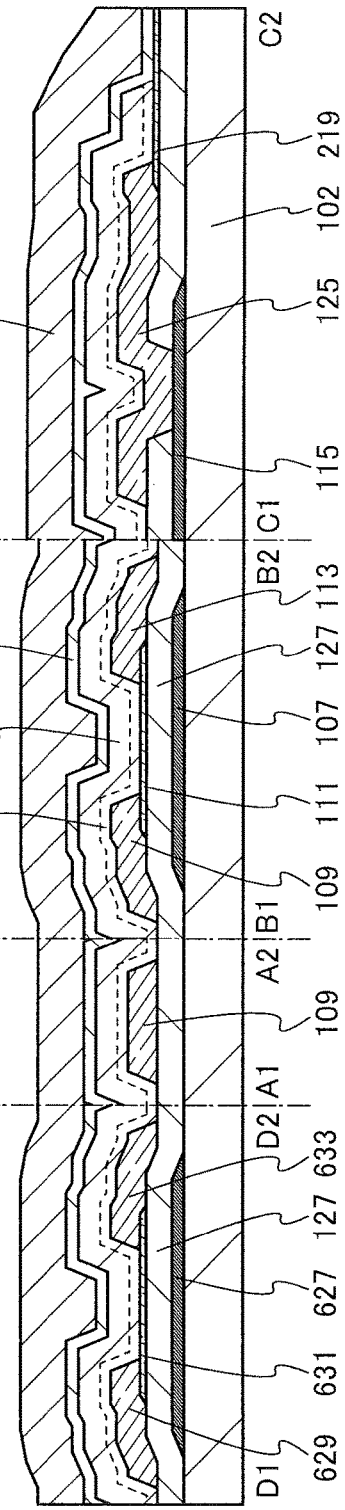
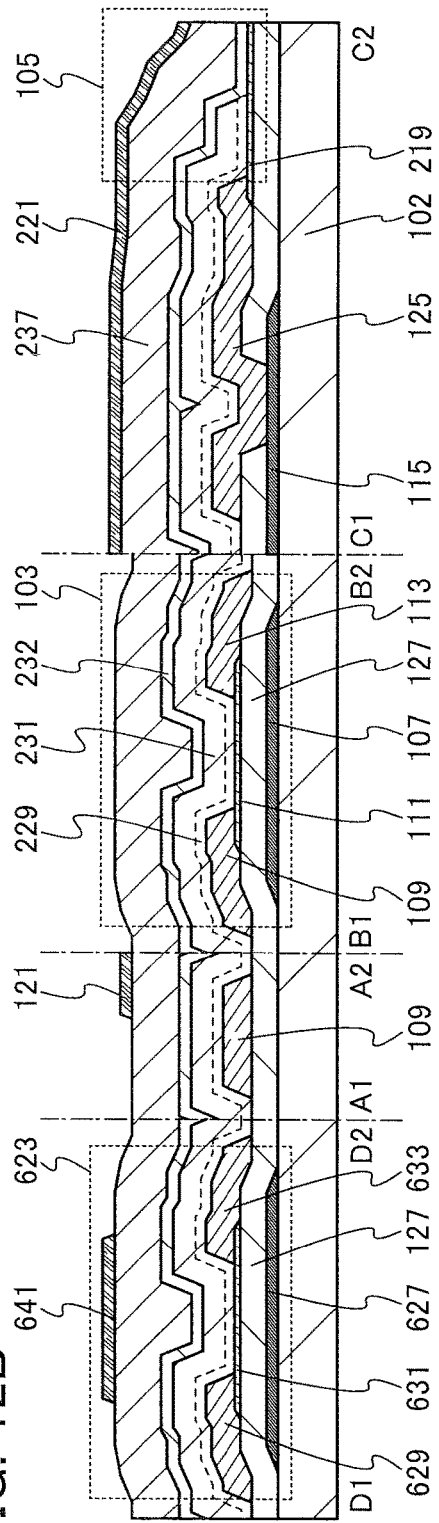
FIG. 12A
FIG. 12B

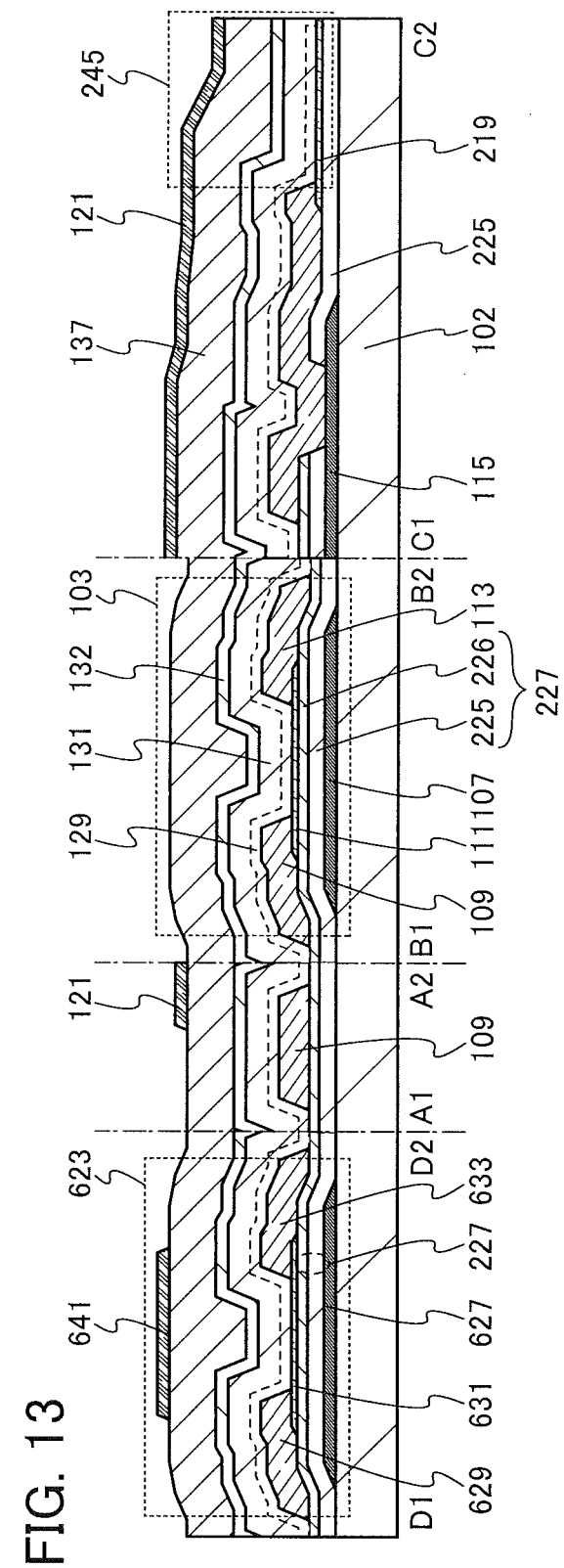

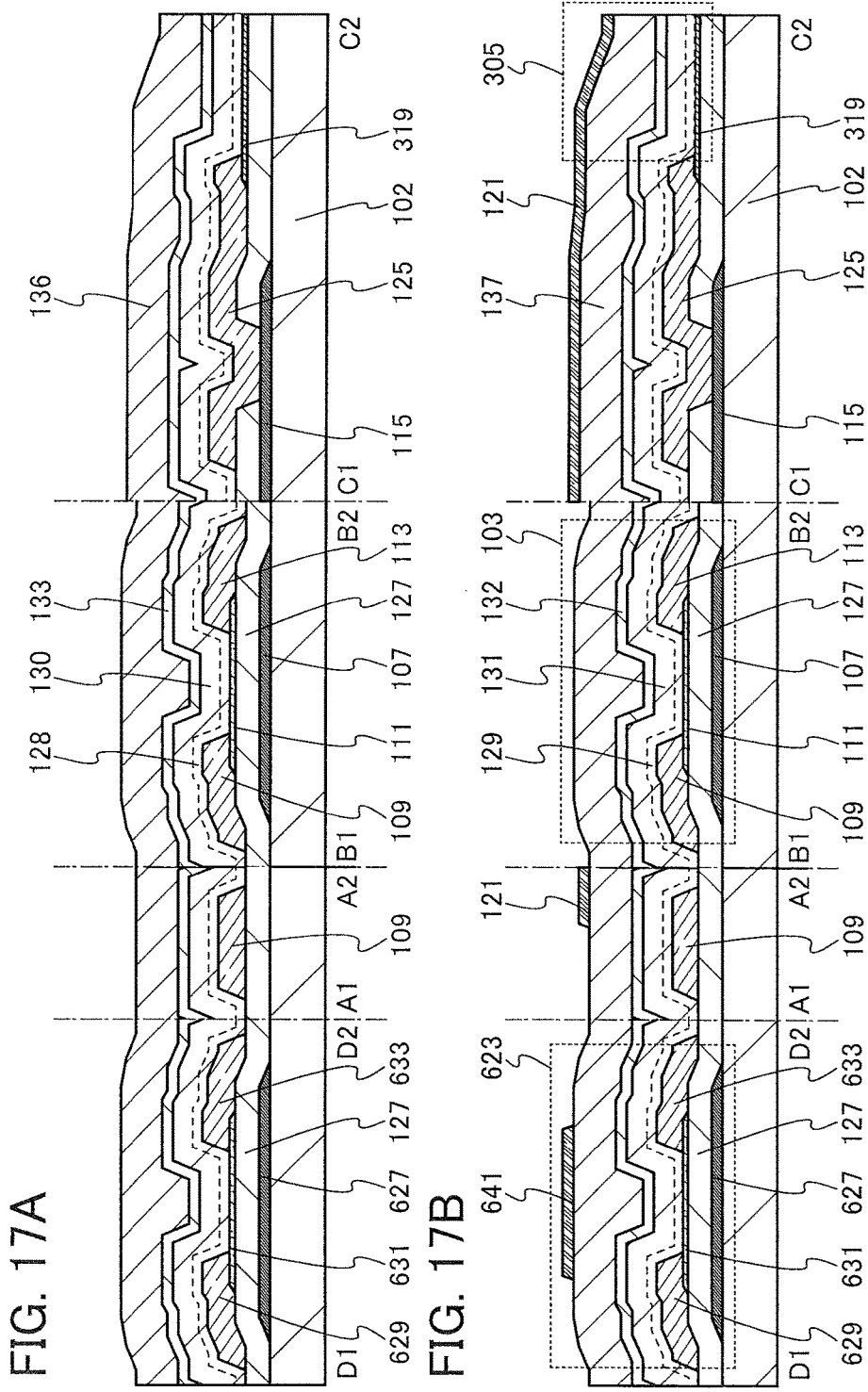

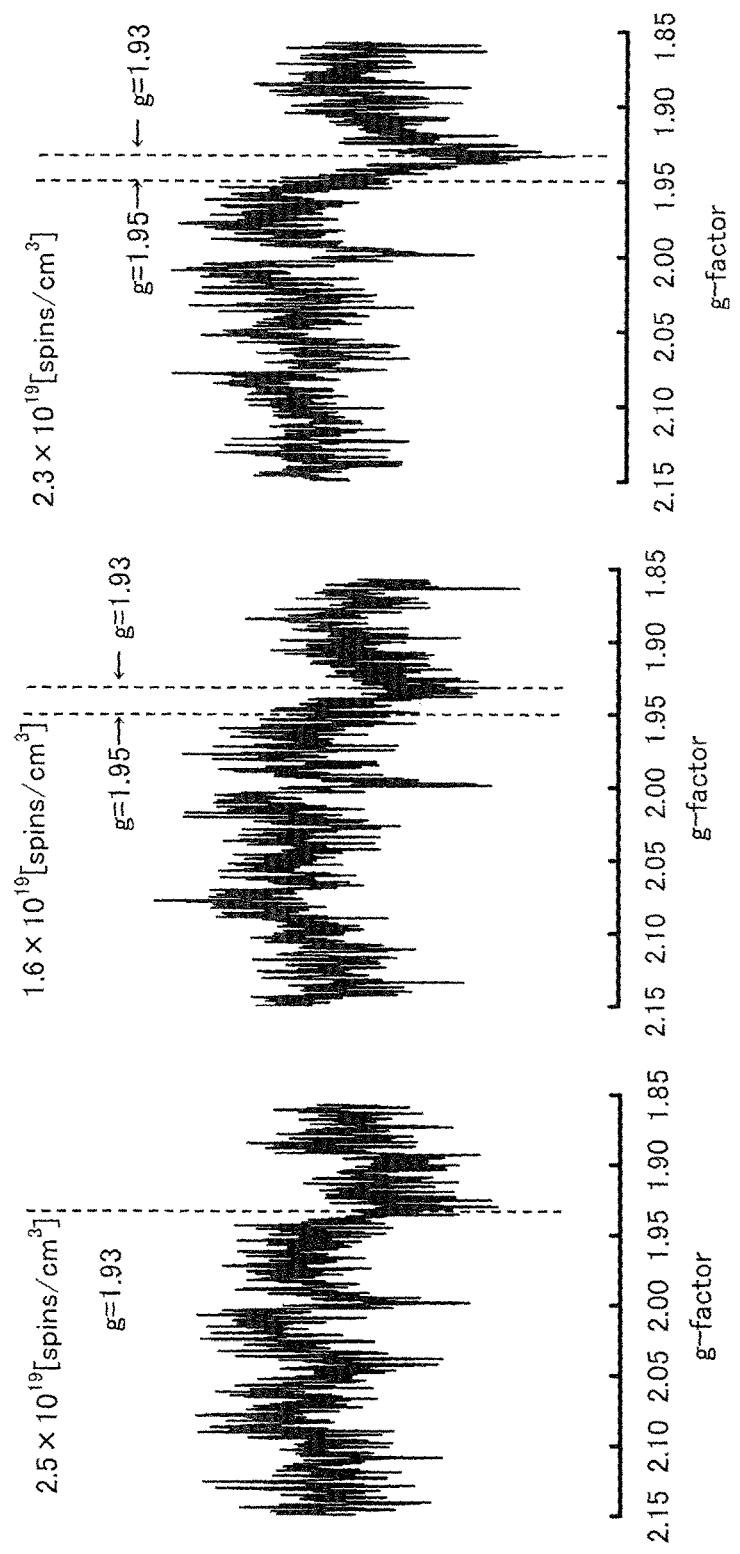

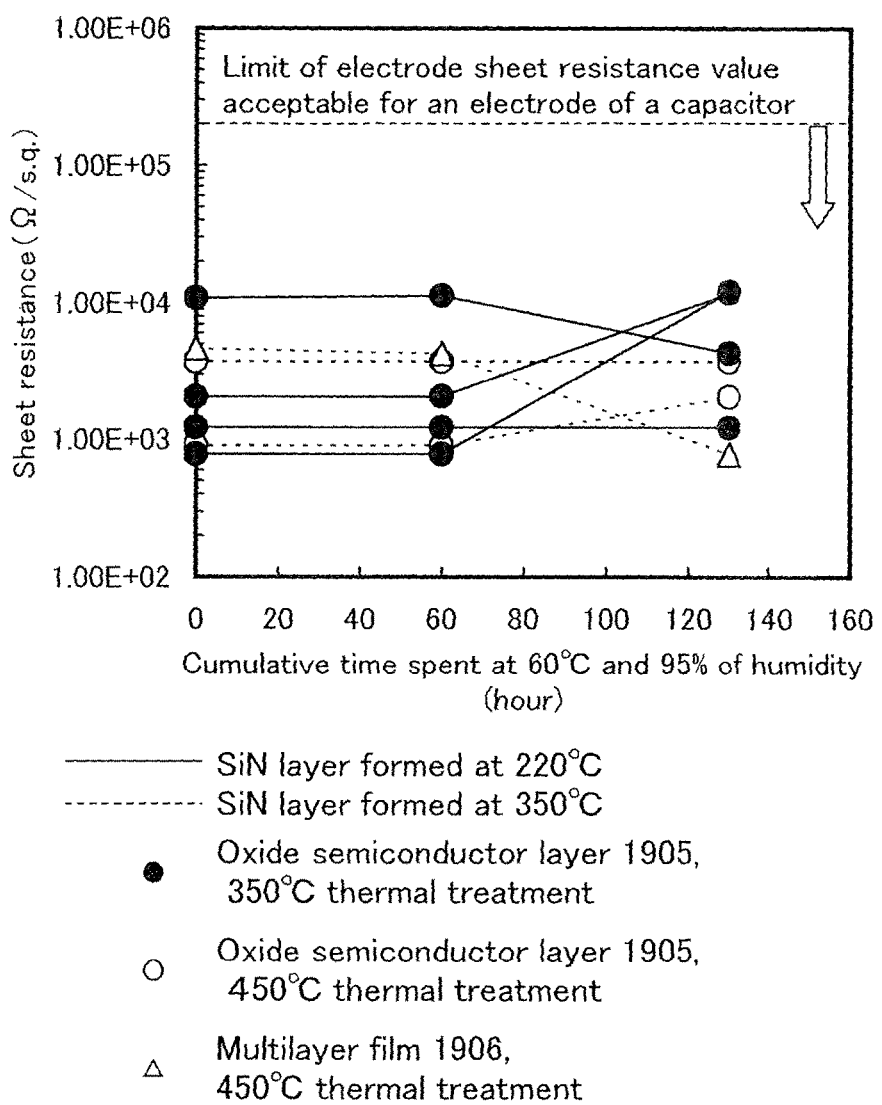

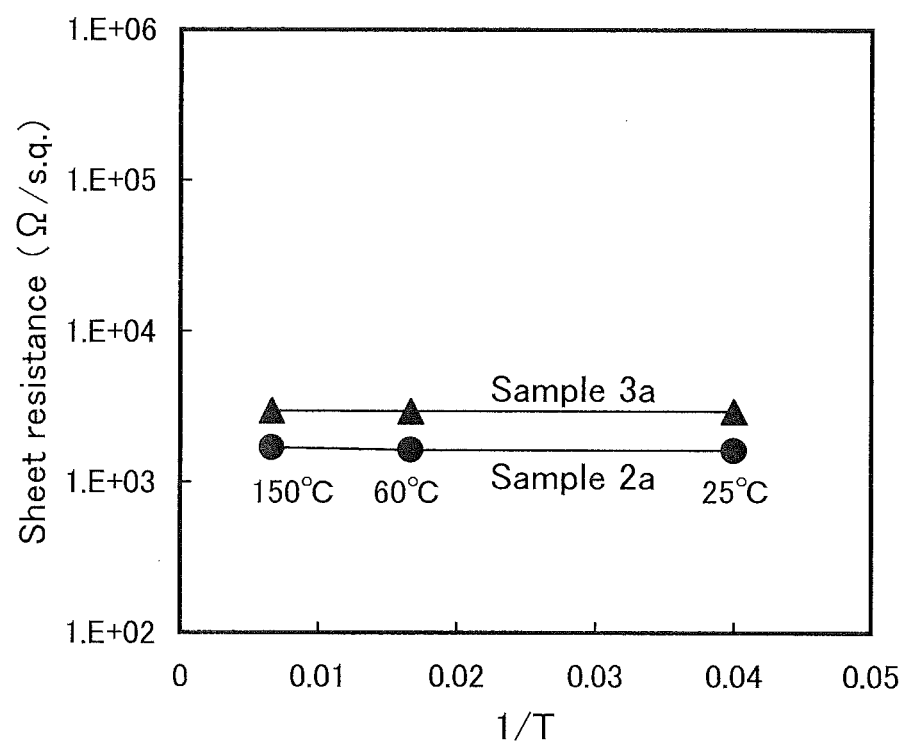

● In  ○ Ga  ○ Zn  ● O  ● H

SEMICONDUCTOR DEVICE COMPRISING FIRST METAL OXIDE FILM AND SECOND METAL OXIDE FILM

CROSS-REFERENCE TO RELATED APPLICATIONS

This application is a continuation of U.S. application Ser. No. 14/011,899, filed Aug. 28, 2013, now allowed, which claims the benefit of foreign priority applications filed in Japan as Serial No. 2012-192214 on Aug. 31, 2012, and Serial No. 2013-054021 on Mar. 15, 2013, all of which are incorporated by reference.

BACKGROUND OF THE INVENTION

1. Field of the Invention

The invention disclosed in this specification and the like relates to semiconductor devices.

2. Description of the Related Art

In recent years, flat panel displays such as liquid crystal displays (LCDs) have been widespread. In each of pixels provided in the row direction and the column direction in a display device such as a flat panel display, a transistor serving as a switching element, a liquid crystal element electrically connected to the transistor, and a capacitor connected to the liquid crystal element in parallel are provided.

As a semiconductor material for forming a semiconductor film of the transistor, a silicon semiconductor such as amorphous silicon or polysilicon (polycrystalline silicon) is generally used.

Metal oxides having semiconductor characteristics (hereinafter referred to as oxide semiconductors) can be used for semiconductor films in transistors. For example, techniques for forming transistors including zinc oxide or an In—Ga—Zn-based oxide semiconductor are disclosed (see Patent Documents 1 and 2).

REFERENCE

[Patent Document 1] Japanese Published Patent Application No. 2007-123861

[Patent Document 2] Japanese Published Patent Application No. 2007-096055

SUMMARY OF THE INVENTION

In a capacitor, a dielectric film is provided between a pair of electrodes at least one of which is formed, in many cases, using a light-blocking film partly serving as a gate electrode, a source electrode, a drain electrode, or the like of a transistor.

As the capacitance value of a capacitor is increased, a period in which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption.

One of methods for increasing the charge capacity of a capacitor is to increase the area occupied by the capacitor, specifically, to increase the area of a region where two electrodes of the capacitor overlap with each other. However, when the area of a light-blocking conductive film is increased to increase the area of a region where the two electrode overlap with each other, the aperture ratio of a pixel is lowered and thus display quality of an image is degraded.

In view of the above problems, it is an object that is an embodiment of the present invention to provide a semiconductor device including a capacitor with increased charge capacity and having a high aperture ratio.

An embodiment of the present invention is a semiconductor device which includes a transistor and a light-transmitting capacitor. Specifically, in the capacitor, a light-transmitting semiconductor film serves as one electrode, and a light-transmitting conductive film such as a pixel electrode serves as the other electrode, and a light-transmitting insulating film serves as a dielectric film. In the light-transmitting insulating film, a first oxide insulating film, a nitride insulating film, and a second oxide insulating film are stacked in this order.

An embodiment of the present invention is a semiconductor device which includes a transistor including a light-transmitting semiconductor film, a capacitor where a dielectric film is provided between a pair of electrodes, and a pixel electrode electrically connected to the transistor. In the capacitor, a light-transmitting semiconductor film formed on the same surface as the light-transmitting semiconductor film in the transistor serves as one electrode, the pixel electrode serves as the other electrode, and a light-transmitting insulating film provided over the light-transmitting semiconductor film serves as the dielectric film. In the light-transmitting insulating film, a first oxide insulating film, a nitride insulating film, and a second oxide insulating film are stacked in this order.

The first oxide insulating film is formed by a chemical vapor deposition method using a deposition gas containing silicon and an oxidizing gas. The nitride insulating film is formed by a chemical vapor deposition method or a physical vapor deposition method. The second oxide insulating film is formed using an organosilane gas by a chemical vapor deposition method.

An oxide insulating film formed over the nitride insulating film using an organosilane gas by a chemical vapor deposition method can improve planarity of a surface of element portions in which the transistor and the capacitor are formed. Further, a nitride insulating film formed between the transistor and the oxide insulating film formed using an organosilane gas by a chemical vapor deposition method can prevent transfer of impurities such as carbon contained in the oxide insulating films to the transistor; thus, variations in the transistor can be reduced.

The light-transmitting semiconductor film can be formed using an oxide semiconductor. This is because an oxide semiconductor has an energy gap as wide as 3.0 eV or more and high visible-light transmissivity.

The light-transmitting capacitor can be formed using a manufacturing process of the transistor. One electrode of the capacitor can be formed using a formation process of the light-transmitting semiconductor film included in the transistor. The dielectric film of the capacitor can be formed using a formation process of the insulating film over the light-transmitting semiconductor film included in the transistor. The other electrode of the capacitor can be formed using a formation process of the pixel electrode electrically connected to the transistor. Thus, the light-transmitting semiconductor film included in the transistor and the one electrode of the capacitor are formed using the same metal element.

In the case where a semiconductor film formed in a step of forming the light-transmitting semiconductor film included in the transistor is used as the one electrode of the capacitor, the conductivity of the semiconductor film may be increased.

For example, it is preferable to add one or more selected from boron, nitrogen, fluorine, aluminum, phosphorus, arsenic, indium, tin, antimony, and a rare gas element to the semiconductor film. An ion implantation method, an ion doping method, or the like may be employed to add the element to the semiconductor film. Alternatively, the semiconductor film may be exposed to plasma containing the element to add the element. In that case, the one electrode of the capacitor is an n-type semiconductor film, and the conductivity of the semiconductor film is greater than or equal to 10 S/cm and less than or equal to 1000 S/cm, preferably greater than or equal to 100 S/cm and less than or equal to 1000 S/cm.

With the above structure, the capacitor transmits light and thus can be formed large (covers a large area) in a region except a portion where the transistor in a pixel is formed. For this reason, the semiconductor device can have charge capacity increased while improving the aperture ratio. Accordingly, the semiconductor device can have excellent display quality.

In the capacitor, the insulating film provided over the light-transmitting semiconductor film included in the transistor is used as the dielectric film; therefore, the dielectric film can have the same layered structure as the insulating film. For example, in the case where the insulating film in which the first oxide insulating film, the nitride insulating film, and the second oxide insulating film are stacked in this order serves as the insulating film provided over the light-transmitting semiconductor film included in the transistor, the insulating film in which the first oxide insulating film, the nitride insulating film, and the second oxide insulating film are stacked in this order can serve as the dielectric film of the capacitor.

In the case where in the capacitor, the first oxide insulating film, the nitride insulating film, and the second oxide insulating film which are stacked in this order serve as the insulating film provided over the light-transmitting semiconductor film included in the transistor, only a portion of the first oxide insulating film in which the capacitor is formed is removed after the oxide insulating film is formed, whereby the nitride insulating film and the second oxide insulating film can serve as the dielectric film of the capacitor. In other words, the nitride insulating film is in contact with the semiconductor film serving as the pair of electrodes of the capacitor. Since the semiconductor film includes an oxide semiconductor, a defect state (an interface state) is formed at the interface between the nitride insulating film and the semiconductor film when the nitride insulating film and the semiconductor film are in contact with each other. In addition or alternatively, when the nitride insulating film is formed by a plasma CVD method or a sputtering method, the semiconductor film is exposed to plasma, so that oxygen vacancies are generated. Further, nitrogen and/or hydrogen contained in the nitride insulating film move(s) to the semiconductor film. Hydrogen contained in the nitride insulating film enters the defect state or oxygen vacancies, whereby electrons serving as carriers can be generated. As a result, the semiconductor film has a higher conductivity and becomes n-type, and thus has conductivity. That is, a metal oxide film having characteristics of a conductor can be formed. Further, the thickness of the dielectric film can be reduced; therefore, an increase in the charge capacity of the capacitor can be achieved.

When the nitride insulating film is in contact with the semiconductor film in the capacitor as described above, a step of adding an element which increases the conductivity to the semiconductor film by an ion implantation method, an ion doping method, or the like can be skipped; therefore, the yield of the semiconductor device can be increased and the manufacturing cost thereof can be reduced.

In the case where the light-transmitting semiconductor film included in the transistor is formed using an oxide semiconductor and the insulating film in which the first oxide insulating film, the nitride insulating film, and the second oxide insulating film are stacked in this order serves as the insulating film provided over the light-transmitting semiconductor film, it is preferable that the oxide insulating film be unlikely to transmit nitrogen and hydrogen, that is, that the oxide insulating film have a barrier property to nitrogen.

With the above structure, one or both of nitrogen and hydrogen can be prevented from diffusing into the light-transmitting semiconductor film included in the transistor, so that variations in the electrical characteristics of the transistor can be suppressed.

In the above, the semiconductor device that is an embodiment of the present invention includes a scan line including a gate electrode of the transistor and a capacitor line extending in the direction parallel to the scan line on the same surface as the scan line. One electrode (semiconductor film) of the capacitor is electrically connected to the capacitor line through a conductive film which can be formed at the same time as formation of source and drain electrodes of the transistor. Alternatively, the capacitor line is formed using a semiconductor film included in the capacitor.

The capacitor line does not necessarily extend in the direction parallel to a scan line on the same surface as the scan line. The capacitor line may extend in the direction parallel to a scan line including the source electrode or the drain electrode of the transistor on the same surface as the signal line, and may be electrically connected to one electrode (semiconductor film) of the capacitor.

The capacitor line may be connected to each of capacitors included in a plurality of adjacent pixels. In this case, the capacitor line may be provided between the adjacent pixels.

Further, in the case where the semiconductor film formed at the same time as the light-transmitting semiconductor film included in the transistor serves as one electrode of the capacitor, the conductive film in contact with the semiconductor film and the capacitor line may be provided in contact with an end portion of the semiconductor film and, for example, can be provided in contact with the semiconductor film along the outer periphery thereof. With such a structure, the conductivity of the semiconductor film can be increased.

A manufacturing method of a semiconductor device that is an embodiment of the present invention is an embodiment of the present invention.

According to an embodiment of the present invention, a semiconductor device including a capacitor whose charge capacity is increased while improving the aperture ratio can be provided.

BRIEF DESCRIPTION OF THE DRAWINGS

FIGS. 4A and 4B are cross-sectional views illustrating a manufacturing method of a semiconductor device that is an embodiment of the present invention.

FIGS. 5A and 5B are cross-sectional views illustrating a manufacturing method of a semiconductor device that is an embodiment of the present invention.

FIGS. 11A and 11B are cross-sectional views illustrating a manufacturing method of a semiconductor device that is an embodiment of the present invention.

FIGS. 12A and 12B are cross-sectional views illustrating a manufacturing method of a semiconductor device that is an embodiment of the present invention.

FIG. 13 is a cross-sectional view illustrating a manufacturing method of a semiconductor device that is an embodiment of the present invention.

FIGS. 17A and 17B are cross-sectional views illustrating a manufacturing method of a semiconductor device that is an embodiment of the present invention.

FIGS. 27A to 27C are graphs showing results of ESR measurement.

FIG. 29 is a graph showing sheet resistance.

FIG. 30 is a graph showing sheet resistance.

DETAILED DESCRIPTION OF THE INVENTION

Figure 1A:
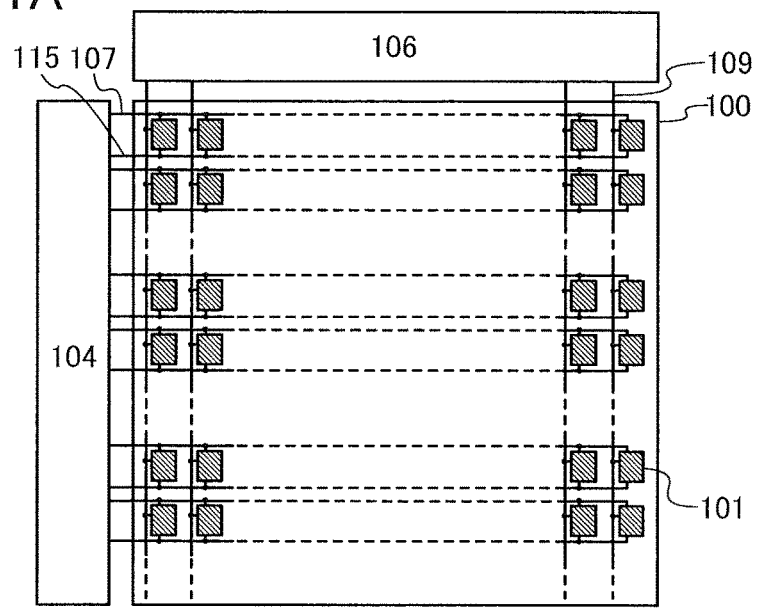
FIG. 1A illustrates a semiconductor device that is an embodiment of the present invention and FIGS. 1B and 1C are circuit diagrams each illustrating a pixel.

Embodiments and examples of the present invention are described below in detail with reference to the accompanying drawings. However, the present invention is not limited to the following description and it is easily understood by those skilled in the art that the mode and details can be variously changed. In addition, the present invention should not be construed as being limited to the description in the following embodiments and examples.

Note that in structures of the present invention described below, the same portions or portions having similar functions are denoted by the same reference numerals in different drawings, and description thereof is not repeated. Further, the same hatching pattern is applied to portions having similar functions, and in some cases the portions are not especially denoted by reference numerals.

Note that in each drawing described in this specification, the size, the film thickness, or the region of each component is in some cases exaggerated for clarity. Therefore, the embodiments and the examples of the present invention are not limited to such scales.

Note that the ordinal numbers such as "first" and "second" in this specification and the like are used for convenience and do not indicate the order of steps or the stacking order of layers. In addition, the ordinal numbers in this specification and the like do not indicate particular names which specify the present invention.

Note that a voltage refers to a difference between potentials of two points, and a potential refers to electrostatic energy (electric potential energy) of a unit charge at a given point in an electrostatic field. In general, a difference between a potential of one point and a reference potential (e.g., a ground potential) is merely called a potential or a voltage, and a potential and a voltage are used in many cases as synonymous words. Thus, in this specification, a potential may be rephrased as a voltage and a voltage may be rephrased as a potential unless otherwise specified.

In this specification, in the case where etching treatment is performed after a photolithography process, a mask formed in the photolithography process is removed after the etching treatment.

Embodiment 1

In this embodiment, a semiconductor device that is an embodiment of the present invention is described with reference to drawings. Note that in this embodiment, a semiconductor device that is an embodiment of the present invention is described taking a liquid crystal display device as an example.

<Structure of Semiconductor Device>

FIG. 1A illustrates an example of a semiconductor device. The semiconductor device in FIG. 1A includes a pixel portion 100, a scan line driver circuit 104, a signal line driver circuit 106, m scan lines 107 which are arranged in parallel or substantially in parallel and whose potentials are controlled by the scan line driver circuit 104, and n signal lines 109 which are arranged in parallel or substantially in parallel and whose potentials are controlled by the signal line driver circuit 106. Further, the pixel portion 100 includes a plurality of pixels 101 arranged in a matrix. Furthermore, capacitor lines 115 arranged in parallel or substantially in parallel are provided along the scan lines 107. Note that the capacitor lines 115 may be arranged in parallel or substantially in parallel along the signal lines 109.

Each scan line 107 is electrically connected to the n pixels 101 in the corresponding row among the pixels 101 arranged in m rows and n columns in the pixel portion 100. Each signal line 109 is electrically connected to the in pixels 101 in the corresponding column among the pixels 101 arranged in m rows and n columns. Note that m and n are each an integer of 1 or more. Each capacitor line 115 is electrically connected to the n pixels 101 in the corresponding row among the pixels 101 arranged in m rows and n columns. Note that in the case where the capacitor lines 115 are arranged in parallel or substantially in parallel along the signal lines 109, each capacitor line 115 is electrically connected to the m pixels 101 in the corresponding column among the pixels 101 arranged in m rows and n columns.

Figure 1B:
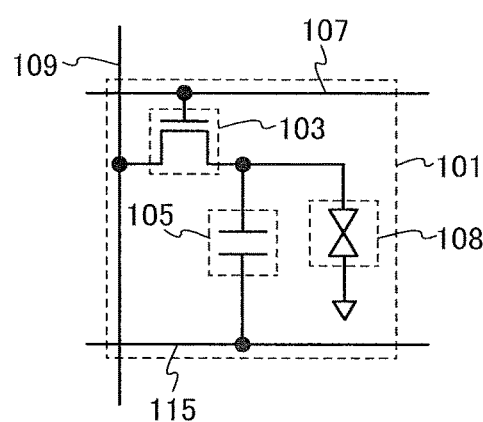

FIG. 1B is an example of a circuit diagram of the pixel 101 included in the semiconductor device illustrated in FIG. 1A. The pixel 101 in FIG. 1B includes a transistor 103 which is electrically connected to the scan line 107 and the signal line 109, a capacitor 105 one electrode of which is electrically connected to a drain electrode of the transistor 103 and the other electrode of which is electrically connected to the capacitor line 115 which supplies a constant potential, and a liquid crystal element 108. A pixel electrode of the liquid crystal element 108 is electrically connected to the drain electrode of the transistor 103 and the one electrode of the capacitor 105, and an electrode (counter electrode) facing the pixel electrode is electrically connected to a wiring which supplies a counter potential.

The liquid crystal element 108 is an element which controls transmission of light by an optical modulation action of liquid crystal which is sandwiched between a substrate provided with the transistor 103 and the pixel electrode and a substrate provided with the counter electrode. The optical modulation action of liquid crystal is controlled by an electric field applied to the liquid crystal (including a vertical electric field and a diagonal electric field). Note that in the case where a counter electrode (also referred to as a common electrode) is provided over a substrate where a pixel electrode is provided, an electric field applied to liquid crystal is a transverse electric field.

Figure 2:
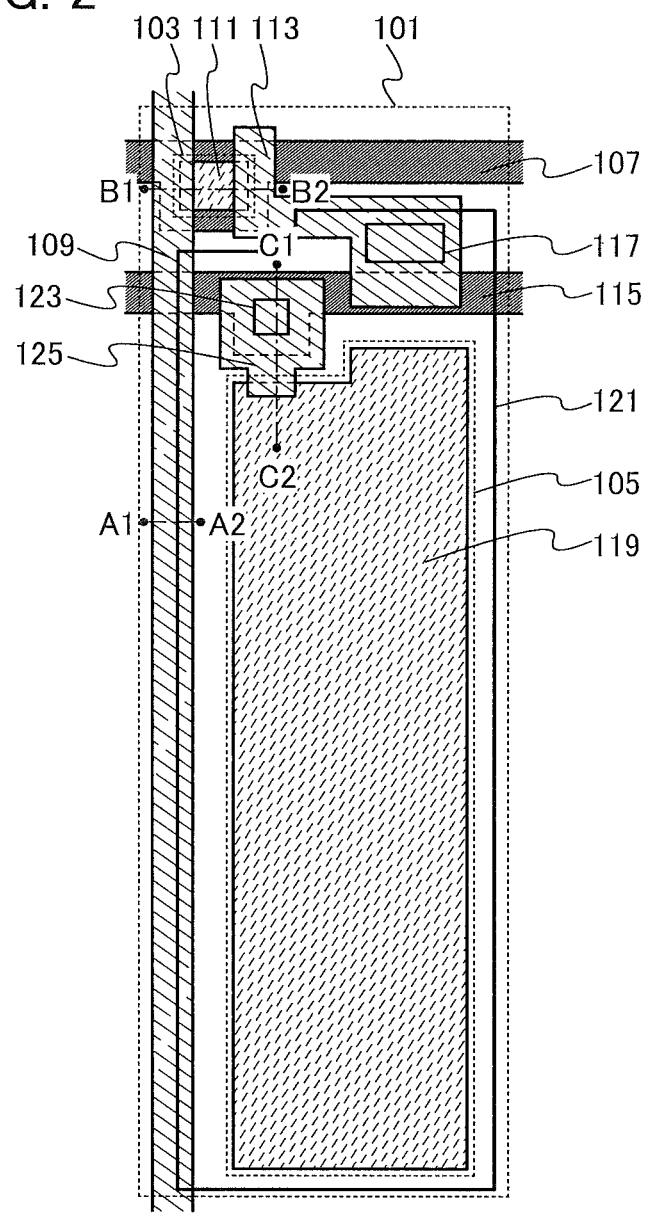
FIG. 2 is a top view illustrating a semiconductor device that is an embodiment of the present invention.

Next, a specific example of the pixel 101 of the liquid crystal display device is described. FIG. 2 is a top view of the pixel 101. Note that in FIG. 2, the counter electrode and the liquid crystal element are omitted.

In FIG. 2, the scan line 107 is provided so as to extend in the direction perpendicular or substantially perpendicular to the signal line 109 (in the horizontal direction in the drawing). The signal line 109 is provided so as to extend in the direction perpendicular or substantially perpendicular to the scan line 107 (in the vertical direction in the drawing). The capacitor line 115 is provided so as to extend in the direction parallel to the scan line 107. The scan line 107 and the capacitor line 115 are electrically connected to the scan line driver circuit 104 (see FIG. 1A), and the signal line 109 is electrically connected to the signal line driver circuit 106 (see FIG. 1A).

The transistor 103 is provided in a region where the scan line 107 and the signal line 109 cross each other. The transistor 103 includes at least a semiconductor film 111 including a channel formation region, a gate electrode, a gate insulating film (not illustrated in FIG. 2), a source electrode, and a drain electrode. A portion of the scan line 107 which overlaps with the semiconductor film 111 functions as the gate electrode of the transistor 103. A portion of the signal line 109 which overlaps with the semiconductor film 111 functions as the source electrode of the transistor 103. A portion of a conductive film 113 which overlaps with the semiconductor film 111 functions as the drain electrode of the transistor 103. Thus, the gate electrode, the source electrode, and the drain electrode may be referred to as the scan line 107, the signal line 109, and the conductive film 113, respectively. Further, in FIG. 2, an edge of the scan line 107 is on the outer side of an edge of the semiconductor film when seen from above. Thus, the scan line 107 functions as a light-blocking film for blocking light from a light source such as a backlight. For this reason, the semiconductor film 111 included in the transistor is not irradiated with light, so that variations in the electrical characteristics of the transistor can be suppressed.

Further, an oxide semiconductor processed under appropriate conditions can significantly reduce the off-state current of a transistor; therefore, such an oxide semiconductor is used for the semiconductor film 111 in an embodiment of the present invention. Thus, power consumption of a semiconductor device can be reduced.

The conductive film 113 is electrically connected to a pixel electrode 121 formed using a light-transmitting conductive film, through an opening 117. In FIG. 2, the hatch pattern of the pixel electrode 121 is not shown.

The capacitor 105 is provided in a region which is in the pixel 101 and surrounded by capacitor lines 115 and signal lines 109. The capacitor 105 is electrically connected to the capacitor line 115 through a conductive film 125 provided in and over an opening 123. The capacitor 105 includes a semiconductor film 119 including an oxide semiconductor, the pixel electrode 121, and an insulating film (not illustrated in FIG. 2) which is formed as a dielectric film over the transistor 103. The semiconductor film 119, the pixel electrode 121, and the dielectric film transmit light; accordingly, the capacitor 105 transmits light.

Thanks to the light-transmitting property of the semiconductor film 119, the capacitor 105 can be formed large (covers a large area) in the pixel 101. Thus, a semiconductor device having increased charge capacity while improving the aperture ratio, to typically 55% or more, preferably 60% or more can be obtained. For example, in a semiconductor device with a high resolution such as a liquid crystal display device, the area of a pixel is small and thus the area of a capacitor is also small. For this reason, the charge capacity of the capacitor is small in a semiconductor device with a high resolution. However, since the capacitor 105 of this embodiment transmits light, when it is provided in a pixel, enough charge capacity can be obtained in the pixel and the aperture ratio can be improved. Typically, the capacitor 105 can be favorably used in a high-resolution semiconductor device with a pixel density of 200 ppi or more, or furthermore, 300 ppi or more. Further, according to an embodiment of the present invention, the aperture ratio can be improved even in a display device with a high resolution, which makes it possible to use light from a light source such as a backlight efficiently, so that power consumption of the display device can be reduced.

Here, the characteristics of a transistor including an oxide semiconductor are described. Note that the transistor including an oxide semiconductor is an n-channel transistor. Further, carriers might be generated due to oxygen vacancies in the oxide semiconductor, which might degrade the electrical characteristics and reliability of the transistor. For example, in some cases, the threshold voltage of the transistor is shifted in the negative direction, and drain current flows when the gate voltage is 0 V. A transistor in which drain current flows when the gate voltage is 0 V is referred to as a normally-on transistor. A transistor in which substantially no drain current flows when the gate voltage is 0 V is referred to as a normally-off transistor.

In view of the above, it is preferable that defects in the semiconductor film 111, typically oxygen vacancies, be reduced as much as possible when an oxide semiconductor is used for the semiconductor film 111. For example, it is preferable that the spin density of the oxide semiconductor film (the density of defects in the semiconductor film 111) at a g-value of 1.93 in electron spin resonance spectroscopy in which a magnetic field is applied in parallel to the film surface be reduced to lower than or equal to the lower detection limit of measurement equipment. When the defects typified by oxygen vacancies in the semiconductor film 111 are reduced as much as possible, the transistor 103 can be prevented from being normally on, leading to improvements in the electrical characteristics and reliability of a semiconductor device.

The shift of the threshold voltage of a transistor in the negative direction is caused by hydrogen (including a hydrogen compound such as water) contained in an oxide semiconductor in some cases as well as by oxygen vacancies. Hydrogen contained in the oxide semiconductor is reacted with oxygen bonded to a metal atom to be water, and in addition, vacancies (also referred to as oxygen vacancies) are formed in a lattice from which oxygen is released (or a portion from which oxygen is removed). In addition, the reaction of part of hydrogen and oxygen causes generation of electrons serving as carriers. Thus, a transistor including an oxide semiconductor which contains hydrogen is likely to be normally on.

In view of the above, when an oxide semiconductor is used for the semiconductor film 111, it is preferable that hydrogen in the semiconductor film as the semiconductor film 111 be reduced as much as possible. Specifically, the concentration of hydrogen in the semiconductor film 111, which is measured by secondary ion mass spectrometry (SIMS), is set to lower than $5 \times 10^{18}$ atoms/cm$^3$, preferably lower than or equal to $1 \times 10^{18}$ atoms/cm$^3$, more preferably lower than or equal to $5 \times 10^{17}$ atoms/cm$^3$, still more preferably lower than or equal to $1 \times 10^{16}$ atoms/cm$^3$.

The concentration of alkali metals or alkaline earth metals in the semiconductor film 111, which is measured by secondary ion mass spectrometry (SIMS), is set to lower than or equal to $1 \times 10^{18}$ atoms/cm$^3$, preferably lower than or equal to $2 \times 10^{16}$ atoms/cm$^3$. This is because an alkali metal and an alkaline earth metal might generate carriers when bonded to an oxide semiconductor, in which case the off-state current of the transistor 103 might be increased.

Further, when nitrogen is contained in the semiconductor film 111, electrons serving as carriers are generated and the carrier density increases, so that the semiconductor film easily becomes n-type. Thus, a transistor including an oxide semiconductor which contains nitrogen is likely to be normally on. For this reason, nitrogen in the semiconductor film 111 is preferably reduced as much as possible; the concentration of nitrogen is preferably set to, for example, lower than or equal to $5 \times 10^{18}$ atoms/cm$^3$.

When such an oxide semiconductor film highly purified by reducing impurities (such as hydrogen, nitrogen, an alkali metal, and an alkaline earth metal) as much as possible is used as the semiconductor film 111, the transistor 103 can be prevented from being normally on, so that the off-state current of the transistor 103 can be significantly reduced. Accordingly, a semiconductor device having favorable electrical characteristics can be manufactured. Further, a semiconductor device with improved reliability can be manufactured.

Various experiments can prove the low off-state current of a transistor including a highly purified oxide semiconductor film. For example, even when an element has a channel width (W) of $1 \times 10^6$ µm and a channel length (L) of 10 µm, off-state current can be less than or equal to the measurement limit of a semiconductor parameter analyzer, i.e., less than or equal to $1 \times 10^{-13}$ A, at a voltage (drain voltage) between the source electrode and the drain electrode of from 1 V to 10 V. In this case, it can be found that the off-state current corresponding to a value obtained by dividing the off-state current by the channel width of the transistor is 100 zA/µm or lower. Further, the off-state current was measured with the use of a circuit in which a capacitor and a transistor are connected to each other and charge that flows in or out from the capacitor is controlled by the transistor. In the measurement, a highly purified oxide semiconductor film has been used for a channel formation region of the transistor, and the off-state current of the transistor has been measured from a change in the amount of charge of the capacitor per unit time. As a result, it is found that in the case where the voltage between the source electrode and the drain electrode of the transistor is 3 V, lower off-state current of several tens of yoctoamperes per micrometer (yA/µm) can be obtained. Thus, the transistor including the highly purified oxide semiconductor film has a significantly low off-state current.

Figure 3:
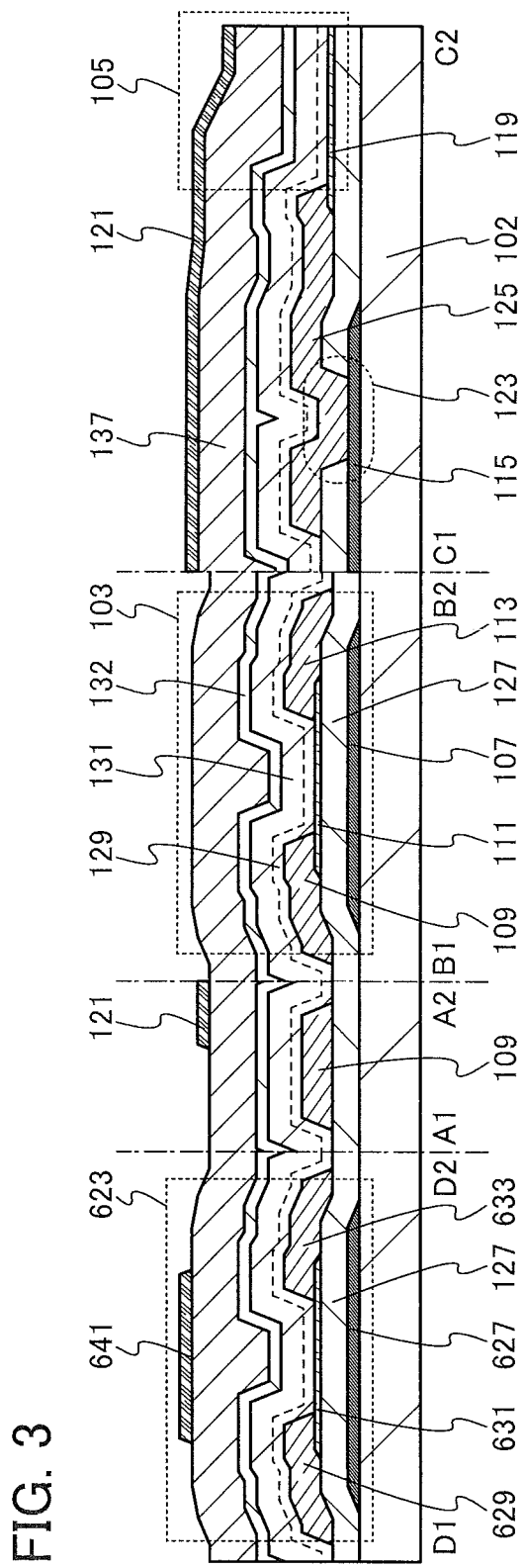
FIG. 3 is a cross-sectional view illustrating a semiconductor device that is an embodiment of the present invention.

Next, FIG. 3 illustrates a cross-sectional view taken along dashed-dotted line A1-A2, dashed-dotted line B1-B2, and dashed-dotted line C1-C2 in FIG. 2. Further, FIG. 3 illustrates a cross-sectional view of the scan line driver circuit 104 taken along dashed-dotted line D1-D2, though the top view of the scan line driver circuit 104 is omitted. The cross-sectional view of the transistor provided in the scan line driver circuit 104 is illustrated here, and the transistor can be provided in the signal line driver circuit 106.

First, structures of the pixel 101 taken along dashed-dotted line A1-A2, dashed-dotted line B1-B2, and dashed-dotted line C1-C2 are described. The scan line 107 including a gate electrode of the transistor 103 and the capacitor line 115 on the same surface as the scan line 107 are provided over a substrate 102. A gate insulating film 127 is provided over the scan line 107 and the capacitor line 115. The semiconductor film 111 is provided over a portion of the gate insulating film 127 which overlaps with the scan line 107, and the semiconductor film 119 is provided over the gate insulating film 127. The signal line 109 including a source electrode of the transistor 103 and the conductive film 113 including a drain electrode of the transistor 103 are provided over the semiconductor film 111 and the gate insulating film 127. The opening 123 reaching the capacitor line 115 is formed in the gate insulating film 127, and the conductive film 125 is provided in and over the opening 123 and over the gate insulating film 127 and the semiconductor film 119. An insulating film 129, an insulating film 131, an insulating film 132, and an insulating film 137 functioning as protective insulating films of the transistor 103 are provided over the gate insulating film 127, the signal line 109, the semiconductor film 111, the conductive films 113 and 125, and the semiconductor film 119. The opening 117 reaching the conductive film 113 (see FIG. 2) is formed in the insulating films 129, 131, 132, and 137, and the pixel electrode 121 is provided in the opening 117 (see FIG. 2) and over the insulating film 137.

In the capacitor 105 described in this embodiment, the semiconductor film 119 formed in the same process as the semiconductor film 111 serves as one of a pair of electrodes, the pixel electrode 121 serves as the other of the pair of electrodes, and the insulating films 129, 131, 132, and 137 serve as a dielectric film provided between the pair of electrodes.

Next, the structure of the transistor provided in the scan line driver circuit 104 is described. A gate electrode 627 of a transistor 623 is provided over the substrate 102. The gate insulating film 127 is provided over the gate electrode 627. A semiconductor film 631 is provided over a region of the gate insulating film 127 which overlaps with the gate electrode 627. A source electrode 629 and a drain electrode 633 of the transistor 623 are provided over the semiconductor film 631 and the gate insulating film 127. Further, the insulating films 129, 131, 132, and 137 serving as protective insulating films of the transistor 623 are provided over the gate insulating film 127, the source electrode 629, the semiconductor film 631, and the drain electrode 633. A conductive film 641 is provided over the insulating film 137.

Note that a base insulating film may be provided between the substrate 102, and the scan line 107, the capacitor line 115, the gate electrode 627, and the gate insulating film 127.

In the transistor 623, the conductive film 641 overlapping with the gate electrode 627 with the semiconductor film 631 interposed therebetween is provided, whereby variations in gate voltage at which an on-current rises at different drain voltages can be reduced. Further, a current flowing between the source electrode 629 and the drain electrode 633 at a surface of the semiconductor film 631 facing the conductive film 641 can be controlled and thus variations in electrical characteristics between different transistors can be reduced. Further, when the conductive film 641 is provided, an influence of a change in ambient electric field on the semiconductor film 631 can be reduced, leading to an improvement in reliability of the transistor. Further, when the potential of the conductive film 641 is the same or substantially the same as the minimum potential (Vss; for example, the potential of the source electrode 629 in the case where the potential of the source electrode 629 is a reference potential), variations in threshold voltage of the transistor can be reduced and the reliability of the transistor can be improved.

The insulating films 129 and 131 can be formed to have a single-layer structure or a layered structure using, for example, any of oxide insulating materials such as silicon oxide, silicon oxynitride, aluminum oxide, hafnium oxide, gallium oxide, and a Ga—Zn-based metal oxide.

The insulating film 129 can have a thickness of greater than or equal to 5 nm and less than or equal to 150 nm, preferably greater than or equal to 5 nm and less than or equal to 50 nm, more preferably greater than or equal to 10 nm and less than or equal to 30 nm. The insulating film 131 can have a thickness of greater than or equal to 30 nm and less than or equal to 500 nm, preferably greater than or equal to 150 nm and less than or equal to 400 nm.

Further, the insulating film 132 can be formed using a nitride insulating material such as silicon nitride oxide, silicon nitride, aluminum nitride, aluminum nitride oxide, and the like to have a single-layer structure or a stacked structure.

As the insulating film 132, a nitride insulating film where the hydrogen content is low may be provided. The nitride insulating film is as follows, for example: the number of hydrogen molecules released from the nitride insulating film is less than $5.0 \times 10^{21}$ molecules/cm$^3$, preferably less than $3.0 \times 10^{21}$ molecules/cm$^3$, more preferably less than $1.0 \times 10^{21}$ molecules/cm$^3$ when measured by TDS spectroscopy.

The insulating film 132 has a thickness large enough to prevent entry of impurities such as hydrogen and water from the outside. For example, the thickness can become greater than or equal to 50 nm and less than or equal to 200 nm, preferably greater than or equal to 50 nm and less than or equal to 150 nm, and further preferably greater than or equal to 50 nm and less than or equal to 100 nm.

An oxide insulating film formed by a chemical vapor deposition (CVD) method using an organosilane gas, typically a silicon oxide film, can be used as the insulating film 137.

As the insulating film 137, a silicon oxide film formed by a CVD method using an organosilane gas is provided. The silicon oxide film can be formed to a thickness of 300 nm to 600 nm inclusive. As the organosilane gas, any of the following silicon-containing compound can be used: tetraethyl orthosilicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); trisdimethylaminosilane ($SiH(N(CH_3)_2)_3$); or the like.

When the insulating film 137 is formed using a silicon oxide film formed by a CVD method using an organosilane gas, the planarity of a surface of an element portion over the substrate 102 can be improved. As a result, without a planarization film formed using an organic resin, alignment disorder of the liquid crystal molecules can be reduced, light leakage can be reduced, and contrast can be enhanced. Here, the element portion includes the transistors formed over the substrate 102, protective insulating films provided over the transistors (the insulating films 129, 131, 132, and 137), the capacitor, and the conductive film formed over the protective insulating films. The insulating film 129 is not necessarily provided.

The insulating film 132 which is a nitride insulating film is provided between the insulating film 137 and the transistors 103 and 623, whereby impurities such as carbon contained in the silicon oxide film are blocked by the insulating film 132, so that transfer of impurities to the semiconductor film 111 of the transistor 103 and the semiconductor film 631 of the transistor 623 is reduced; thus, variations in electrical characteristics of the transistors can be reduced.

Further, an oxide insulating film in which the oxygen content is higher than that in the stoichiometric composition is preferably used as one or both of the insulating film 129 and the insulating film 131. In this manner, oxygen can be prevented from being released from the semiconductor films 111 and 631, and oxygen contained in an oxygen excess region can be transferred to the semiconductor films 111 and 631. The oxygen transferred to the semiconductor films 111 and 631 can reduce oxygen vacancies in the oxide semiconductor included in the semiconductor films 111 and 631. For example, when an oxide insulating film having the following feature is used, oxygen vacancies in the semiconductor films 111 and 631 can be reduced. The feature of the oxide insulating film is that the number of oxygen molecules released from the oxide insulating film is greater than or equal to $1.0 \times 10^{18}$ molecules/cm$^3$ when measured by thermal desorption spectroscopy (hereinafter referred to as TDS spectroscopy). Note that an oxide insulating film partly including a region in which the oxygen content is higher than that in the stoichiometric composition (oxygen excess region) may be used as one or both of the insulating film 129 and the insulating film 131. When such an oxygen excess region is present in a region overlapping with at least the semiconductor films 111 and 631, oxygen is prevented from being released from the semiconductor films 111 and 631 and the oxygen contained in the oxygen excess region can enter the semiconductor films 111 and 631 to reduce oxygen vacancies.

In the case where the insulating film 131 is an oxide insulating film in which the oxygen content is higher than that in the stoichiometric composition, the insulating film 129 is preferably an oxide insulating film that oxygen can permeate. Oxygen which enters the insulating film 129 from the outside does not completely go through the insulating film 129 to be released into the semiconductor films 111 and 631 and part thereof remains in the insulating film 129. Further, there is oxygen which is contained in the insulating film 129 from the start and is released from the insulating film 129 to the outside. Thus, the insulating film 129 preferably has a high coefficient of diffusion of oxygen.

Since the insulating film 129 is in contact with the semiconductor films 111 and 631 formed using an oxide semiconductor, the insulating film 129 is preferably an oxide insulating film that oxygen can permeate and which has a low interface state density with the semiconductor films 111 and 631. For example, the insulating film 129 is preferably an oxide insulating film having a lower defect density than the insulating film 131. Specifically, the spin density of the oxide insulating film at a g-value of 2.001 (E'-center) obtained by electron spin resonance is $3.0 \times 10^{17}$ spins/cm$^3$ or lower, preferably $5.0 \times 10^{16}$ spins/cm$^3$ or lower. The spin density at a g-value of 2.001 measured by electron spin resonance spectroscopy corresponds to the number of dangling bonds in the insulating film 129.

Further, an insulating film having a barrier property against nitrogen is preferably used as one or both of the insulating film 129 and the insulating film 131. For example, a dense oxide insulating film has a barrier property against nitrogen. Specifically, an oxide insulating film which can be etched by 0.5 wt % of fluoric acid at a rate of less than or equal to 10 nm per minute when the temperature is 25° C. is preferably used.

In the case where an oxide insulating film containing nitrogen, such as a silicon oxynitride film or a silicon nitride oxide film, is used as one or both of the insulating film 129 and the insulating film 131, the nitrogen concentration measured by SIMS is greater than or equal to the lower limit of measurement by SIMS and less than $3 \times 10^{20}$ atoms/cm$^3$, preferably greater than or equal to $1 \times 10^{18}$ atoms/cm$^3$ and less than or equal to $1 \times 10^{20}$ atoms/cm$^3$. In that case, the amount of nitrogen which enters the semiconductor films 111 and 631 included in the transistor 103 can be reduced and the number of defects in the nitrogen-containing oxide insulating film itself can be reduced.

Further, the insulating films 129, 131, 132, and 137 are provided between the signal line 109 and the pixel electrode 121 in the pixel, so that the distance between the signal line 109 and the pixel electrode 121 is increased. Accordingly, parasitic capacitance can be lowered and thus display unevenness and an increase in power consumption can be reduced due to delay of a signal voltage applied to the signal line 109. In the transistor 623 included in the scan line driver circuit, the distance between the semiconductor film 631 and the conductive film 641 is increased; thus, an electric field of the conductive film 641 affecting the semiconductor film 631 is relaxed, so that variations in electrical characteristics of the transistor 623 can be reduced. Accordingly, the semiconductor device can have excellent display quality.

The details of the components of the above structure are described below.

There is no particular limitation on the property of a material and the like of the substrate 102 as long as the material has heat resistance enough to withstand at least heat treatment performed in a manufacturing process of the semiconductor device. Examples of the substrate are a glass substrate, a ceramic substrate, and a plastic substrate, and as the glass substrate, an alkali-free glass substrate such as a barium borosilicate glass substrate, an aluminoborosilicate glass substrate, or an aluminosilicate glass substrate is preferably used. Alternatively, a non-light-transmitting substrate such as a stainless alloy substrate may be used, in which case a surface of the substrate is preferably provided with an insulating film. As the substrate 102, any of the following may alternatively be used: a quartz substrate, a sapphire substrate, a single crystal semiconductor substrate, a polycrystalline semiconductor substrate, a compound semiconductor substrate, a silicon on insulator (SOI) substrate, and the like.

The scan line 107, the capacitor line 115, and the gate electrode 627 through which a large amount of current flows are preferably formed to have a single-layer structure or a stacked-layer structure using a metal film, typically any of metal materials such as molybdenum (Mo), titanium (Ti), tungsten (W), tantalum (Ta), aluminum (Al), copper (Cu), chromium (Cr), neodymium (Nd), or scandium (Sc), or an alloy material which contains any of these materials as its main component.

Examples of the scan line 107, the capacitor line 115, and the gate electrode 627 are a single-layer structure using aluminum containing silicon, a two-layer structure in which titanium is stacked over aluminum, a two-layer structure in which titanium is stacked over a titanium nitride, a two-layer structure in which tungsten is stacked over a titanium nitride, a two-layer structure in which tungsten is stacked over a tantalum nitride, a two-layer structure in which copper is stacked over a copper-magnesium-aluminum alloy, and a three-layer structure in which titanium nitride, copper, and tungsten are stacked in this order.

As a material of the scan line 107, the capacitor line 115, and the gate electrode 627, a light-transmitting conductive material that can be used for the pixel electrode 121 can be used.

Further, as the material of the scan line 107, the capacitor line 115, and the gate electrode 627, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride (InN, SnN, or the like) film can be used. These materials each have a work function higher than or equal to 5 eV (electron volts). In the case where the semiconductor film 111 of the transistor 103 is formed using an oxide semiconductor, the use of a metal oxide containing nitrogen for the scan line 107 (the gate electrode of the transistor 103) allows the threshold voltage of the transistor 103 to be shifted in the positive direction, i.e. the transistor can have normally-off characteristics. For example, in the case where an In—Ga—Zn-based oxide containing nitrogen is used, an In—Ga—Zn-based oxide having at least a higher nitrogen concentration than the semiconductor film 111, specifically an In—Ga—Zn-based oxide having a nitrogen concentration of 7 at. % or higher can be used.

It is preferable to use aluminum or copper which is a low-resistant material for the scan line 107, the capacitor line 115, and the gate electrode 627. When aluminum or copper is used, signal delay is reduced, so that the display quality can be improved. Note that aluminum has low heat resistance; therefore, defects due to a hillock, a whisker, or migration tend to be caused. In order to prevent migration of aluminum, a stacked-layer structure including aluminum and a metal material having a higher melting point than aluminum, such as molybdenum, titanium, or tungsten, is preferably used. Also when copper is used, in order to prevent a defect due to migration and diffusion of copper elements, a stacked-layer structure including copper and a metal material having a higher melting point than copper, such as molybdenum, titanium, or tungsten, is preferably used.

The gate insulating film 127 is provided to have a single-layer structure or a stacked-layer structure using, for example, one or more of insulating materials such as silicon oxide, silicon oxynitride, silicon nitride oxide, silicon nitride, aluminum oxide, hafnium oxide, gallium oxide, or Ga—Zn-based metal oxide. Note that in order to improve the characteristics of the interface between the gate insulating film 127 and the semiconductor film 111, a region in the gate insulating film 127, which is in contact with at least the semiconductor film 111, is preferably formed using an oxide insulating film.

It is possible to prevent outward diffusion of oxygen from the semiconductor film 111 to the outside and entry of hydrogen, water, or the like into the semiconductor film 111 from the outside by providing an insulating film having a barrier property against oxygen, hydrogen, water, and the like for the gate insulating film 127. As for the insulating film having a barrier property against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film can be given as examples.

The gate insulating film 127 may be formed using a high-k material such as hafnium silicate (HfSiO$_x$), hafnium silicate containing nitrogen (HfSi$_x$O$_y$N$_z$), hafnium aluminate containing nitrogen (HfAl$_x$O$_y$N$_z$), hafnium oxide, or yttrium oxide, so that gate leakage current of the transistor 103 can be reduced.

Moreover, it is preferable that the gate insulating film 127 have a stacked-layer structure including the following: a silicon nitride film with a small number of defects as a first silicon nitride film; a silicon nitride film with small amounts of released hydrogen and released ammonia as a second silicon nitride film over the first silicon nitride film; and any one of the oxide insulating films given above as examples of the gate insulating film 127 over the second silicon nitride film.

In the second silicon nitride film, in thermal desorption spectrometry, the number of released hydrogen molecules is preferably less than 5×10$^{21}$ molecules/cm$^3$, more preferably less than or equal to 3×10$^{21}$ molecules/cm$^3$, further preferably less than or equal to 1×10$^{21}$ molecules/cm$^3$, and the number of released ammonia molecules is preferably less than 1×10$^{22}$ molecules/cm$^3$, more preferably less than or equal to 5×10$^{21}$ molecules/cm$^3$, further preferably less than or equal to 1×10$^{21}$ molecules/cm$^3$. The first silicon nitride film and the second silicon nitride film are used as part of the gate insulating film 127, so that a gate insulating film with a small number of defects and small amounts of released hydrogen and released ammonia can be formed as the gate insulating film 127. Accordingly, it is possible to reduce the amount of hydrogen and nitrogen in the gate insulating film 127, which are transferred to the semiconductor film 111.

In the case where trap levels (also referred to as interface states) are present at the interface between the oxide semiconductor film 111 formed using an oxide semiconductor and the gate insulating film or in the gate insulating film in the transistor including an oxide semiconductor, change of the threshold voltage, typically change of the threshold voltage in the negative direction in the transistor and an increase in the subthreshold swing (S value) showing a gate voltage needed for changing the drain current by one digit when the transistor is turned on are caused. Thus, there is a problem in that electrical characteristics fluctuate among the transistors. For this reason, when, as the gate insulating film, the silicon nitride film with a small number of defects is used, and the oxide insulating film is provided in a region of the gate insulating film which is in contact with the semiconductor film 111, a negative shift of the threshold voltage and an increase of an S value can be suppressed.

The thickness of the gate insulating film 127 is greater than or equal to 5 nm and less than or equal to 400 nm, preferably greater than or equal to 10 nm and less than or equal to 300 nm, more preferably greater than or equal to 50 nm and less than or equal to 250 nm.

The semiconductor films 111, 119, and 631 are formed using an oxide semiconductor. The semiconductor films 111, 119, and 631 can have an amorphous crystal structure, a single crystal structure, or a polycrystalline structure. Further, the semiconductor films 111, 119, and 631 are formed using the same metal element. The thickness of each of the semiconductor films 111, 119, and 631 is greater than or equal to 1 nm and less than or equal to 100 nm, preferably greater than or equal to 1 nm and less than or equal to 50 nm, more preferably greater than or equal to 1 nm and less than or equal to 30 nm, further preferably greater than or equal to 3 nm and less than or equal to 20 nm.

Further, an oxide semiconductor that can be used for the semiconductor films 111, 119, and 631 has an energy gap of greater than or equal to 2 eV, preferably greater than or equal to 2.5 eV, more preferably greater than or equal to 3 eV. The off-state current of the transistor 103 can be reduced by using an oxide semiconductor with a wide energy gap in this manner.

An oxide semiconductor used for the semiconductor films 111, 119, and 631 is preferably a metal oxide containing at least indium (In) or zinc (Zn). Alternatively, a metal oxide containing both In and Zn is preferable. In order to reduce fluctuations in electrical characteristics of the transistors including the oxide semiconductor, the oxide semiconductor preferably contains one or more of stabilizers in addition to In and Zn.

As for stabilizers, gallium (Ga), tin (Sn), hafnium (Hf), aluminum (Al), and zirconium (Zr) can be given as examples. As another stabilizer, lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given as examples.

As the oxide semiconductor that can be used for the semiconductor films 111, 119, and 631, for example, the following can be used: indium oxide, tin oxide, or zinc oxide; an oxide containing two kinds of metals such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; an oxide containing three kinds of metals such as an In—Ga—Zn-based oxide (also referred to as IGZO), an In—Al—Zn-based oxide, an In—Sn—Zn-based oxide, a Sn—

Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or an oxide containing four kinds of metals such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn— metal oxide, or an In—Hf—Al—Zn-based oxide.

Here, an In—Ga—Zn-based oxide means an oxide containing In, Ga, and Zn as its main components and there is no particular limitation on the ratio of In, Ga, and Zn. The In—Ga—Zn-based oxide may contain a metal element other than In, Ga, and Zn.

Alternatively, a material represented by $InMO_3(ZnO)_m$ (m>0 is satisfied) may be used as the oxide semiconductor. Note that M represents one or more metal elements selected from Ga, Fe, Mn, and Co, or the above element as a stabilizer.

For example, it is possible to use an In—Ga—Zn-based metal oxide containing In, Ga, and Zn at an atomic ratio of 1:1:1 (=1/3:1/3:1/3), 2:2:1 (=2/5:2/5:1/5), or 3:1:2 (=1/2:1/6:1/3). Alternatively, an In—Sn—Zn-based metal oxide containing In, Sn, and Zn at an atomic ratio of 1:1:1 (=1/3:1/3:1/3), 2:1:3 (=1/3:1/6:1/2), or 2:1:5 (=1/4:1/8:5/8) may be used. Note that a proportion of each atom in the atomic ratio of the metal elements contained in the metal oxide varies within a range of ±20% as an error.

Note that without limitation to the materials given above, a material with an appropriate atomic ratio depending on semiconductor characteristics and electrical characteristics (field-effect mobility, threshold voltage, and the like) may be used. In order to obtain necessary semiconductor characteristics, it is preferable that the carrier density, the impurity concentration, the defect density, the atomic ratio of a metal element to oxygen, the interatomic distance, the density, and the like be set to be appropriate. For example, high field-effect mobility can be obtained relatively easily in the case of using an In—Sn—Zn-based metal oxide. Also in the case of using an In—Ga—Zn-based metal oxide, field-effect mobility can be increased by reducing the defect density in a bulk.

The signal line 109 including the source electrode of the transistor 103, the conductive film 113 including the drain electrode of the transistor 103, and the conductive film 125, the source electrode 629, and the drain electrode 633 electrically connecting the semiconductor film 119 and the capacitor line 115 in the capacitor 105 can be formed to have a single-layer structure or a layered structure using a material which can be used for the scan line 107, the capacitor line 115, and the gate electrode 627.

The pixel electrode 121 and the conductive film 641 are formed using a light-transmitting conductive material such as an indium tin oxide, an indium oxide containing a tungsten oxide, an indium zinc oxide containing a tungsten oxide, an indium oxide containing a titanium oxide, an indium tin oxide containing a titanium oxide, an indium zinc oxide, or an indium tin oxide to which a silicon oxide is added.

Here, connection of the components included in the pixel 101 described in this embodiment is described with reference to the circuit diagram in FIG. 1C and the cross-sectional view in FIG. 3.

Figure 1C:
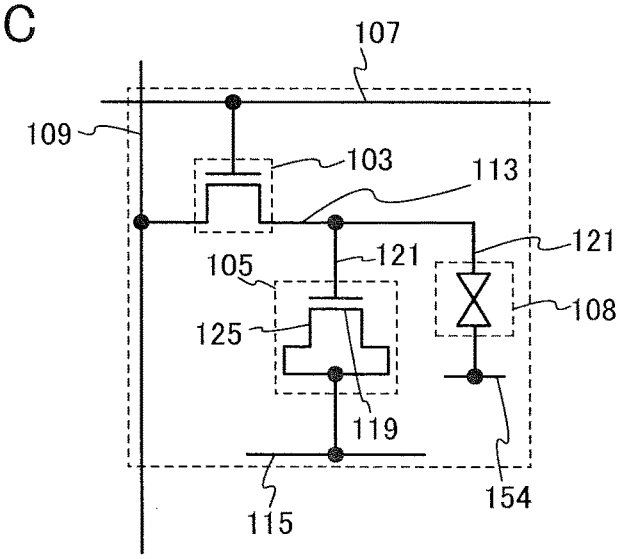

FIG. 1C is an example of a detailed circuit diagram of the pixel 101 included in the semiconductor device illustrated in FIG. 1A. As illustrated in FIG. 1C and FIG. 3, the transistor 103 includes the scan line 107 including the gate electrode, the signal line 109 including the source electrode, and the conductive film 113 including the drain electrode.

The semiconductor film 119 which is electrically connected to the capacitor line 115 through the conductive film 125 serves as one electrode of the capacitor 105. Further, the pixel electrode 121 which is electrically connected to the conductive film 113 including a drain electrode serves as the other electrode of the capacitor 105. The insulating films 129, 131, 132, and 137 provided between the semiconductor film 119 and the pixel electrode 121 serve as a dielectric film.

The liquid crystal element 108 includes the pixel electrode 121, the counter electrode 154, and the liquid crystal layer provided between the pixel electrode 121 and the counter electrode 154.

Despite having a structure which is the same as that of the semiconductor film 111, the semiconductor film 119 in the capacitor 105 functions as the electrode of the capacitor 105. This is because the pixel electrode 121 can function as a gate electrode, the insulating films 129, 131, 132, and 137 can function as gate insulating films, and a capacitor line 115 can function as a source electrode or a drain electrode, so that the capacitor 105 can be operated in a manner similar to that of a transistor and the semiconductor film 119 can be made to be in a conductive state. In other words, the capacitor 105 can be a metal oxide semiconductor (MOS) capacitor. Power is supplied to a MOS capacitor when a voltage higher than the threshold voltage (Vth) is applied to one electrode of the MOS capacitor (the pixel electrode 121 of the capacitor 105). Further, the semiconductor film 119 can be made to be in a conductive state so that the semiconductor film 119 can function as one electrode of the capacitor by controlling a potential to be supplied to the capacitor line 115. In this case, the potential to be supplied to the capacitor line 115 is set as follows. The potential of the pixel electrode 121 is changed in the positive direction and the negative direction relative to the center potential of a video signal in order to operate the liquid crystal element 108 (see FIG. 1C). The potential of the capacitor line 115 needs to be constantly lower than the potential to be supplied to the pixel electrode 121 by the threshold voltage (Vth) of the capacitor 105 (MOS capacitor) or more in order that the capacitor 105 (MOS capacitor) be constantly in a conductive state. In other words, since the semiconductor film 119 has the same structure as the semiconductor film 111, the potential of the capacitor line 115 should be lower than the potential to be supplied to the pixel electrode 121 by the threshold voltage of the transistor 103 or more. In such a manner, the semiconductor film 119 can be made to be constantly in a conductive state; thus, the capacitor 105 (MOS capacitor) can be made to be in a conductive state.

When an oxide insulating film that oxygen permeates and which has a low interface state density at the interfaces with the semiconductor films 111 and 631 is used as the insulating film 129 over the semiconductor films 111 and 631 and an oxide insulating film which includes an oxygen excess region or an oxide insulating film in which the oxygen content is higher than that in the stoichiometric composition is used as the insulating film 131, oxygen can be easily supplied to the oxide semiconductor film as the semiconductor films 111 and 631 formed using an oxide semiconductor, the release of oxygen from the semiconductor films 111 and 631 can be prevented, and the oxygen contained in the insulating film 131 can enter the semiconductor films 111 and 631 to reduce oxygen vacancies in the oxide semiconductor included in the semiconductor films 111 and 631. Thus, the transistor 103 can be prevented from being normally on and a potential to be supplied to the capacitor line 115 can be controlled so that the capacitor 105 (MOS capacitor) can be constantly in a conductive state; thus, the semiconductor device can have favorable electrical characteristics and high reliability.

The use of a nitride insulating film as the insulating film 132 over the insulating film 131 can suppress entry of impurities such as hydrogen and water into the semiconductor films 111 and 119 from the outside. Moreover, the use of a nitride insulating film with a low hydrogen content as the insulating film 132 can minimize variations in electrical characteristics of the transistor and the capacitor 105 (MOS capacitor).

Further, the capacitor 105 can be formed large (in a large area) in the pixel 101. For this reason, the semiconductor device can have charge capacity increased while improving the aperture ratio. Accordingly, the semiconductor device can have excellent display quality.

<Method for Manufacturing Semiconductor Device>

Next, a formation method of the element portion over the substrate 102 in the semiconductor device described above is described with reference to FIGS. 4A and 4B and FIGS. 5A and 5B.

First, the scan line 107, the capacitor line 115, and the gate electrode 627 are formed over the substrate 102. An insulating film 126 which is to be processed into the gate insulating film 127 later is formed so as to cover the scan line 107, the capacitor line 115, and the gate electrode 627. The semiconductor film 111 is formed over a portion of the insulating film 126 which overlaps with the scan line 107. The semiconductor film 119 is formed so as to overlap with a region where the pixel electrode 121 is to be formed later. The semiconductor film 631 is formed in a region overlapping with the gate electrode 627 (see FIG. 4A).

The scan line 107, the capacitor line 115, and the gate electrode 627 can be formed in such a manner that a conductive film is formed using any of the materials given above, a mask is formed over the conductive film, and processing is performed using the mask. The conductive film can be formed by any of a variety of deposition methods such as an evaporation method, a CVD method, a sputtering method, and a spin coating method. Not a that there is no particular limitation on the thickness of the conductive film, and the thickness of the conductive film can be determined in consideration of time needed for the formation, desired resistivity, or the like. As the mask, a resist mask formed through a photolithography process can be used. The conductive film can be processed by one or both of dry etching and wet etching.

The insulating film 126 can be formed using a material which can be used for the gate insulating film 127, by any of a variety of deposition methods such as a CVD method and a sputtering method.

In the case where a gallium oxide is used for the gate insulating film 127, the insulating film 126 can be formed by a metal organic chemical vapor deposition (MOCVD) method.

The semiconductor films 111, 119, and 631 can be formed in such a manner that an oxide semiconductor film using any of the oxide semiconductors listed above is formed, a mask is formed over the oxide semiconductor film, and processing is performed using the mask. Thus, the semiconductor films 111, 119, and 631 are formed using the same metal element. The oxide semiconductor film can be formed by a sputtering method, a coating method, a pulsed laser deposition method, a laser ablation method, or the like. Alternatively, when a printing method is employed, the semiconductor films 111 and 119 which are separate from each other can be formed directly on the insulating film 126. In the case where the oxide semiconductor film is formed by a sputtering method, an RF power supply device, an AC power supply device, a DC power supply device, or the like can be used as appropriate as a power supply device for generating plasma. As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of a rare gas. Further, a target may be appropriately selected in accordance with the composition of the oxide semiconductor film to be formed. As the mask, a resist mask formed through a photolithography process can be used. The conductive film can be processed by one or both of dry etching and wet etching. The etching conditions (e.g., an etching gas or an etching solution, etching time, and temperature) are set as appropriate depending on the material so that the oxide semiconductor film can be etched to have a desired shape.

Heat treatment is preferably performed after the semiconductor films 111, 119, and 631 are formed so that the semiconductor films 111, 119, and 631 are subjected to dehydrogenation or dehydration. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. Note that the heat treatment may be performed on the oxide semiconductor film which has not been processed into the semiconductor films 111 and 119.

A heat treatment apparatus used in the heat treatment is not limited to an electric furnace; as the heat treatment apparatus, an apparatus which heats an object using thermal conduction or thermal radiation given by a medium such as a heated gas may be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The heat treatment may be performed in an atmosphere of nitrogen, oxygen, ultra-dry air (air in which the water content is 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like. Alternatively, the heat treatment may be performed under an atmosphere of an inert gas first, and then under an oxygen atmosphere. The treatment time is 3 minutes to 24 hours.

In the case where a base insulating film is provided between the substrate 102, and the scan line 107, the capacitor line 115, and the gate insulating film 127, the base insulating film can be formed using any of the following: silicon oxide, silicon oxynitride, silicon nitride, silicon nitride oxide, gallium oxide, hafnium oxide, yttrium oxide, aluminum oxide, aluminum oxynitride, and the like. The use of silicon nitride, gallium oxide, hafnium oxide, yttrium oxide, aluminum oxide, or the like for the base insulating film leads to suppression of diffusion of impurities typified by an alkali metal, water, and hydrogen into the semiconductor films 111, 119, and 631 from the substrate 102. The base insulating film can be formed by a sputtering method or a CVD method.

After the opening 123 reaching the capacitor line 115 is formed in the insulating film 126 to form the gate insulating film 127, the signal line 109 including the source electrode of the transistor 103, the conductive film 113 including the drain electrode of the transistor 103, and the conductive film 125 which electrically connects the semiconductor film 119 and the capacitor line 115 are formed. Further, the source electrode 629 and the drain electrode 633 are formed (see FIG. 4B).

The opening 123 can be formed in such a manner that a mask is formed so as to expose part of a portion of the insulating film 126 which overlaps with the capacitor line 115 and processing is performed using the mask. The formation of the mask and the processing can be performed in manners similar to those of the scan line 107, the capacitor line 115, and the gate electrode 627.

The signal line 109, the conductive films 113 and 125, the source electrode 629, and the drain electrode 633 can be formed as follows: a conductive film is formed using a material which can be used for the signal line 109, the conductive films 113 and 125, and the gate electrode 627, a mask is formed over the conductive film, and processing is performed using the mask. The formation of the mask and the processing can be performed in manners similar to those of the scan line 107, the capacitor line 115, and the gate electrode 627.

Next, an insulating film 128 is formed over the semiconductor films 111, 119, and 631, the signal line 109, the conductive films 113 and 125, the source electrode 629, the drain electrode 633, and the gate insulating film 127. An insulating film 130 is formed over the insulating film 128. An insulating film 133 is formed over the insulating film 130. An insulating film 136 is formed over the insulating film 133 (see FIG. 5A). Note that it is preferable that the insulating films 128, 130, and 133 be formed successively. In such a case, entry of impurities into each interface can be suppressed.

The insulating film 128 can be formed using a material which can be used for the insulating film 129, by any of a variety of deposition methods such as a CVD method and a sputtering method. The insulating film 130 can be formed using a material which can be used for the insulating film 131, by any of a variety of deposition methods such as a CVD method and a sputtering method. The insulating film 133 can be formed using a material which can be used for the insulating film 132, by any of a variety of deposition methods such as a CVD method and a sputtering method. The insulating film 136 can be formed using a material which can be used for the insulating film 137 by a CVD method.

In the case where an oxide insulating film which has a low interface state density between the semiconductor film 111 and the oxide insulating film is used as the insulating film 129, the insulating film 128 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., a deposition gas containing silicon and an oxidizing gas are introduced as a source gas into the treatment chamber, the pressure in the treatment chamber is greater than or equal to 20 Pa and less than or equal to 250 Pa, preferably greater than or equal to 40 Pa and less than or equal to 200 Pa, and high-frequency power is supplied to an electrode provided in the treatment chamber.

Typical examples of the deposition gas containing silicon include silane, disilane, trisilane, silane fluoride, and the like. Examples of the oxidizing gas include oxygen, ozone, dinitrogen monoxide, and nitrogen dioxide.

By setting the ratio of the amount of the oxidizing gas to the amount of the deposition gas containing silicon to 100 or higher, the hydrogen content in the insulating film 128 (the insulating film 129) can be reduced and dangling bonds in the insulating film 128 (the insulating film 129) can be reduced. Oxygen released from the insulating film 130 (the insulating film 131) is captured by the dangling bonds in the insulating film 128 (the insulating film 129) in some cases; thus, in the case where the dangling bonds in the insulating film 128 (the insulating film 129) are reduced, oxygen in the insulating film 130 (the insulating film 131) can enter the semiconductor films 111 and 119 efficiently to reduce the oxygen vacancies in the oxide semiconductors used to form the semiconductor films 111 and 119. As a result, the amount of hydrogen entering the semiconductor films 111 and 119 can be reduced and oxygen vacancies in the semiconductor films 111 and 119 can be reduced.

In the case where the above oxide insulating film which includes an oxygen excess region or the above oxide insulating film in which the oxygen content is higher than that in the stoichiometric composition is used as the insulating film 131, the insulating film 130 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 260° C., preferably higher than or equal to 180° C. and lower than or equal to 230° C., a source gas is introduced into the treatment chamber, the pressure in the treatment chamber is greater than or equal to 100 Pa and less than or equal to 250 Pa, preferably greater than or equal to 100 Pa and less than or equal to 200 Pa, and high-frequency power that is higher than or equal to 0.17 W/cm$^2$ and lower than or equal to 0.5 W/cm$^2$, preferably, higher than or equal to 0.25 W/cm$^2$ and lower than or equal to 0.35 W/cm$^2$ is supplied is supplied to an electrode provided in the treatment chamber.

As the source gas of the insulating film 130, a source gas which can be used for the insulating film 128 can be used.

As for the formation conditions of the insulating film 130, the high-frequency power having the above power density is supplied to the treatment chamber having the above pressure, whereby the decomposition efficiency of the source gas in plasma is increased, oxygen radicals are increased, and oxidation of the source gas proceeds; therefore, the oxygen content in the insulating film 130 is higher than that in the stoichiometric composition. In addition, in the film formed at a substrate temperature within the above temperature range, the bond between silicon and oxygen is weak, and accordingly, part of oxygen in the film can be released by heat treatment in the later step. Thus, it is possible to form an oxide insulating film which contains oxygen at a higher proportion than the stoichiometric composition and from which part of oxygen is released by heating. The insulating film 128 is provided over the semiconductor film 111. Accordingly, in the process for forming the insulating film 130, the insulating film 128 serves as a protective film of the semiconductor film 111. Thus, even when the insulating film 130 is formed using the high-frequency power having a high power density, damage to the semiconductor films 111 and 631 is not significant.

By increasing the thickness of the insulating film 130, a larger amount of oxygen is released by heating; thus, the insulating film 130 is preferably formed thicker than the insulating film 128. Since the insulating film 128 is provided, favorable coverage can be achieved even when the insulating film 130 is formed thick.

The insulating film 132 can be formed by a sputtering method, a CVD method, or the like. In the case where a nitride insulating film with a low hydrogen content is used as the insulating film 132, the insulating film 133 can be formed under the following formation conditions. Here, as the nitride insulating film, a silicon nitride film is formed. The substrate placed in a treatment chamber of the plasma CVD apparatus, which is vacuum-evacuated, is held at a temperature higher than or equal to 80° C. and lower than or equal to 400° C., preferably higher than or equal to 200° C. and lower than or equal to 370° C., the pressure is greater than or equal to 100 Pa and less than or equal to 250 Pa, preferably greater than or equal to 100 Pa and less than or equal to 200 Pa with introduction of a source gas into the treatment chamber, and high-frequency power is supplied to an electrode provided in the treatment chamber.

As the source gas of the insulating film 132, a deposition gas containing silicon, a nitrogen gas, and an ammonia gas are preferably used. Typical examples of the deposition gas containing silicon include silane, disilane, trisilane, silane fluoride, and the like. Further, the flow rate of nitrogen is preferably 5 times to 50 times that of ammonia, further preferably 10 times to 50 times that of ammonia. The use of ammonia as the source gas facilitates decomposition of nitrogen and the deposition gas containing silicon. This is because ammonia is dissociated by plasma energy or heat energy, and energy generated by the dissociation contributes to decomposition of a bond of the deposition gas molecules containing silicon and a bond of nitrogen molecules. Under the above conditions, a silicon nitride film which has a low hydrogen content and can suppress entry of impurities such as hydrogen and water from the outside can be formed.

The insulating film 136 is formed using an organosilane gas and oxygen by a CVD method at a substrate temperature of higher than or equal to 200° C. and lower than or equal to 550° C., preferably higher than or equal to 300° C. and lower than or equal to 450° C.

It is preferable that heat treatment be performed at least after formation of the insulating film 130 so that excess oxygen contained in the insulating film 128 or the insulating film 130 enters the semiconductor films 111 and 631 to reduce oxygen vacancies in the oxide semiconductor included in the semiconductor films 111 and 631. The heat treatment can be appropriately performed according to the details of heat treatment for dehydration or dehydrogenation of the semiconductor films 111 and 119.

Next, the opening 117 (see FIG. 2) reaching the conductive film 113 is formed in regions of the insulating films 128, 130, 133, and 136 which overlap with the conductive film 113, and the insulating films 129, 131, 132, and 137 are formed. The opening 117 (see FIG. 2) can be formed in a manner similar to that of the opening 123.

Finally, the pixel electrode 121 and the conductive film 641 are formed, so that the element portion over the substrate 102 can be formed (see FIG. 5B). The pixel electrode 121 is formed in such a manner that a conductive film is formed using any of the materials given above in contact with the conductive film 113 through the opening 117, a mask is formed over the conductive film, and processing is performed using the mask. The formation of the mask and the processing can be performed in manners similar to those of the scan line 107 and the capacitor line 115.

Modification Example 1

In the semiconductor device that is an embodiment of the present invention, connection of the capacitor line 115 and the semiconductor film 119 serving as one electrode of the capacitor can be changed as appropriate. For example, to improve the aperture ratio, a structure where the semiconductor film is in direct contact with the capacitor line without the conductive film 125 interposed therebetween can be employed. The conductive film 125 functioning as a light-blocking film is not formed; thus, the aperture ratio of the pixel can be further increased.

Modification Example 2

In the semiconductor device that is an embodiment of the present invention, the top shape of the conductive film 125 which electrically connects the capacitor line 115 and the semiconductor film 119 serving as one electrode of the capacitor 105 can be changed as appropriate. For example, to reduce contact resistance between the semiconductor film 119 and the conductive film 125, the conductive film 125 can be provided in contact with the semiconductor film 119 along the outer periphery thereof. The conductive film is formed in the same formation process as the signal line 109 including the source electrode of the transistor 103 and the conductive film 113 including the drain electrode of the transistor 103 and thus may have a light-blocking property; for this reason, the conductive film is preferably formed into a loop shape.

Modification Example 3

Figure 6:
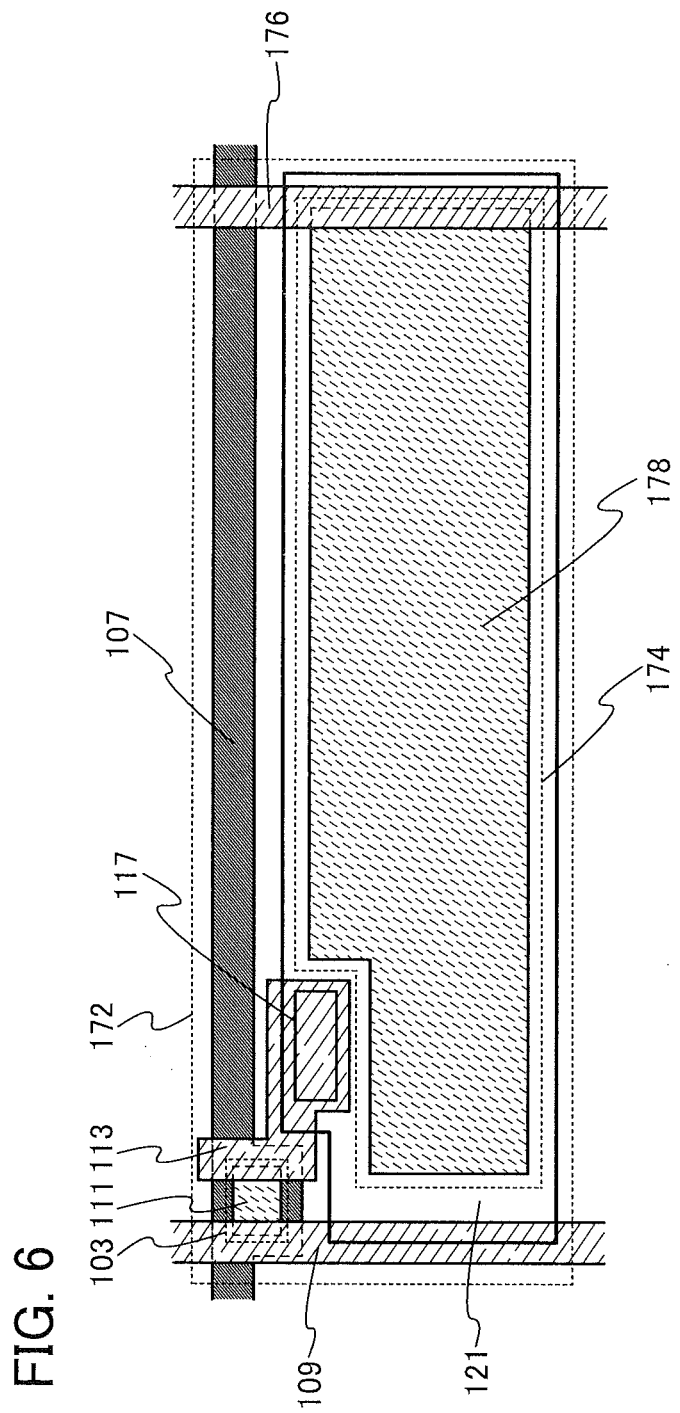
FIG. 6 is a top view illustrating a semiconductor device that is an embodiment of the present invention.

In the semiconductor device that is an embodiment of the present invention, the structures of the semiconductor film included in the capacitor and the capacitor line can be changed as appropriate. A specific example of the structure is described with reference to FIG. 6. FIG. 6 is a top view of the pixel 172. In the pixel 172 illustrated in FIG. 6, a side parallel to the scan line 107 is longer than a side parallel to the signal line 109, and the capacitor line 176 may be provided so as to extend in the direction parallel to the signal line 109. The signal line 109 and the capacitor line 176 are electrically connected to the signal line driver circuit 106 (see FIG. 1A).

A capacitor 174 is connected to the capacitor line 176 provided so as to extend in the direction parallel to the signal line 109. The capacitor 174 includes a semiconductor film 178 including an oxide semiconductor and formed in the same process as the semiconductor film 111, the pixel electrode 121, and an insulating film (not illustrated in FIG. 6) which is formed over the transistor 103, as a dielectric film. The semiconductor film 111, the pixel electrode 121, and the dielectric film transmit light; accordingly, the capacitor 174 transmits light.

Note that in the capacitor 174, the dielectric film provided between the pair of electrodes includes the insulating films 129, 131, 132, and 137, similarly to the capacitor 105 illustrated in FIG. 3.

The capacitor line 176 can be formed in the same process as the signal line 109 and the conductive film 113. When the capacitor line 176 is provided in contact with the semiconductor film 178, the area where the semiconductor film 178 and the capacitor line 176 are in contact with each other can be increased. A side of the pixel 172 parallel to the signal line 109 is shorter than a side of the pixel 172 parallel to the scan line 107; thus, the area where the pixel electrode 121 overlaps with the capacitor line 176 can be decreased, resulting in a higher aperture ratio.

Modification Example 4

Figure 7:
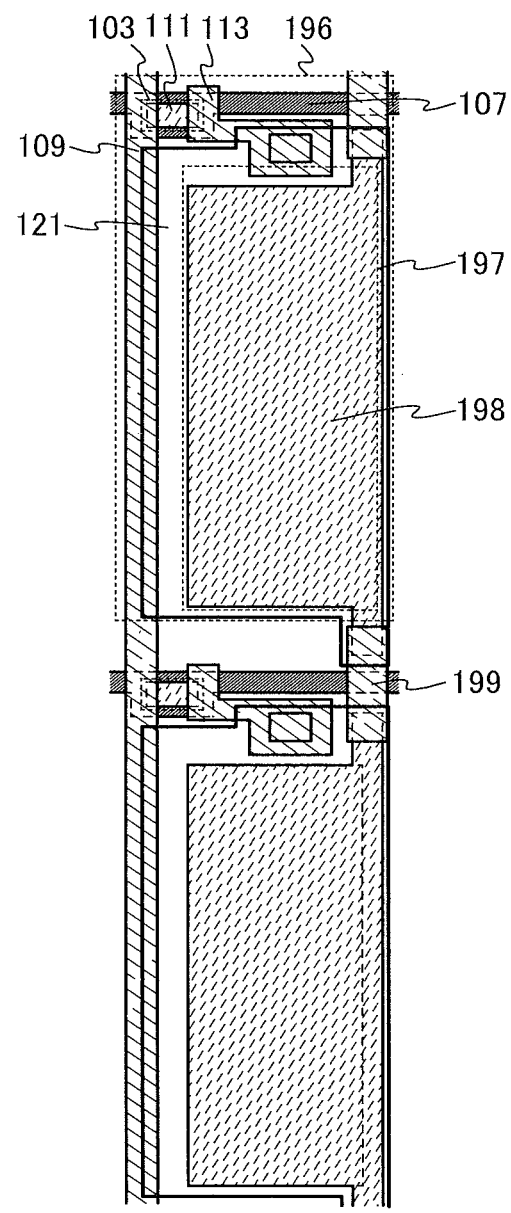
FIG. 7 is a top view illustrating a semiconductor device that is an embodiment of the present invention.

In the semiconductor device that is an embodiment of the present invention, one electrode of the capacitor and the capacitor line can be formed using a semiconductor film. A specific example is described with reference to FIG. 7. Here, only a semiconductor film 198 different from the semiconductor film 119 and the capacitor line 115 described with reference to FIG. 2 is described. FIG. 7 shows a top view of a pixel 196 where the semiconductor film 198 serving as one electrode of a capacitor 197 and the capacitor line is provided in the pixel 196. The semiconductor film 198 has a region which extends in the direction parallel to the signal line 109 and the region functions as the capacitor line. In the semiconductor film 198, a region which overlaps with the pixel electrode 121 functions as one electrode of the capacitor 197. The semiconductor film 198 can be formed concurrently with the semiconductor film 111 of the transistor 103 provided in the pixel 196.

In the case where a continuous semiconductor film is provided as the semiconductor film 198 for the pixels 196 in one row, the semiconductor film 198 overlaps with the scan lines 107. For this reason, the semiconductor film 198 does not function as the capacitor line and the one electrode of the capacitor 197 due to an effect of a change in the potential of the scan line 107 in some cases. Thus, it is preferable that, as illustrated in FIG. 7, the semiconductor film 198 of one pixel 196 be positioned separately from that of another pixel 196 and semiconductor films 198 be electrically connected to each other by a conductive film 199 which can be formed at the same time as the signal line 109 and the conductive film 113. With the above structure, a portion of the semiconductor film 198 which is not connected to the conductive film 199 overlaps with the pixel electrode 121, whereby the resistance of the semiconductor film 198 in the region can be low and thus the semiconductor film 198 functions as the capacitor line and one electrode of the capacitor 197.

Although not illustrated, one semiconductor film can be provided as the semiconductor film 198 for the pixels 196 so as to overlap with the scan lines 107 in the case where a portion of the semiconductor film 198 which overlaps with the scan line 107 is not influenced by a change in the potential of the scan line 107. In other words, a continuous oxide semiconductor film can be provided as the semiconductor film 198 for the pixels 196 in one row.

In FIG. 7, a portion of the semiconductor film 198 which functions as the capacitor line extends in the direction parallel to the signal line 109; however, the region which functions as the capacitor line may extend in the direction parallel to the scan line 107. In the case where the portion of the semiconductor film 198 which functions as the capacitor line extends in the direction parallel to the scan line 107, it is necessary that the semiconductor film 111 and the semiconductor film 198 be electrically insulated from the signal line 109 and the conductive film 113 by providing an insulating film between the semiconductor film 111 and the semiconductor film 198, and the signal line 109 and the conductive film 113, in the transistor 103 and the capacitor 197.

According to the above description, when a light-transmitting oxide semiconductor film is provided for one electrode of a capacitor provided in a pixel and a capacitor line as in the pixel 196, the pixel can have a higher aperture ratio.

Modification Example 5

Figure 8:
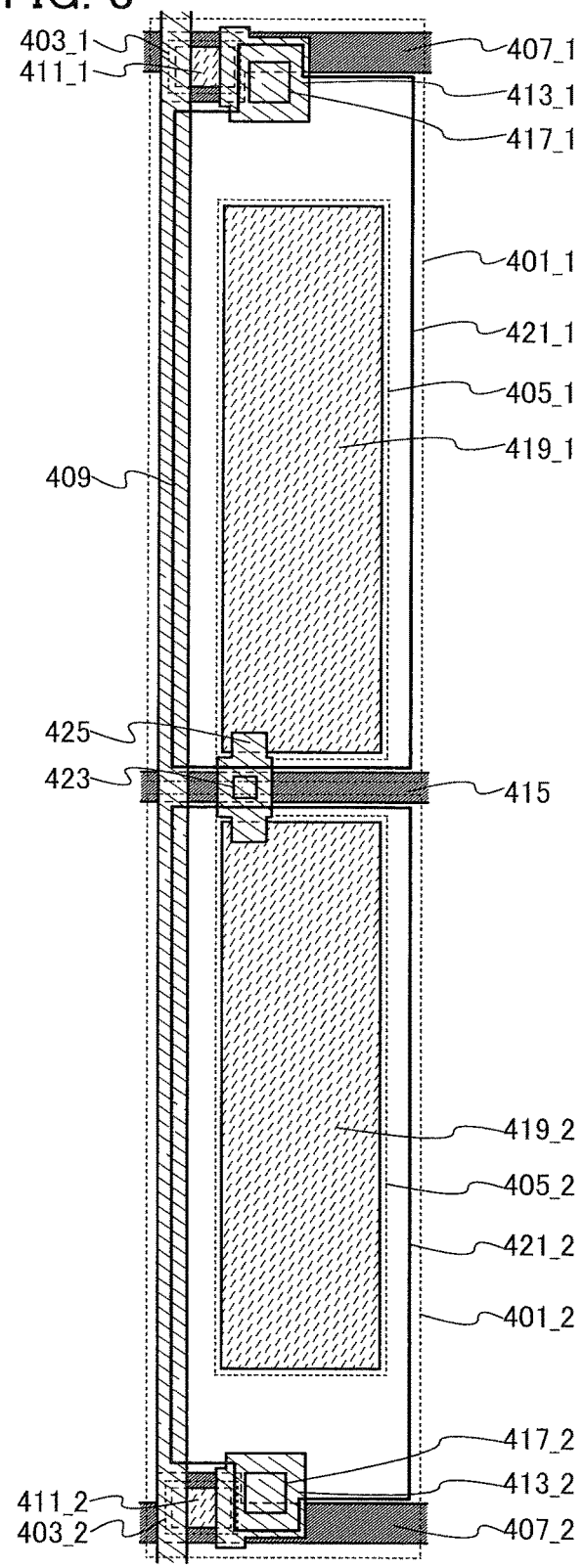
FIG. 8 is a top view illustrating a semiconductor device that is an embodiment of the present invention.

In the semiconductor device that is an embodiment of the present invention, the structure of the capacitor line can be changed as appropriate. This structure is described with reference to FIG. 8. In FIG. 8, unlike the capacitor line 115 described with reference to FIG. 2, a capacitor line is located between adjacent two pixels.

FIG. 8 illustrates a structure where the capacitor line is provided between the pixels adjacent to each other in the direction in which a signal line 409 extends. In stead of the structure of FIG. 8, a structure where a capacitor line is provided between pixels adjacent to each other in the direction in which a scan line 437 extends may be used as appropriate.

FIG. 8 is a top view of a pixel 401_1 and a pixel 401_2 adjacent to each other in the direction in which the signal line 409 extends.

A scan line 407_1 and a scan line 407_2 are provided so as to extend in parallel to each other in the direction substantially perpendicular to the signal line 409. A capacitor line 415 is provided between the scan lines 407_1 and 407_2 so as to be in parallel to the scan lines 407_1 and 407_2. The capacitor line 415 is electrically connected to a capacitor 405_1 provided in the pixel 401_1 and a capacitor 405_2 provided in the pixel 401_2. The top shapes and the positions of components of the pixel 401_1 and those of the pixel 401_2 are symmetric with respect to the capacitor line 415.

The pixel 401_1 is provided with a transistor 403_1 and a pixel electrode 421_1 and the capacitor 405_1 which are electrically connected to the transistor 403_1.

The transistor 403_1 is provided in a region where the scan line 407_1 and the signal line 409 intersect with each other. The transistor 403_1 includes at least an oxide semiconductor film 411_1 including a channel formation region, a gate electrode, a gate insulating film (not illustrated in FIG. 8), a source electrode, and a drain electrode. A region of the scan line 407_1 which overlaps with the semiconductor film 411_1 serves as the gate electrode of the transistor 403_1. A region of the signal line 409 which overlaps with the semiconductor film 411_1 serves as the source electrode of the transistor 403_1. A region of a conductive film 413_1 which overlaps with the semiconductor film 411_1 serves as the drain electrode of the transistor 403_1. The conductive film 413_1 and the pixel electrode 421_1 are electrically connected to each other through an opening 417_1.

The capacitor 405_1 is electrically connected to the capacitor line 415 through a conductive film 425 provided in and over an opening 423. The capacitor 405_1 includes a semiconductor film 419_1 formed with an oxide semiconductor, the pixel electrode 421_1, and, as a dielectric film, an insulating film (not illustrated in FIG. 8) which is included in the transistor 403_1. The semiconductor film 419_1, the pixel electrode 421_1, and the dielectric film transmit light; thus, the capacitor 405_1 transmits light.

The pixel 401_2 is provided with a transistor 403_2 and a pixel electrode 421_2 and the capacitor 405_2 which are electrically connected to and the transistor 403_2.

The transistor 403_2 is provided in a region where the scan line 407_2 and the signal line 409 intersect with each other. The transistor 403_2 includes at least a semiconductor film 411_2 including a channel formation region, a gate electrode, a gate insulating film (not illustrated in FIG. 8), a source electrode, and a drain electrode. A region of the scan line 407_2 which overlaps with the semiconductor film 411_2 serves as the gate electrode of the transistor 403_2. A region of the signal line 409 which overlaps with the semiconductor film 411_2 serves as the source electrode of the transistor 403_2. A region of the conductive film 413_2 which overlaps with the semiconductor film 411_2 serves as the drain electrode of the transistor 403_2. The conductive film 413_2 and the pixel electrode 421_2 are connected to each other through an opening 417_2.

The capacitor 405_2 is electrically connected to the capacitor line 415 through the conductive film 425 provided in and over the opening 423 in a manner similar to that of the capacitor 405_1. The capacitor 405_2 includes a semiconductor film 419_2 formed with an oxide semiconductor, the pixel electrode 421_2, and, as a dielectric film, an insulating film (not illustrated in FIG. 8) which is formed in the transistor 403_2. The semiconductor film 419_2, the pixel electrode 421_2, and the dielectric film transmit light; thus, the capacitor 405_2 transmits light.

Cross-sectional structures of the transistors 403_1 and 403_2 and the capacitors 405_1 and 405_2 are similar to those of the transistor 103 and the capacitor 105 illustrated in FIG. 3 and thus descriptions thereof are omitted here.

In a structure seen from above, a capacitor line is provided between adjacent two pixels so that capacitors included in the pixels and the capacitor line are connected, whereby the number of capacitor lines can be reduced. As a result, the aperture ratio of the pixel can be high as compared with the case of a structure where each pixel is provided with a capacitor line.

Modification Example 6

In the semiconductor device that is an embodiment of the present invention, the shape of a transistor provided in a pixel is not limited to the shape of the transistor illustrated in FIG. 2 and FIG. 3 and can be changed as appropriate. For example, in the transistor, a source electrode included in the signal line 109 has a U shape (or a C shape, a square-bracket-like shape, or a horseshoe shape) which surrounds the conductive film including a drain electrode. With such a shape, an enough channel width can be ensured even when the area of the transistor is small, and accordingly, the amount of drain current flowing at the time of conduction of the transistor (also referred to as an on-state current) can be increased.

Modification Example 7

Although in the pixels 101, 172, and 196 described above, a transistor where the semiconductor film is provided between the gate insulating film, and the signal line 109 including the source electrode and the conductive film 113 including the drain electrode is used, instead of the transistor, a transistor where a semiconductor film is provided between the insulating film 129, and the signal line including the source electrode and the conductive film including the drain electrode can be used.

Modification Example 8

Although in the pixels 101, 172, and 196 described above, a channel-etched transistor is used as the transistor, instead of the transistor, a channel protective transistor can be used. Further, when a channel protective film is provided, a surface of the semiconductor film 111 is not exposed to an etchant or an etching gas used in a formation process of the signal line and the conductive film, so that impurities between the semiconductor film 111 and the channel protective film can be reduced. Accordingly, a leakage current flowing between the source electrode and the drain electrode of the transistor can be reduced.

Modification Example 9

Although in the pixels 101, 172, 196, 401_1, and 401_2 described above, a transistor having one gate electrode is used, instead of the transistor, a transistor having two gate electrodes facing each other with the semiconductor film 111 interposed therebetween can be used.

The transistor includes a conductive film over the insulating film 137 of the transistor 103 described in this embodiment. The conductive film overlaps with at least a channel formation region of the semiconductor film 111. It is preferable that the conductive film be provided in a position overlapping with the channel formation region of the semiconductor film 111 so that the potential of the conductive film is equal to the minimum potential of a video signal input to the signal line 109. In that case, a current flowing between the source electrode and the drain electrode in a surface of the semiconductor film 111 facing the conductive film 187 can be controlled, and variations in the electrical characteristics of the transistors can be reduced. Further, when the conductive film is provided, an influence of a change in ambient electric field on the semiconductor film 111 can be reduced, leading to an improvement in reliability of the transistor.

The conductive film can be formed using a material and a method similar to those of the scan line 107, the signal line 109, the pixel electrode 121, or the like.

As described above, the use of the semiconductor film formed in the same formation step as the semiconductor film included in the transistor, for one electrode of the capacitor, allows fabrication of a semiconductor device including the capacitor whose charge capacity is increased while improving the aperture ratio. Accordingly, the semiconductor device can have excellent display quality.

Further, oxygen vacancies and impurities such as hydrogen in the oxide semiconductor film, which is formed using an oxide semiconductor included in the transistor, are reduced, so that the semiconductor device that is an embodiment of the present invention has favorable electrical characteristics.

Note that the structures and the like described in this embodiment can be combined as appropriate with any of the structures and the like described in the other embodiments and example.

Embodiment 2

In this embodiment, a semiconductor device of an embodiment of the present invention, which has a structure different from those described in the above embodiment, is described with reference to drawings. Note that in this embodiment, a liquid crystal display device is described as an example of the semiconductor device of an embodiment of the present invention. In the semiconductor device described in this embodiment, the structure of a capacitor is different from that of the capacitor in the above embodiment. The above embodiment can be referred to for components in the semiconductor device in this embodiment, which are similar to those of the semiconductor device in the above embodiment.

<Structure of Semiconductor Device>

Figure 9:
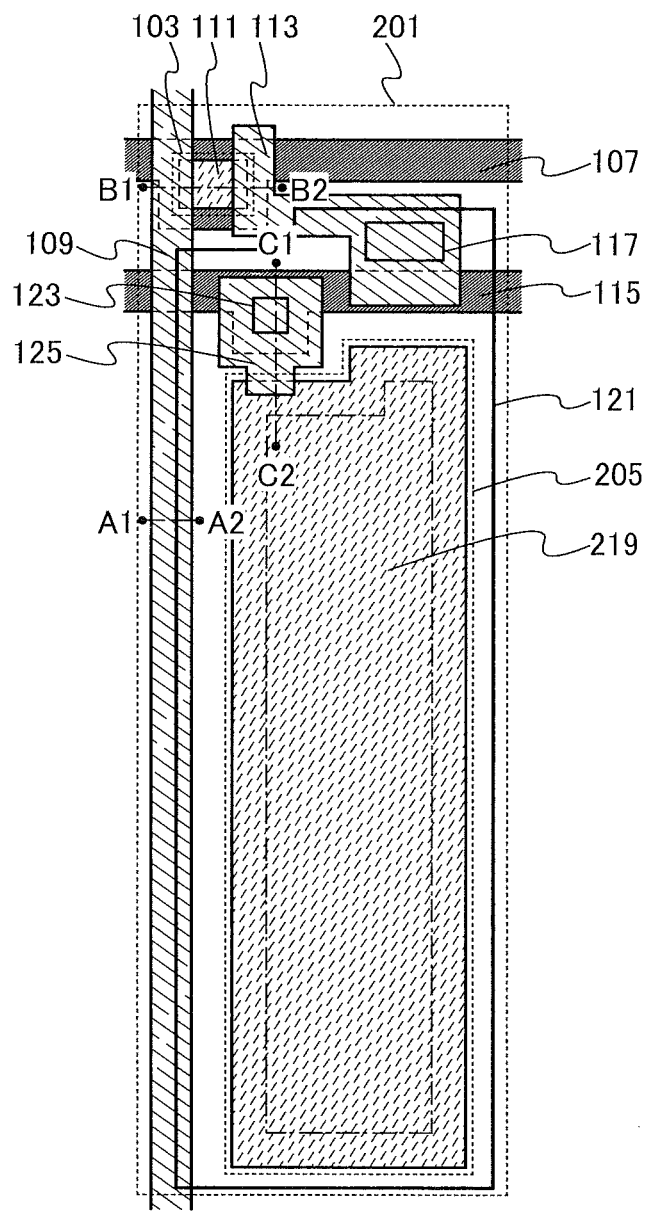
FIG. 9 is a top view illustrating a semiconductor device that is an embodiment of the present invention.

FIG. 9 is a top view of the pixel 101 in this embodiment. In a pixel 201 illustrated in FIG. 9, an insulating film 229 (not illustrated) and an insulating film 231 (not illustrated) are not provided in a region indicated by an alternate long and short dashed line. Edges of the insulating film 229 (not illustrated) and the insulating film 231 (not illustrated) are over the semiconductor film 119. Thus, a capacitor 205 in the pixel 201 in FIG. 9 includes the semiconductor film 119 which is one electrode, a pixel electrode 221 serving as the other electrode, and insulating films 232 and 237 (not illustrated) which serve as a dielectric film.

Figure 10:
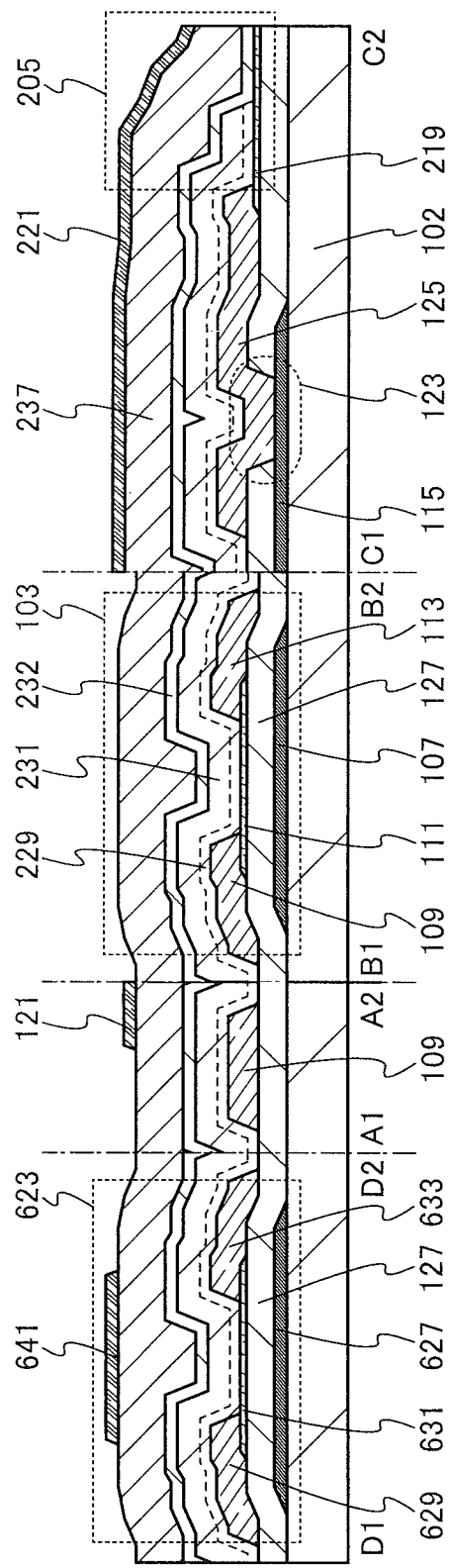
FIG. 10 is a cross-sectional view illustrating a semiconductor device that is an embodiment of the present invention.

Next, FIG. 10 illustrates a cross-sectional view of a transistor provided in the scan line driver circuit 104 (see FIG. 1A) and cross-sectional views taken along dashed-dotted line A1-A2, dashed-dotted line B1-B2, and dashed-dotted line C1-C2 in FIG. 9. Here, a top view of the scan line driver circuit 104 is omitted, and a cross-sectional view of the scan line driver circuit 104 taken along dashed-dotted line D1-D2 is illustrated. The cross-sectional view of the transistor provided in the scan line driver circuit 104 is illustrated here, and the transistor can be provided in the signal line driver circuit 106.

The cross-sectional structure of the pixel 201 of this embodiment is as follows. Over the substrate 102, the scan line 107 including the gate electrode of the transistor 103 and the capacitor line 115 which is on the same surface as the scan line 107 are provided. The gate insulating film 127 is provided over the scan line 107 and the capacitor line 115. The semiconductor film 111 is provided over a region of the gate insulating film 127, which overlaps with the scan line 107, and a semiconductor film 219 is provided over the gate insulating film 127. The signal line 109 including the source electrode of the transistor 103 and the conductive film 113 serving as the drain electrode of the transistor 103 are provided over the semiconductor film 111 and the gate insulating film 127. The opening 123 reaching the capacitor line 115 is provided in the gate insulating film 127, and the conductive film 125 is provided in and over the opening 123 and over the gate insulating film 127 and the semiconductor film 219. The insulating films 229, 231, 232, and 237 which each serve as a protective insulating film of the transistor 103 are provided over the gate insulating film 127, the signal line 109, the semiconductor film 111, the conductive films 113 and 125, and the semiconductor film 219. Further, the insulating film 232 is provided over the semiconductor film 219 at least in a region to be the capacitor 205. The opening 117 (see FIG. 9) reaching the conductive film 113 is provided in the insulating films 229, 231, 232 and 237, and the pixel electrode 221 is provided in and over the opening 117 (see FIG. 9) and over the insulating film 232. Note that a base insulating film may be provided between the substrate 102, and the scan line 107, the capacitor line 115, and the gate insulating film 127.

The insulating film 229 is similar to the insulating film 129 described in Embodiment 1. The insulating film 231 is similar to the insulating film 131 described in Embodiment 1. The insulating film 232 is similar to the insulating film 132 described in Embodiment 1. The insulating film 237 is similar to the insulating film 137 described in Embodiment 1. The pixel electrode 221 is similar to the pixel electrode 121 described in Embodiment 1.

When the insulating films 232 and 237 serve as a dielectric film between the semiconductor film 219 which is one electrode and the pixel electrode 221 serving as the other electrode as in the capacitor 205 and the insulating film 237 in this embodiment, the thickness of the dielectric film can be smaller than that of the dielectric film of the capacitor 105 in Embodiment 1. Thus, the capacitor 205 in this embodiment can have larger charge capacity than the capacitor 105 in Embodiment 1.

Further, the insulating films 232 and 237 together serve as a dielectric film of the capacitor 205. The insulating film 232 is formed using a nitride insulating film which tends to have a higher relative dielectric constant and a greater internal stress than an oxide insulating film such as a silicon oxide film. Thus, in the case where the insulating film 232 is used alone as the dielectric film of the capacitor 205 without the insulating film 237, if the thickness of the insulating film 232 is small, the capacitance value of the capacitor 205 becomes too large, which makes it difficult to increase the speed of writing an image signal to a pixel with low power consumption. On the other hand, if the thickness of the insulating film 232 is large, internal stress becomes too large, which leads to a degradation of electrical characteristics such as a change in threshold voltage of the transistor. When internal stress of the insulating film 232 becomes too large, the insulating film 232 is likely to be separated from the substrate 102, so that the yield is lowered. The insulating film 237 formed using an oxide insulator such as silicon oxide, which has a lower relative dielectric constant than the insulating film 232, is used together with the insulating film 232 as the dielectric film of the capacitor included in the pixel, so that the dielectric constant of the dielectric film can be adjusted to a desirable value without increasing the thickness of the insulating film 232.

The insulating film 232 is a nitride insulating film as well as the insulating film 132 in Embodiment 1, and thus the semiconductor film 219 has a high conductivity and becomes n-type. Further, the semiconductor film 219 is a light-transmitting conductive film including a metal oxide having characteristics of a conductor. The semiconductor film 219 has a higher conductivity than the semiconductor film 111.

The semiconductor film 219 has a region with higher conductivity than that of the semiconductor film 111. With this structure, a portion of the semiconductor film 219 which is in contact with the insulating film 232 is n-type and has higher conductivity than a portion of the semiconductor film 111 which is in contact with the insulating film 229.

Note that it is preferable that the semiconductor film 219 have a higher hydrogen concentration than the semiconductor film 111. In the semiconductor film 219, the hydrogen concentration measured by secondary ion mass spectrometry (SIMS) is greater than or equal to $8 \times 10^{19}$ atoms/cm$^3$, preferably greater than or equal to $1 \times 10^{20}$ atoms/cm$^3$, more preferably greater than or equal to $5 \times 10^{20}$ atoms/cm$^3$. In the semiconductor film 111, the hydrogen concentration measured by SIMS is less than $5 \times 10^{19}$ atoms/cm$^3$, preferably less than $5 \times 10^{18}$ atoms/cm$^3$, more preferably less than or equal to $1 \times 10^{18}$ atoms/cm$^3$, still more preferably less than or equal to $5 \times 10^{17}$ atoms/cm$^3$, further preferably less than or equal to $1 \times 10^{16}$ atoms/cm$^3$.

The resistivity of the semiconductor film 219 is lower than that of the semiconductor film 111. The resistivity of the semiconductor film 219 is preferably greater than or equal to $1\times10^{-8}$ times and less than or equal to $1\times10^{-1}$ times the resistivity of the semiconductor film 111. The resistivity of the semiconductor film 219 is typically greater than or equal to $1\times10^{-3}$ Ωcm and less than $1\times10^{4}$ Ωcm, preferably greater than or equal to $1\times10^{-3}$ Ωcm and less than $1\times10^{-1}$ Ωcm.

In an operation method of the capacitor 205 in the semiconductor device of this embodiment, the potential of the semiconductor film 219 (in other words, the potential of the capacitor line 115) is constantly lower than the potential of the pixel electrode 121 by greater than or equal to the threshold voltage (Vth) of the capacitor 205 (MOS capacitor) in a period when the capacitor 205 is operated, as in the operation method of the capacitor 105 in Embodiment 1. However, in the capacitor 205, the semiconductor film 219 serving as one electrode is n-type and has high conductivity, so that the threshold voltage is shifted in the negative direction. The potential of the semiconductor film 219 (in other words, the potential of the capacitor line 115) can be raised in accordance with the shift amount of the threshold voltage of the capacitor 205 in the negative direction, from the lowest potential of the pixel electrode 121. Therefore, in the case where the threshold voltage of the capacitor 205 is a larger negative value, the potential of the capacitor line 115 can be higher than the potential of the pixel electrode 121.

When the semiconductor film 219 serving as one electrode of the capacitor 205 is n-type and has high conductivity as in this embodiment, the threshold voltage can be shifted in the negative direction, so that the range of the potential needed for operating the capacitor 205 can be made large as compared with the case of the capacitor 105 in Embodiment 1. Thus, in this embodiment, the capacitor 205 can be constantly operated with stability in an operation period of the capacitor 205, which is preferable.

Further, since the semiconductor film 219 included in the capacitor 205 is n-type and has high conductivity, enough charge capacity can be obtained even when the plane area of the capacitor 205 is reduced. An oxide semiconductor included in the semiconductor film 219 transmits 80% to 90% of visible light; thus, when the area of the semiconductor film 219 is reduced and a region where the semiconductor film 219 is not formed is provided in the pixel, the transmissivity with respect to light emitted from a light source such as a backlight can be increased.

<Manufacturing Method of Semiconductor Device>

Next, a manufacturing method of an element portion provided over the substrate 102 described in this embodiment is described with reference to FIGS. 11A and 11B and FIGS. 12A and 12B.

First, the scan line 107, the capacitor line 115, and the gate electrode 627 are formed over the substrate 102. An insulating film which is processed into the gate insulating film 127 is formed over the substrate 102, the scan line 107, the capacitor line 115, and the gate electrode 627. The semiconductor film 111, the semiconductor film 119, and the semiconductor film 631 are formed over the insulating film. The opening 123 reaching the capacitor line 115 is formed in the insulating film to form the gate insulating film 127 and then the signal line 109, the conductive films 113 and 125, the source electrode 629, and the drain electrode 633 are formed. The insulating film 128 is formed over the gate insulating film 127, the semiconductor films 111, 119, and 631, the signal line 109, the conductive films 113 and 125, the source electrode 629, and the drain electrode 633, and the insulating film 130 is formed over the insulating film 128 (see FIG. 11A). Note that the above steps can be performed with reference to Embodiment 1.

Next, a mask is formed over a region of the insulating film 130, which overlaps with at least the semiconductor film 119. Processing is performed to form an insulating film 228 and an insulating film 230 with the use of the mask and expose the semiconductor film 119 (see FIG. 11B). As the mask, a resist mask formed through a photolithography process can be used, and the processing can be performed by one or both of dry etching and wet etching.

Next, an insulating film 233 is formed over the exposed region of the semiconductor film 119 and the insulating film 230, and an insulating film 236 is formed over the insulating film 233 (see FIG. 12A). The insulating film 233 is similar to the insulating film 133 described in Embodiment 1. The insulating film 236 is similar to the insulating film 136 described in Embodiment 1. Heat treatment may be performed while the insulating film 233 is in contact with the semiconductor film 119, for example, after formation of the insulating film 233 and the insulating film 236. The above steps can also be performed with reference to Embodiment 1.

When the insulating film 233 is formed using a nitride insulating film by a plasma CVD method or a sputtering method, the semiconductor film 119 is exposed to plasma and oxygen vacancies are generated in the semiconductor film 119. Moreover, when the semiconductor film 119 is in contact with the insulating film 233 formed using a nitride insulating film, nitrogen and/or hydrogen are/is transferred from the insulating film 233 to the semiconductor film 119. Due to entry of hydrogen contained in the insulating film 233 into an oxygen vacancy, an electron serving as a carrier is generated. Alternatively, when the insulating film 232 is formed using a nitride insulating film and is subjected to heat treatment while it is in contact with the semiconductor film 119, nitrogen and/or hydrogen contained in the nitride insulating film can be transferred to the semiconductor film 119. Due to entry of hydrogen contained in the insulating film 233 into an oxygen vacancy, an electron serving as a carrier is generated. Accordingly, the semiconductor film 119 has increased conductivity to be the n-type semiconductor film 219. Further, the semiconductor film 219 becomes a light-transmitting conductive film which includes a metal oxide film having conductor characteristics. Note that the conductivity of the semiconductor film 219 is higher than that of the semiconductor film 111.

Next, the opening 117 reaching the conductive film 113 is formed in the insulating films 228, 230, 233, and 236 to form the insulating films 229, 231, 232, and 237 (see FIG. 9). Then, the pixel electrode 221 in contact with the conductive film 113 through the opening 117 is formed (see FIG. 12B). The above steps can be performed with reference to Embodiment 1.

Through the above process, the semiconductor device in this embodiment can be fabricated.

Modification Example

In the semiconductor device that is an embodiment of the present invention, the structure of the capacitor can be changed as appropriate. A specific example of the structure is described with reference to FIG. 13. Here, only a capacitor 245 which is different from the capacitor 105 described with reference to FIG. 9 and FIG. 10 is described.

In order that the semiconductor film 219 be n-type and have higher conductivity, a gate insulating film 227 has a layered structure of an insulating film 225 formed of a nitride insulating film and an insulating film 226 formed of an oxide insulating film and only the insulating film 225 which is a nitride insulating film is provided in a region where at least the semiconductor film 219 is provided. With such a structure, the nitride insulating film which is the insulating film 225 is in contact with the bottom surface of the semiconductor film 219, so that the semiconductor film 219 can be n-type and have higher conductivity. In this case, a dielectric film of the capacitor 245 includes the insulating films 129, 131, 132, and 137. As the insulating films 225 and 226, the insulating films which can be used as the gate insulating film 127 can be used as appropriate, and the insulating film 225 may be formed using an insulating film similar to the insulating film 132. Further, to obtain this structure, the insulating film 226 is processed as appropriate with reference to Embodiment 1. A step of etching the insulating films 129 and 131 is not performed with the structure illustrated in FIG. 13; therefore, a reduction in thickness of the semiconductor film 219 can be prevented; thus, the yield is increased as compared with the semiconductor device illustrated in FIG. 9 and FIG. 10.

In the structure illustrated in FIG. 13, the top surface of the semiconductor film 219 may be in contact with the insulating film 132. That is, regions of the insulating films 129 and 131 in FIG. 13 which are in contact with the semiconductor film 219 may be removed. In that case, the insulating films 132 and 137 serve as the dielectric film of the capacitor 245. When the top and bottom surfaces of the semiconductor film 219 are in contact with the nitride insulating film, the semiconductor film 219 can have a higher conductivity to be n-type more efficiently and sufficiently than the semiconductor film 219 only one surface of which is in contact with the nitride insulating film.

As described above, the use of the semiconductor film formed in the same formation process as the semiconductor film included in the transistor for one electrode of the capacitor allows fabrication of a semiconductor device including the capacitor whose charge capacity is increased while the aperture ratio is improved to typically 55% or more, preferably 60% or more. As a result, the semiconductor device can have an excellent display quality.

Further, oxygen vacancies and impurities such as hydrogen in the semiconductor film formed using an oxide semiconductor and included in the transistor are reduced, so that the semiconductor device that is an embodiment of the present invention has favorable electrical characteristics.

Note that the structure and the like described in this embodiment can be used as appropriate in combination with any of the structures and the modification examples in the other embodiments.

Embodiment 3

In this embodiment, a semiconductor device that is an embodiment of the present invention, which has a structure different from those described in the above embodiment, is described with reference to drawings. Note that in this embodiment, a liquid crystal display device is described as an example of the semiconductor device that is an embodiment of the present invention. In the semiconductor device described in this embodiment, the structure of a semiconductor film included in a capacitor is different from that of the capacitor in the above embodiment. The above embodiment can be referred to for components in the semiconductor device in this embodiment, which are similar to those of the semiconductor device in the above embodiment.

<Structure of Semiconductor Device>

Figure 14:
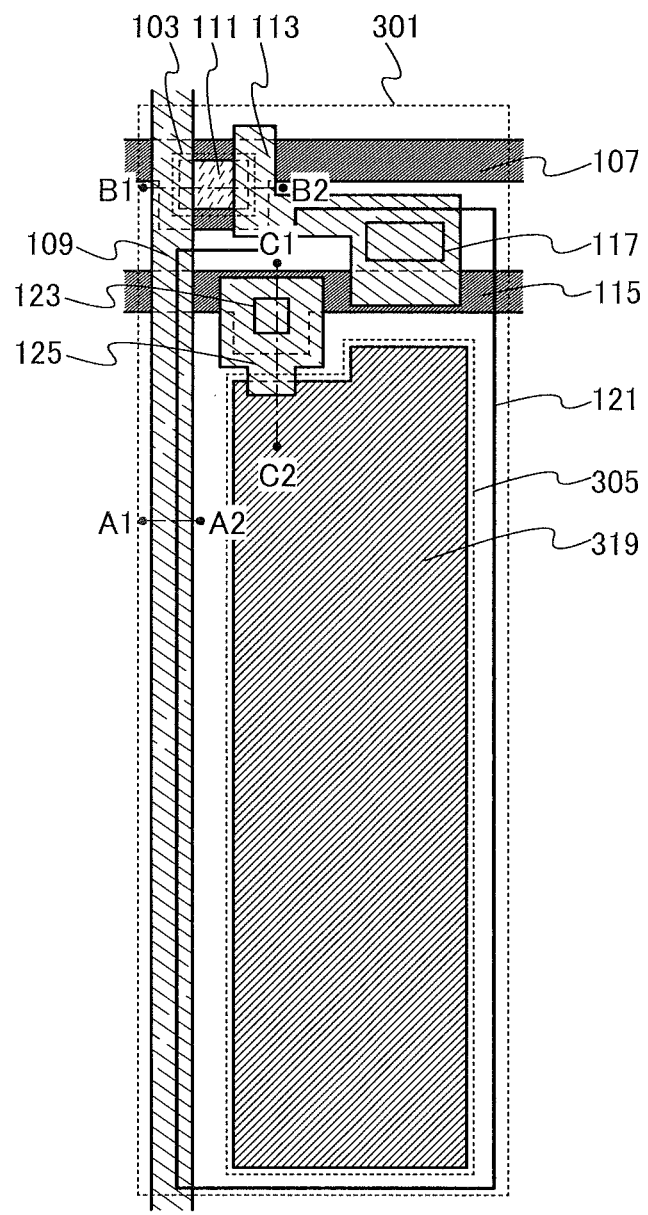
FIG. 14 is a top view illustrating a semiconductor device that is an embodiment of the present invention.

Next, a specific example of the structure of a pixel 301 provided in a pixel portion of the liquid crystal display device described in this embodiment is described. FIG. 14 is a top view of the pixel 301. The pixel 301 illustrated in FIG. 14 includes a capacitor 305, and the capacitor 305 is provided in a region of the pixel 301, which is surrounded by the capacitor line 115 and the signal line 109. The capacitor 305 is electrically connected to the capacitor line 115 through the conductive film 125 provided in and over the opening 123. The capacitor 305 is formed using an oxide semiconductor, and includes a semiconductor film 319 which has a higher conductivity than the semiconductor film 111, the pixel electrode 121, and, as a dielectric film, the insulating films (not illustrated in FIG. 14) which is provided over the transistor 103. The semiconductor film 319, the pixel electrode 121, and the dielectric film transmit light; thus, the capacitor 305 transmits light.

The conductivity of the semiconductor film 319 is higher than or equal to 10 S/cm and lower than or equal to 1000 S/cm, preferably higher than or equal to 100 S/cm and lower than or equal to 1000 S/cm.

As described above, the semiconductor film 319 transmits light. That is to say, the capacitor 305 can be formed large (in a large area) in the pixel 101. Therefore, the semiconductor device can have charge capacity increased while improving the aperture ratio to typically 55% or more, preferably 60% or more. Accordingly, the semiconductor device can have excellent display quality. Further, since the semiconductor film 319 included in the capacitor 305 is n-type and has high conductivity, the semiconductor film 319 can be considered as a conductive film. Further, since the semiconductor film 319 included in the capacitor 305 has high conductivity, enough charge capacity can be obtained even when the plane area of the capacitor 305 is reduced. An oxide semiconductor included in the semiconductor film 319 transmits 80 to 90% of light; thus, when the area of the semiconductor film 319 is reduced and a region where the semiconductor film 319 is not formed is provided in the pixel, the transmissivity with respect to light emitted from a light source such as a backlight can be increased.

Figure 15:
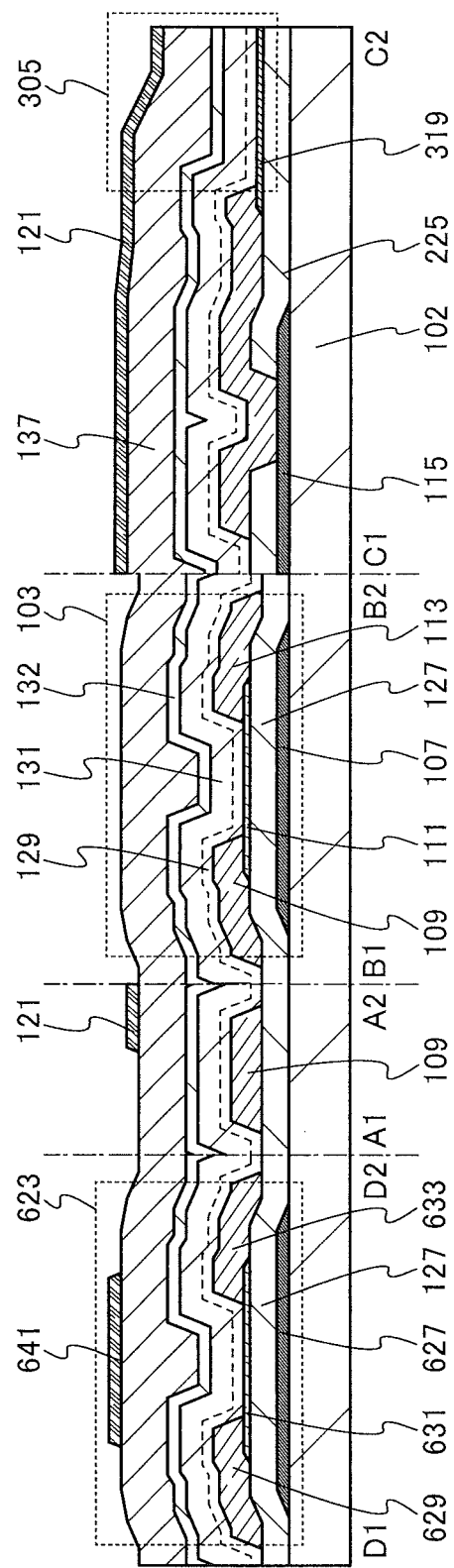
FIG. 15 is a cross-sectional view illustrating a semiconductor device that is an embodiment of the present invention.
Figure 16A:
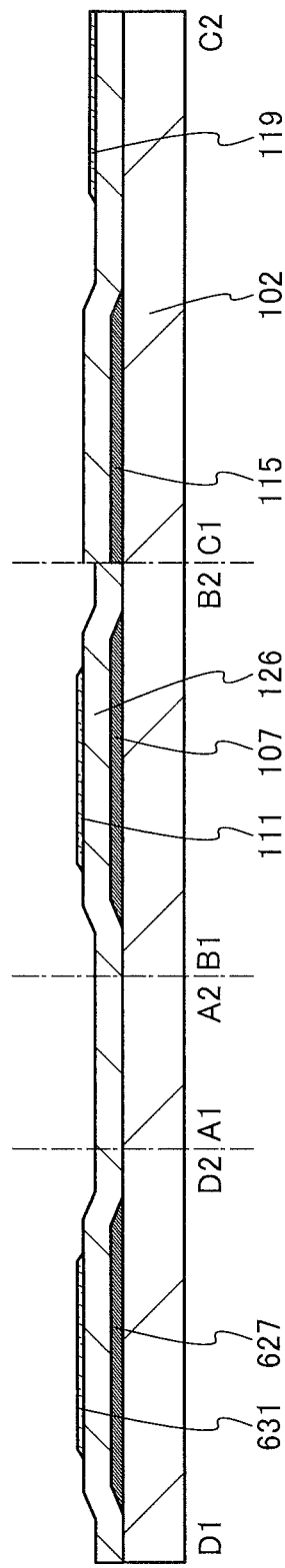
FIGS. 16A and 16B are cross-sectional views illustrating a manufacturing method of a semiconductor device that is an embodiment of the present invention.
Figure 16B:
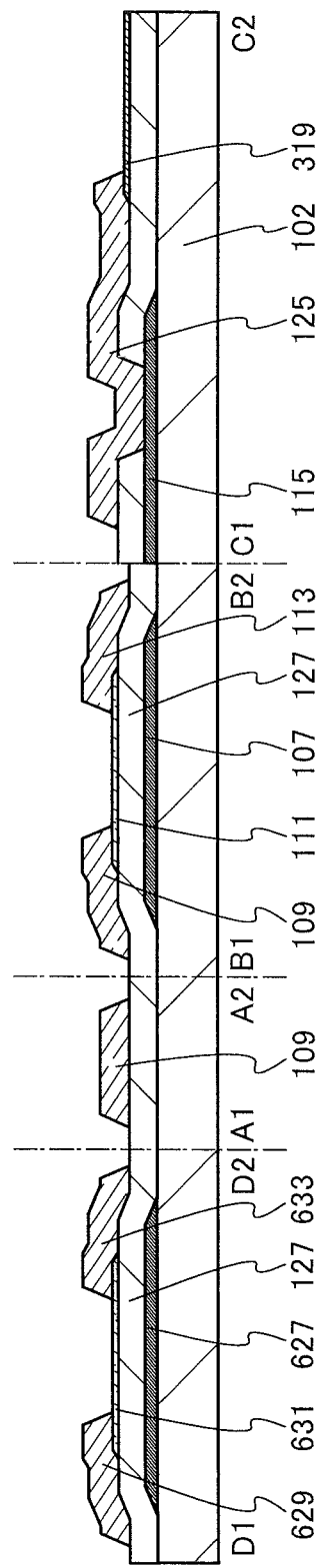

Next, FIG. 15 illustrates a cross-sectional view of a transistor provided in the scan line driver circuit 104 (see FIG. 1A) and cross-sectional views taken along dashed-dotted line A1-A2, dashed-dotted line B1-B2, and dashed-dotted line C1-C2 in FIG. 14. Here, a top view of the scan line driver circuit 104 is omitted, and a cross-sectional view of the scan line driver circuit 104 taken along dashed-dotted line D1-D2 is illustrated. The cross-sectional view of the transistor provided in the scan line driver circuit 104 is illustrated here, and the transistor can be provided in the signal line driver circuit 106.

The cross-sectional structure of the pixel 301 is as follows. Over the substrate 102, the scan line 107 of the transistor 103 is provided. The gate insulating film 127 is provided over the scan line 107. The semiconductor film 111 is provided over a region of the gate insulating film 127 which overlaps with the scan line 107. The semiconductor film 319 is provided over the gate insulating film 127. The signal line 109 of the transistor 103 and the conductive film 113 including the drain electrode of the transistor 103 are provided over the semiconductor film 111 and the gate insulating film 127. In addition, the capacitor line 115 is provided over the gate insulating film 127 and the semiconductor film 319. The insulating films 129, 131, 132, and 137 which each serve as a protective insulating film of the transistor 103 is provided over the gate insulating film 127, the signal line 109, the semiconductor film 111, the conductive film 113, the semiconductor film 319, and the capacitor line 115. The opening 117 reaching the conductive film 113 is provided in the insulating films 129, 131, 132, and 137 and the pixel electrode 121 is provided in and over the opening 117 and over the insulating film 132.

In the capacitor 305 in this structure, the semiconductor film 319 which is n-type and has a higher conductivity than the semiconductor film 111 serves as one of a pair of electrodes, the pixel electrode 121 serves as the other of the pair of electrodes, and the insulating films 129, 131, 132, and 137 serve as a dielectric film provided between the pair of electrodes.

For the semiconductor film 319, an oxide semiconductor that can be used for the semiconductor film 111 can be used. The semiconductor film 319 can be formed concurrently with the semiconductor film 111 and thus contains a metal element of an oxide semiconductor included in the semiconductor film 111. Further, the semiconductor film 319 preferably has a higher conductivity than the semiconductor film 111 and thus preferably contains an element (dopant) which increases the conductivity. Specifically, the semiconductor film 319 contains one or more selected from boron, nitrogen, fluorine, aluminum, phosphorus, arsenic, indium, tin, antimony, and a rare gas element as the dopant. The concentration of a dopant contained in the semiconductor film 319 is preferably greater than or equal to $1\times10^{19}$ atoms/cm$^3$ and less than or equal to $1\times10^{22}$ atoms/cm$^3$, in which case the conductivity of the semiconductor film 319 can be greater than or equal to 10 S/cm and less than or equal to 1000 S/cm, preferably greater than or equal to 100 S/cm and less than or equal to 1000 S/cm, so that the semiconductor film 319 can sufficiently serve as one electrode of the capacitor 305. The semiconductor film 319 has a region with a higher conductivity than that of the semiconductor film 111. In this structure, at least a region of the semiconductor film 319, which is in contact with the insulating film 132, has a higher conductivity than a region of the semiconductor film 111, which is in contact with the insulating film 129. Further, the semiconductor film 319 is n-type and has a high conductivity because of including the above element (dopant); therefore, the semiconductor film 319 can be called a conductive film.

<Manufacturing Method of Semiconductor Device>

Next, a manufacturing method of an element portion provided over the substrate 102 described in this embodiment is described with reference to FIGS. 16A and 16B and FIGS. 17A and 17B.

First, the scan line 107, the capacitor line 115, and the gate electrode 627 are formed over the substrate 102. The insulating film 126 which is processed into the gate insulating film 127 is formed over the substrate 102, the scan line 107, the capacitor line 115, and the gate electrode 627. The semiconductor films 111 and 119 are formed over the insulating film 126. The semiconductor film 631 is provided in a region overlapping with the gate electrode 627 (see FIG. 16A). Note that the above steps can be performed with reference to Embodiment 1.

Next, a dopant is added to the semiconductor film 119 to form the semiconductor film 319, the opening 123 reaching the capacitor line 115 is formed in the insulating film 126 to form the gate insulating film 127, and then the signal line 109 of the transistor 103, the conductive film 113 including the drain electrode of the transistor 103, and the conductive film 125 which electrically connects the semiconductor film 319 and the capacitor line 115 are formed. Further, the source electrode 629 and the drain electrode 633 are formed (see FIG. 16B).

A method of adding a dopant to the semiconductor film 119 is as follows: a mask is provided in a region except the semiconductor film 119 and one or more dopants selected from boron, nitrogen, fluorine, aluminum, phosphorus, arsenic, indium, tin, antimony, and a rare gas element is added to the semiconductor film 119 by an ion implantation method, an ion doping method, or the like. Alternatively, the semiconductor film 119 may be exposed to plasma containing the dopant to add the dopant to the semiconductor film 119, instead of employing an ion implantation method or an ion doping method. Note that heat treatment may be performed after the dopant is added to the semiconductor film 119. The heat treatment can be performed as appropriate with reference to the details of the heat treatment for dehydration or dehydrogenation of the semiconductor films 111 and 119.

The step of adding the dopant may be performed after formation of the signal line 109, the conductive films 113 and 125, the source electrode 629, and the drain electrode 633, in which case the dopant is not added to regions of the semiconductor film 319 which are in contact with the signal line 109, the conductive film 113, and the conductive film 125.

Next, the insulating film 128 is formed over the semiconductor films 111, 319, and 631, the signal line 109, the conductive films 113 and 125, the source electrode 629, the drain electrode 633, and the gate insulating film 127. The insulating film 130 is formed over the insulating film 128, and the insulating film 133 is formed over the insulating film 130. The insulating film 136 is formed over the insulating film 133 (see FIG. 17A). The above steps can be performed with reference to Embodiment 1.

Next, the opening 117 (see FIG. 14) reaching the conductive film 113 is formed in regions of the insulating films 128, 130, 133, and 136 which overlap with the conductive film 113, and the insulating films 129, 131, 132, and 137 are formed. The pixel electrode 121 in contact with the conductive film 113 through the opening 117 is formed (see FIG. 17B). The above steps can be performed with reference to Embodiment 1.

Through the above process, the semiconductor device in this embodiment can be fabricated.

Accordingly, the use of the semiconductor film formed in the same formation process as the semiconductor film included in the transistor, for one electrode of the capacitor, allows fabrication of a semiconductor device including the capacitor whose charge capacity is increased while the aperture ratio is improved. As a result, the semiconductor device can have an excellent display quality.

Further, oxygen vacancies and impurities such as hydrogen in the semiconductor film formed using an oxide semiconductor and included in the transistor are reduced, so that the semiconductor device that is an embodiment of the present invention has favorable electrical characteristics.

Note that the structure and the like described in this embodiment can be used as appropriate in combination with any of the structures and the modification examples in the other embodiments.

Embodiment 4

In this embodiment, one embodiment which can be applied to an oxide semiconductor included in a semiconductor film in the transistor and the capacitor included in the semiconductor device described in the above embodiment is described.

The oxide semiconductor film is preferably formed using any of an amorphous oxide semiconductor, a single crystal oxide semiconductor, a polycrystalline oxide semiconductor, and an oxide semiconductor including a crystalline portion (a c-axis aligned crystalline oxide semiconductor (CAAC-OS)). The CAAC-OS film is one of oxide semiconductor films including a plurality of crystal parts, and most of each crystal part fits inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2$\theta$ is around 56°. This peak is derived from the (110) plane of the $InGaZnO_4$ crystal. Here, analysis ($\phi$ scan) is performed under conditions where the sample is rotated around a normal vector of a sample surface as an axis (q axis) with 2$\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when 0 scan is performed with 2$\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 310. The peak of $2\theta$ at around 36° indicates that a crystal having no c-axis alignment is included in part of the CAAC-OS film. It is preferable that in the CAAC-OS film, a peak of $2\theta$ appears at around 31° and a peak of $2\theta$ do not appear at around 36°.

For example, there are three methods for forming a CAAC-OS film.

The first method is to form an oxide semiconductor film at a temperature higher than or equal to 100° C. and lower than or equal to 450° C., whereby crystal parts in which the c-axes are aligned in the direction parallel to a normal vector of a surface on which the oxide semiconductor film is formed or a normal vector of a surface of the oxide semiconductor film are formed in the oxide semiconductor film.

The second method is to form an oxide semiconductor film with a small thickness and then heat it at a temperature higher than or equal to 200° C. and lower than or equal to 700° C., whereby crystal parts in which the c-axes are aligned in the direction parallel to a normal vector of a surface on which the oxide semiconductor film is formed or a normal vector of a surface of the oxide semiconductor film are formed in the oxide semiconductor film.

The third method is to form a first oxide semiconductor film with a small thickness, then heat it at a temperature higher than or equal to 200° C. and lower than or equal to 700° C., and form a second oxide semiconductor film, whereby crystal parts in which the c-axes are aligned in the direction parallel to a normal vector of a surface on which the oxide semiconductor film is formed or a normal vector of a surface of the oxide semiconductor film are formed in the oxide semiconductor film.

In a transistor using the CAAC-OS film for an oxide semiconductor film, change in the electrical characteristics of the transistor due to irradiation with visible light or ultraviolet light is small. Thus, the transistor using the CAAC-OS film as the oxide semiconductor film has high reliability.

For example, it is preferable that the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle or the pellet-like sputtered particle reaches a surface on which the CAAC-OS film is formed while maintaining its crystal state, whereby the CAAC-OS film can be deposited.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is lower than or equal to −80° C., preferably lower than or equal to −100° C. is used.

By increasing the heating temperature of the surface on which the CAAC-OS film is formed (e.g., the substrate heating temperature) during the deposition, migration of a sputtered particle is likely to occur after the sputtered particle reaches the surface on which the CAAC-OS film is formed. Specifically, the temperature of the surface on which the CAAC-OS film is formed during the deposition is higher than or equal to 100° C. and lower than or equal to 740° C., preferably higher than or equal to 150° C. and lower than or equal to 500° C. By increasing the temperature of the surface on which the CAAC-OS film is formed during the deposition, when the flat-plate-like or pellet-like sputtered particle reaches the surface on which the CAAC-OS film is formed, migration occurs on the surface on which the CAAC-OS film is formed, so that a flat plane of the sputtered particle is attached to the surface on which the CAAC-OS film is formed.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn—O compound target is described below.

The polycrystalline In—Ga—Zn—O compound target is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Further, the oxide semiconductor film may have a structure in which a plurality of oxide semiconductor films are stacked. For example, the oxide semiconductor film may have a stacked-layer structure of a first oxide semiconductor film and a second oxide semiconductor film which are formed using metal oxides with different atomic ratios. For example, the first oxide semiconductor film may be formed using one of an oxide containing two kinds of metals, an oxide containing three kinds of metals, and an oxide containing four kinds of metals, and the second oxide semiconductor film may be formed using one of the above which is different from the one used for the first oxide semiconductor film.

Alternatively, the oxide semiconductor film may have a two-layer structure of the first oxide semiconductor film and the second oxide semiconductor film, in which the constituent elements thereof are made the same and the atomic ratios of the constituent elements of the first oxide semiconductor film and the second oxide semiconductor film are made different. For example, the first oxide semiconductor film may contain In, Ga, and Zn at an atomic ratio of 3:1:2, and the second oxide semiconductor film may contain In, Ga, and Zn at an atomic ratio of 1:1:1. Alternatively, the first oxide semiconductor film may contain In, Ga, and Zn at an atomic ratio of 2:1:3, and the second oxide semiconductor film may contain In, Ga, and Zn at an atomic ratio of 1:3:2. Note that a proportion of each atom in the atomic ratio of the oxide semiconductor film varies within a range of ±20% as an error.

At this time, in one of the first oxide semiconductor film and the second oxide semiconductor film, which is closer to the gate electrode (on the channel side), the atomic ratio of In to Ga preferably satisfies the relation In≥Ga. In the other oxide semiconductor film, which is farther from the gate electrode (on the back channel side), the atomic ratio of In to Ga preferably satisfies the relation In<Ga. With a stacked-layer structure of these oxide semiconductor films, a transistor having high field-effect mobility can be formed. On the other hand, the atomic ratio of In to Ga in the oxide semiconductor film closer to the gate electrode (the oxide semiconductor film on the channel side) satisfies the relation In<Ga and the atomic ratio of In to Ga in the oxide semiconductor film on the back channel side satisfies the relation In≥Ga, whereby the amount of change of the threshold voltage of a transistor due to change over time or a reliability test can be reduced.

The first oxide semiconductor film containing In, Ga, and Zn at an atomic ratio of 1:3:2 can be formed by a sputtering method using an oxide target with an atomic ratio of 1:3:2 under the conditions where the substrate temperature is room temperature and a sputtering gas is argon or a mixed gas of argon and oxygen. The second oxide semiconductor film containing In, Ga, and Zn at an atomic ratio of 3:1:2 can be formed by a sputtering method using an oxide target with an atomic ratio of 3:1:2 similarly to the first oxide semiconductor film.

Further, the oxide semiconductor film may have a three-layer structure of a first oxide semiconductor film, a second oxide semiconductor film, and a third oxide semiconductor film, in which the constituent elements thereof are made the same and the atomic ratios of the constituent elements of the first oxide semiconductor film, the second oxide semiconductor film, and the third oxide semiconductor film are made different. The case where the oxide semiconductor film has a three-layer structure is described with reference to FIG. 18.

Figure 18:
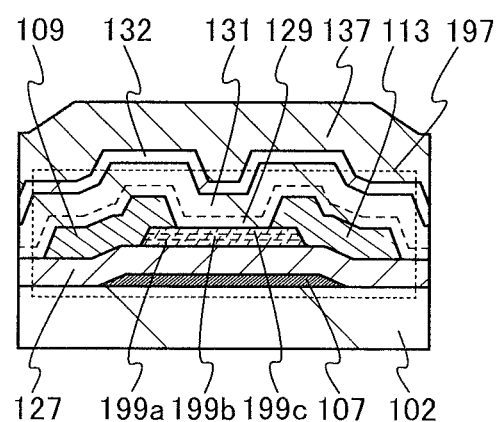
FIG. 18 is a cross-sectional view of a semiconductor device that is an embodiment of the present invention.

In a transistor illustrated in FIG. 18, a first oxide semiconductor film 199a, a second oxide semiconductor film 199b, and a third oxide semiconductor film 199c are stacked in this order from the gate insulating film 127 side. As a material of the first oxide semiconductor film 199a and the third oxide semiconductor film 199c, a material represented by $InM1_xZn_yO_z$ (x≥1, y>1, z>0, M1=Ga, Hf, or the like) is used. Note that in the case where a material of each of the first oxide semiconductor film 199a and the third oxide semiconductor film 199c contains Ga, a material containing a high proportion of Ga, specifically, a material which can be represented by $InM1_xZn_yO_z$ where x is larger than 10 is unsuitable because powder might be generated in deposition.

As a material of the second oxide semiconductor film 199b, a material which can be represented by $InM2_xZn_yO_z$ (x≥1, y≥x, z>0, M2=Ga, Sn, or the like) is used.

Materials of the first oxide semiconductor film 199a, the second oxide semiconductor film 199b, and the third oxide semiconductor film 199c are selected as appropriate so that a well structure is formed in which the conduction band of the second oxide semiconductor film 199b is deeper from the vacuum level than the conduction bands of the first oxide semiconductor film 199a and the third oxide semiconductor film 199c.

Note that silicon and carbon, which are Group 14 elements, are donor supply sources in an oxide semiconductor film. Therefore, silicon or carbon contained in an oxide semiconductor film makes it n-type. Thus, the concentration of silicon contained in oxide semiconductor films and the concentration of carbon contained in oxide semiconductor films are each less than or equal to $3\times10^{18}/cm^3$, preferably less than or equal to $3\times10^{17}/cm^3$. It is particularly preferable to employ a structure where the first oxide semiconductor film 199a and the third oxide semiconductor film 199c sandwich or surround the second oxide semiconductor film 199b serving as a carrier path so that a large number of Group 14 elements do not enter the second oxide semiconductor film 199b. That is, the first oxide semiconductor film 199a and the third oxide semiconductor film 199c can also be called barrier films which prevent Group 14 elements such as silicon and carbon from entering the second oxide semiconductor film 199b.

For example, the first oxide semiconductor film 199a may contain In, Ga, and Zn at an atomic ratio of 1:3:2, the second oxide semiconductor film 199b may contain In, Ga, and Zn at an atomic ratio of 3:1:2, and the third oxide semiconductor film 199c may contain In, Ga, and Zn at an atomic ratio of 1:1:1. Note that the third oxide semiconductor film 199c can be formed by a sputtering method using an oxide target containing In, Ga, and Zn at an atomic ratio of 1:1:1.

Alternatively, a three-layer structure may be employed in which the first oxide semiconductor film 199a contains In, Ga, and Zn at an atomic ratio of 1:3:2, the second oxide semiconductor film 199b contains In, Ga, and Zn at an atomic ratio of 1:1:1 or 1:3:2, and the third oxide semiconductor film 199c contains In, Ga, and Zn at an atomic ratio of 1:3:2.

Since the constituent elements of the first oxide semiconductor film 199a, the second oxide semiconductor film 199b, and the third oxide semiconductor film 199c are the same, the second oxide semiconductor film 199b has fewer defect states (trap levels) at the interface with the first oxide semiconductor film 199a. Specifically, the defect states (trap levels) are fewer than those at the interface between the gate insulating film 127 and the first oxide semiconductor film 199a. For this reason, when the oxide semiconductor films are stacked in the above manner, the amount of change of the threshold voltage of a transistor due to change over time or a reliability test can be reduced.

Further, when materials of the first oxide semiconductor film 199a, the second oxide semiconductor film 199b, and the third oxide semiconductor film 199c are selected as appropriate so that a well structure is formed in which the conduction band of the second oxide semiconductor film 199b is deeper from the vacuum level than the conduction bands of the first oxide semiconductor film 199a and the third oxide semiconductor film 199c, the field-effect mobility of the transistor can be increased and the amount of change of the threshold voltage of the transistor due to change over time or a reliability test can be reduced.

Further, the first oxide semiconductor film 199a, the second oxide semiconductor film 199b, and the third oxide semiconductor film 199c may be formed using an oxide semiconductors having different crystallinity. That is, the oxide semiconductor film may be formed using a combination of any of a single crystal oxide semiconductor, a polycrystalline oxide semiconductor, an amorphous oxide semiconductor, and a CAAC-OS, as appropriate. When an amorphous oxide semiconductor is applied to any one of the first oxide semiconductor film 199a, the second oxide semiconductor film 199b, and the third oxide semiconductor film 199c, internal stress or external stress of the oxide semiconductor film can be relieved, fluctuation in characteristics of the transistors can be reduced, and the amount of change of the threshold voltage of the transistor due to change over time or a reliability test can be reduced.

At least the second oxide semiconductor film 199b, which can serve as a channel formation region, is preferably a CAAC-OS film. An oxide semiconductor film on the back channel side, in this embodiment, the third oxide semiconductor film 199c is preferably an amorphous oxide semiconductor film or a CAAC-OS film. With such a structure, the amount of change of the threshold voltage of a transistor due to change over time or a reliability test can be reduced.

Note that the structure and the like described in this embodiment can be used as appropriate in combination with any of the structures and the like in the other embodiments.

Embodiment 5

A semiconductor device (also referred to as a display device) having a display function can be fabricated using the transistor and the capacitor examples of which are shown in the above embodiments. Moreover, some or all of driver circuits which include the transistor can be formed over a substrate where a pixel portion is formed, whereby a system-on-panel can be obtained. In this embodiment, an example of a display device using the transistor examples of which are shown in the above embodiments is described with reference to FIGS. 19A to 19C, FIG. 20, and FIGS. 21A to 21C. FIG. 20 are cross-sectional views illustrating cross-sectional structures taken along dashed-dotted line M-N in FIG. 19B. Note that in FIG. 20, only part of the structure of a pixel portion is illustrated.

Figure 19A:
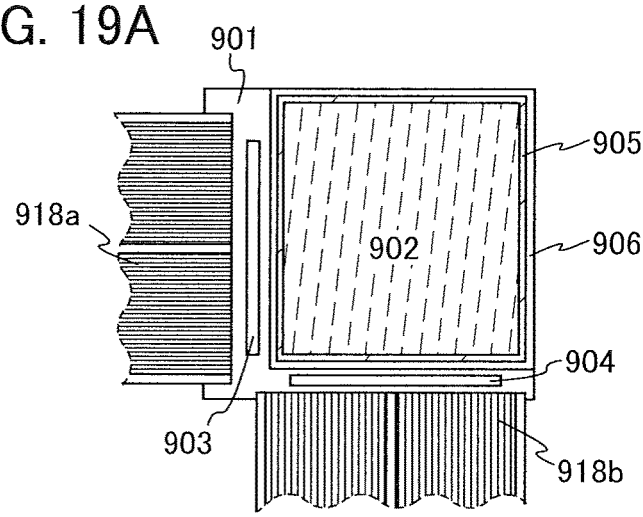
FIGS. 19A to 19C are top views illustrating a semiconductor device that is an embodiment of the present invention.
Figure 20:
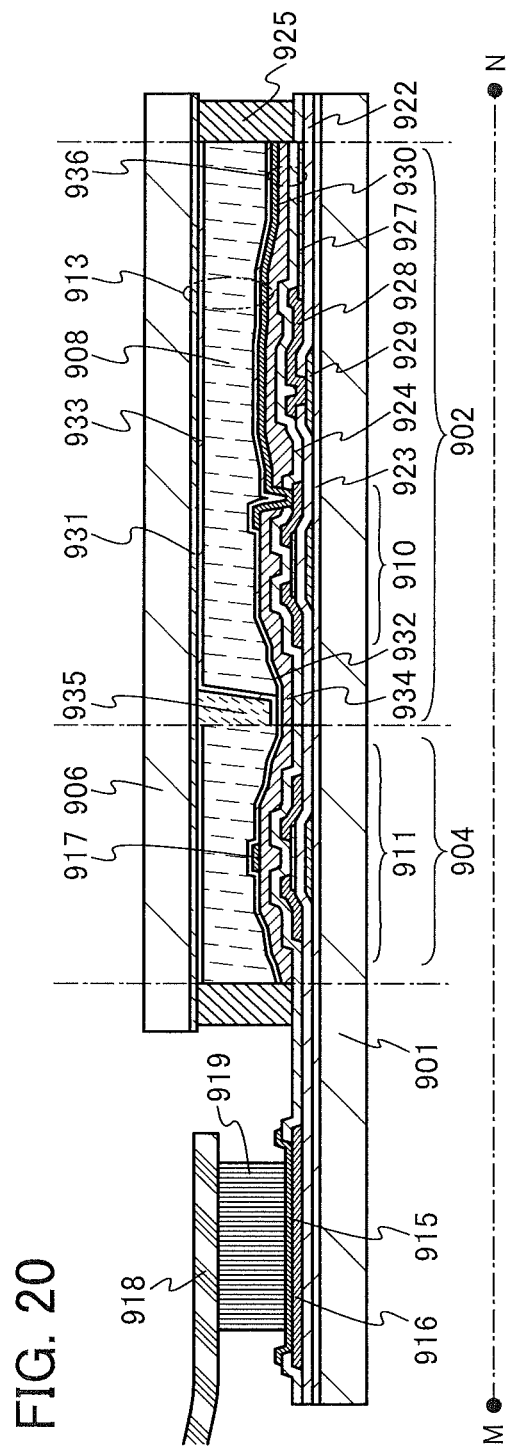
FIG. 20 is a cross-sectional view of a semiconductor device that is an embodiment of the present invention.

In FIG. 19A, a sealant 905 is provided so as to surround a pixel portion 902 provided over a first substrate 901, and the pixel portion 902 is sealed with a second substrate 906. In FIG. 19A, a signal line driver circuit 903 and a scan line driver circuit 904 are each formed using a single crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from flexible printed circuits (FPCs) 918a and 918b.

Figure 19B:
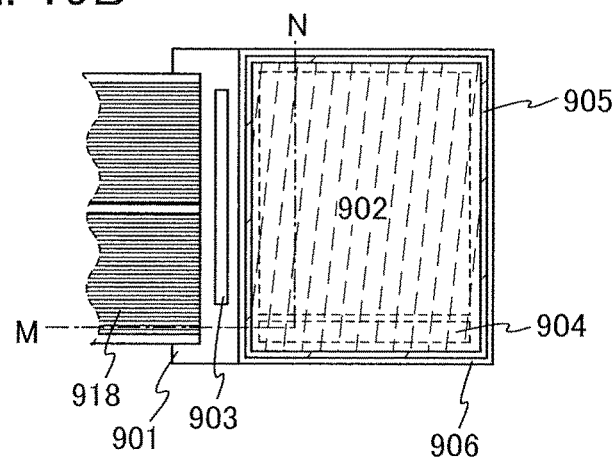
Figure 19C:
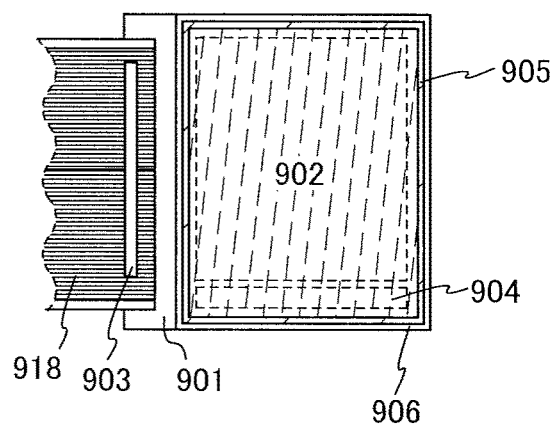

In FIGS. 19B and 19C, the sealant 905 is provided so as to surround the pixel portion 902 and the scan line driver circuit 904 which are provided over the first substrate 901. The second substrate 906 is provided over the pixel portion 902 and the scan line driver circuit 904. Thus, the pixel portion 902 and the scan line driver circuit 904 are sealed together with a display element by the first substrate 901, the sealant 905, and the second substrate 906. In FIGS. 19B and 19C, a signal line driver circuit 903 which is formed using a single crystal semiconductor or a polycrystalline semiconductor over a substrate separately prepared is mounted in a region different from the region surrounded by the sealant 905 over the first substrate 901. In FIGS. 19B and 19C, various signals and potentials are supplied to the signal line driver circuit 903, the scan line driver circuit 904, and the pixel portion 902 from an FPC 918.

Although FIGS. 19B and 19C each illustrate an example in which the signal line driver circuit 903 is formed separately and mounted on the first substrate 901, an embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be employed. FIG. 19A illustrates an example in which the signal line driver circuit 903 and the scan line driver circuit 904 are mounted by a COG method. FIG. 19B illustrates an example in which the signal line driver circuit 903 is mounted by a COG method. FIG. 19C illustrates an example in which the signal line driver circuit 903 is mounted by a TAB method.

The display device includes in its category a panel in which a display element is sealed and a module in which an IC including a controller or the like is mounted on the panel.

A display device in this specification refers to an image display device or a display device. The display device may serve as a light source (including a lighting device). Further, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in the above embodiments can be applied.

As the display element provided in the display device, a liquid crystal element (also referred to as a liquid crystal display element) or a light-emitting element (also referred to as a light-emitting display element) can be used. A light-emitting element includes, in its scope, an element whose luminance is controlled by current or voltage, and specifically includes an inorganic electroluminescent (EL) element, an organic EL element, and the like. Further, a display medium whose contrast is changed by an electric effect, such as electronic ink, can be used. An example of a liquid crystal display device using a liquid crystal element as the display element is illustrated in FIG. 20.

The liquid crystal display device illustrated in FIG. 20 is a liquid crystal display device of a vertical electric field mode. A liquid crystal display device includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930, and the terminal electrode 916 is formed using the same conductive film as a source electrode and a drain electrode of each of a transistor 910 and a transistor 911.

Each of the pixel portion 902 and the scan line driver circuit 904 which are provided over the first substrate 901 includes a plurality of transistors. The transistor 910 included in the pixel portion 902 and the transistor 911 included in the scan line driver circuit 904 are illustrated in FIG. 20. An insulating film 924 corresponding to the insulating films 129, 131, and 132 described in Embodiment 1 is provided over the transistors 910 and 911. Further, the insulating film 934 is provided over the insulating film 924 corresponding to the insulating film 137 described in Embodiment 1. Note that an insulating film 923 is an insulating film serving, as a base film.

In this embodiment, any of the transistors provided in the pixel described in Embodiments 1 to 3 can be applied to the transistor 910. Further, any of the transistors described in Embodiments 1 to 3, which is provided in the scan line driver circuit, can be applied to the transistor 911. A capacitor 936 is formed using an oxide semiconductor film 927, the insulating films 924 and 934, and the first electrode 930. The oxide semiconductor film 927 is electrically connected to a capacitor line 929 through an electrode 928. The electrode 928 is formed using the same material and steps as the source electrode and the drain electrode of each of the transistors 910 and 911. The capacitor line 929 is formed using the same material and steps as a gate electrode of each of the transistors 910 and 911. Although the capacitor described in Embodiment 1 is illustrated as the capacitor 936 here, any of the capacitors in the other embodiments may be used as appropriate.

In the display panel, the transistor 910 included in the pixel portion 902 is electrically connected to a display element. There is no particular limitation on the kind of the display element as long as display can be performed, and various kinds of display elements can be used.

A liquid crystal element 913 which is a display element includes the first electrode 930, a second electrode 931, and a liquid crystal layer 908. Note that an insulating film 932 and an insulating film 933 which serve as an alignment film are provided so that the liquid crystal layer 908 is provided therebetween. The second electrode 931 is provided on the second substrate 906 side. The second electrode 931 overlaps with the first electrode 930 with the liquid crystal layer 908 provided therebetween.

The first electrode and the second electrode (each of which are also referred to as a pixel electrode, a common electrode, a counter electrode, or the like) for applying voltage to the display element can have light-transmitting properties or light-reflecting properties, which depends on the direction in which light is extracted, the position where the electrodes are provided, and the pattern structure of the electrodes.

The first electrode 930 and the second electrode 931 can be formed using, as appropriate, a material similar to that of the pixel electrode 121 of Embodiment 1.

A spacer 935 is a columnar spacer obtained by selective etching of an insulating film and is provided in order to control the distance between the first electrode 930 and the second electrode 931 (a cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Some examples are given as a vertical alignment mode.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed is used for the liquid crystal layer in order to improve the temperature range. Note that the alignment film is formed using an organic resin containing hydrogen, water, or the like, which might degrade the electrical characteristics of the transistor in the semiconductor device that is an embodiment of the present invention. In view of the above, the use of liquid crystal which exhibits a blue phase for the liquid crystal layer enables fabrication of the semiconductor device that is an embodiment of the present invention without an organic resin, so that the semiconductor device can be highly reliable.

The first substrate 901 and the second substrate 906 are fixed in place by a sealant 925. As the sealant 925, an organic resin such as a thermosetting resin or a photocurable resin can be used. In addition, the sealant 925 is in contact with the insulating film 924. Note that the sealant 925 corresponds to the sealant 905 in FIGS. 19A to 19C.

The sealant 925 is provided over the insulating film 924. The insulating film 934 is provided on the inner side of the sealant 925. The uppermost layer of the insulating film 924 is a nitride insulating film, and can suppress entry of impurities such as hydrogen and water from the outside. In contrast, the insulating film 934 has a high moisture permeability. Thus, the insulating film 934 is provided on the inner side of the sealant 925, and the inner side of the sealant 925 is provided over the insulating film 924, so that entry of impurities such as hydrogen and water from the outside can be suppressed, and thus variations in the electrical characteristics of the transistors 910 and 911 can be suppressed.

In the liquid crystal display device, a black matrix (a light-blocking film); an optical member (an optical substrate) such as a polarizing member, a retardation member, or an anti-reflection member; and the like are provided as appropriate. For example, circular polarization may be obtained by using a polarizing substrate and a retardation substrate. In addition, a backlight, a side light, or the like may be used as a light source.

Since the transistor is easily broken owing to static electricity or the like, a protective circuit for protecting the driver circuit is preferably provided. The protection circuit is preferably formed using a nonlinear element.

Figure 21A:
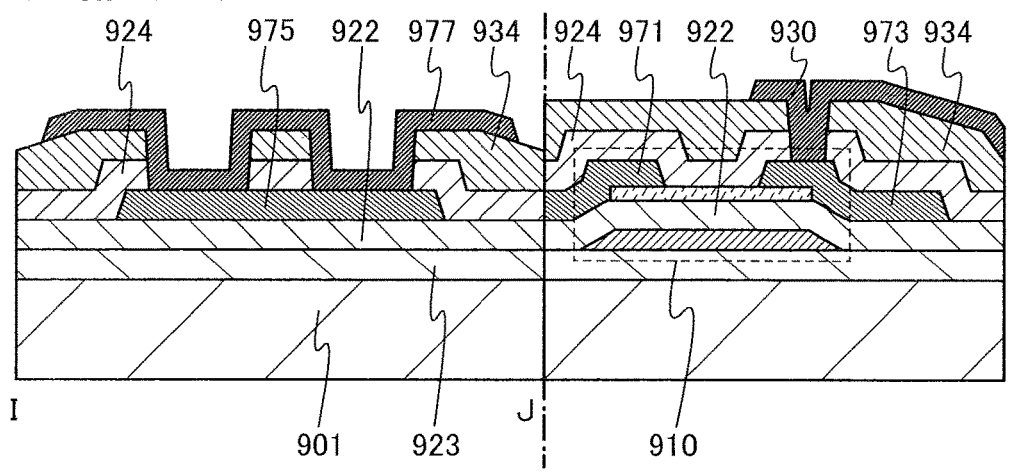
FIGS. 21A to 21C are cross-sectional views and a top view illustrating a semiconductor device that is an embodiment of the present invention.
Figure 21B:
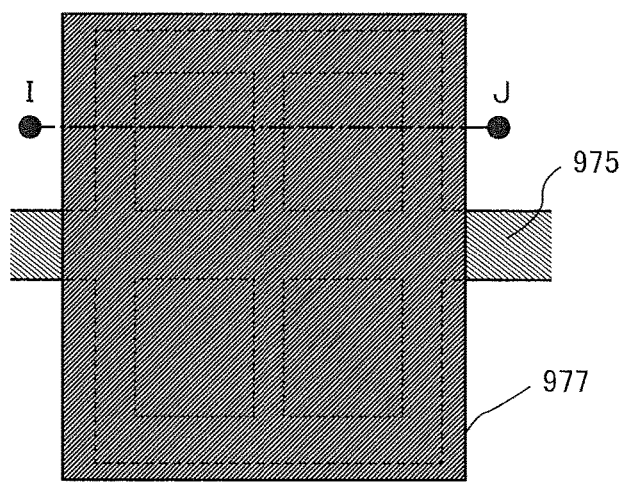
Figure 21C:
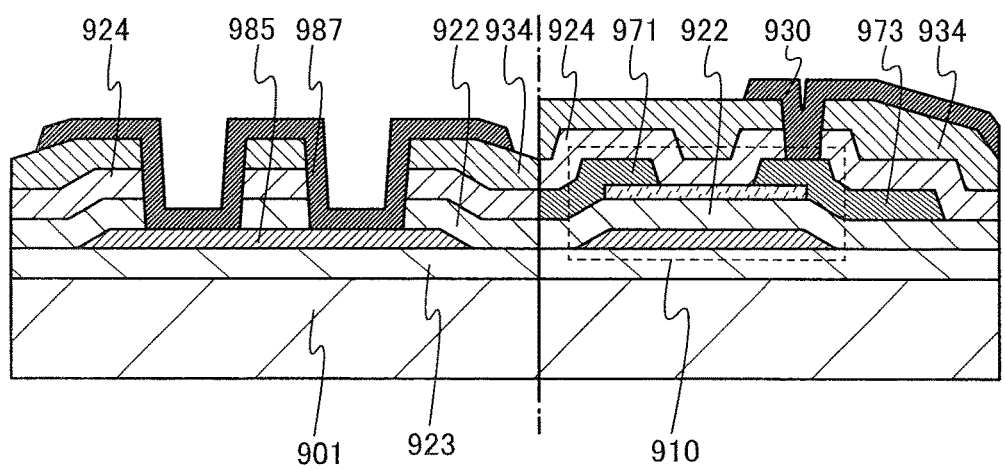

FIGS. 21A to 21C illustrate an example of the liquid crystal display device in FIG. 20 in which a common connection portion (pad portion) for being electrically connected to the second electrode 931 provided on the substrate 906 is formed over the substrate 901.

The common connection portion is provided in a position overlapping with the sealant for bonding the substrate 901 and the substrate 906, and is electrically connected to the second electrode 931 through conductive particles contained in the sealant. Alternatively, the common connection portion is provided in a position not overlapping with the sealant (except for the pixel portion) and a paste including conductive particles is provided separately from the sealant so as to overlap with the common connection portion, whereby the common connection portion is electrically connected to the second electrode 931.

FIG. 21A is a cross-sectional view of the common connection portion taken along line I-J in the top view in FIG. 21B.

A common potential line 975 is provided over a gate insulating film 922 and is formed using the same material and through the same steps as a source electrode 971 or a drain electrode 973 of the transistor 910 illustrated in FIGS. 21A to 21C.

Further, the common potential line 975 is covered with the insulating films 924 and 934, and the insulating films 924 and 934 has a plurality of openings at a position overlapping with the common potential line 975. These openings are formed through the same steps as a contact hole which connects the first electrode 930 and one of the source electrode 971 and the drain electrode 973 of the transistor 910.

Further, the common potential line 975 is connected to a common electrode 977 through the openings. The common electrode 977 is provided over the insulating film 934 and is formed using the same material and through the same steps as the connection terminal electrode 915 and the first electrode 930 in the pixel portion.

In this manner, the common connection portion can be formed through the same manufacturing process as the switching element in the pixel portion 902.

The common electrode 977 is an electrode in contact with the conductive particles contained in the sealant, and is electrically connected to the second electrode 931 of the second substrate 906.

Alternatively, as illustrated in FIG. 21C, a common potential line 985 may be formed using the same material and through the same steps as the gate electrode of the transistor 910.

In the common connection portion illustrated in FIG. 21C, the common potential line 985 is provided under the gate insulating films 922, 924, and 934; and the gate insulating films 922, 924, and 934 have a plurality of openings at a position overlapping with the common potential line 985. These openings are formed by etching the insulating f films 924 and 934 through the same steps as a contact hole which connects the first electrode 930 and one of the source electrode 971 and the drain electrode 973 of the transistor 910, and then by further selectively etching the gate insulating film 922.

Further, the common potential line 985 is connected to a common electrode 987 through the openings. The common electrode 987 is provided over the insulating film 924 and is formed using the same material and through the same steps as the connection terminal electrode 915 and the first electrode 930 in the pixel portion.

As described above, the use of the transistor and capacitor described in the above embodiment allows fabrication of a semiconductor device including the capacitor whose charge capacity is increased while improving the aperture ratio. Accordingly, the semiconductor device can have excellent display quality.

Further, oxygen vacancies and impurities such as hydrogen in the semiconductor film formed using an oxide semiconductor included in the transistor, which is a semiconductor film included in the transistor, are reduced, so that the semiconductor device that is an embodiment of the present invention has favorable electrical characteristics.

Note that the structures and the like described in this embodiment can be combined as appropriate with any of the structures and the like described in the other embodiments and example.

Embodiment 6

The semiconductor device that is an embodiment of the present invention can be applied to any of a variety of electronic devices (including game machines). Examples of electronic devices include television sets (also referred to as televisions or television receivers), monitors of computers, cameras such as digital cameras or digital video cameras, digital photo frames, mobile phones, portable game consoles, portable information terminals, audio reproducing devices, game machines (e.g., pachinko machines or slot machines), housings of game machines, and the like. Examples of such electronic devices are illustrated in FIGS. 22A to 22C.

Figure 22A:
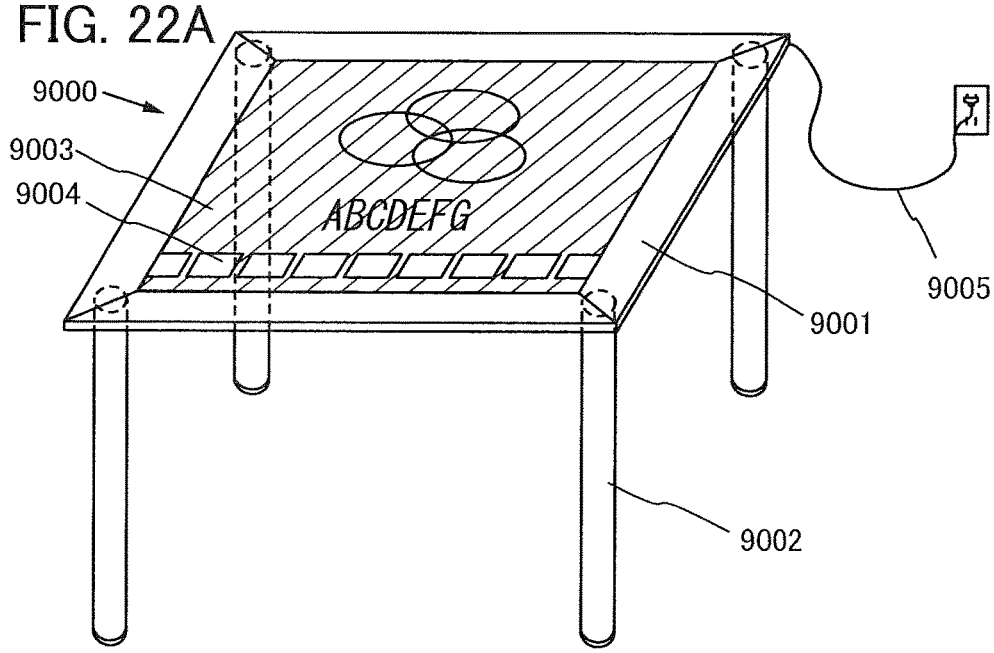
FIGS. 22A to 22C illustrate electronic devices in each of which a semiconductor device that is an embodiment of the present invention is used.
Figure 22B:
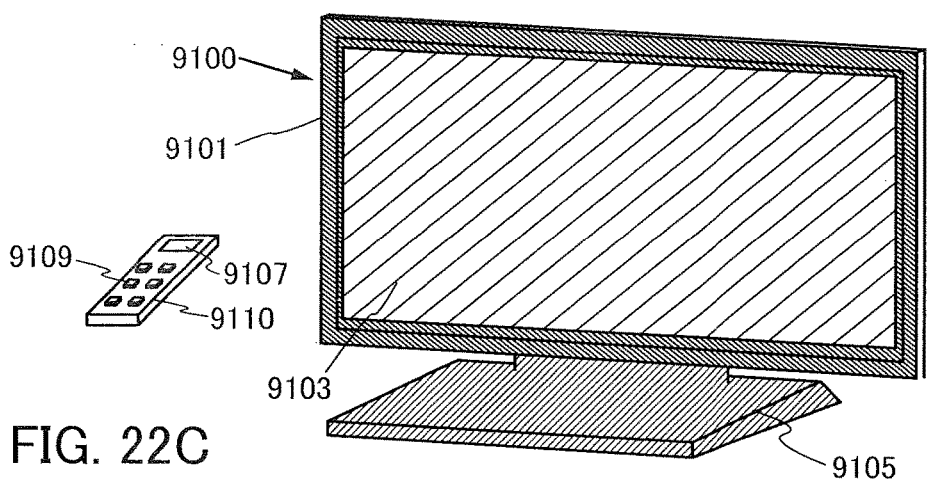
Figure 22C:
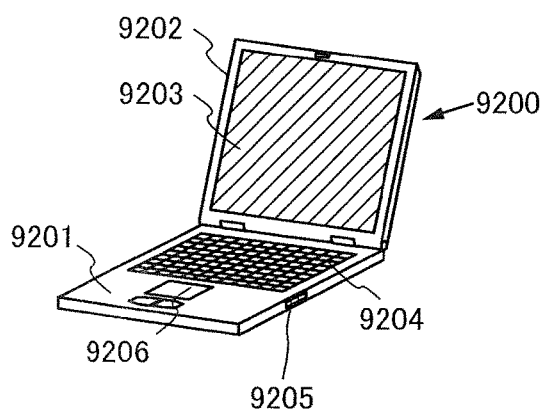

FIG. 22A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of the above embodiments can be used for the display portion 9003. Thus, the display quality of the display portion 9003 can be improved.

The display portion 9003 has a touch-input function. When a user touches displayed buttons 9004 which are displayed on the display portion 9003 of the table 9000 with his/her finger or the like, the user can carry out operation of the screen and input of information. Further, when the table 9000 may be made to communicate with home appliances or control the home appliances, the table 9000 may serve as a control device which controls the home appliances by operation on the screen. For example, with the use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 22B illustrates a television set 9100. In the television set 9100, a display portion 9103 is incorporated in a housing 9101 and an image can be displayed on the display portion 9103. Note that here, the housing 9101 is supported by a stand 9105.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Further, the remote controller 9110 may be provided with a display portion 9107 for displaying data output from the remote controller 9110.

The television set 9100 illustrated in FIG. 22B is provided with a receiver, a modem, and the like. With the use of the receiver, the television set 9100 can receive general TV broadcasts. Moreover, when the television set 9100 is connected to a communication network with or without wires via the modem, one-way (from a sender to a receiver) or two-way (between a sender and a receiver or between receivers) information communication can be performed.

The semiconductor device described in any of the above embodiments can be used for the display portions 9103 and 9107. Thus, the display quality of the television set can be improved.

FIG. 22C illustrates a computer 9200, which includes a main body 9201, a housing 9202, a display portion 9203, a keyboard 9204, an external connection port 9205, a pointing device 9206, and the like.

The semiconductor device described in any of the above embodiments can be used for the display portion 9203. Thus, the display quality of the computer 9200 can be improved.

Figure 23A:
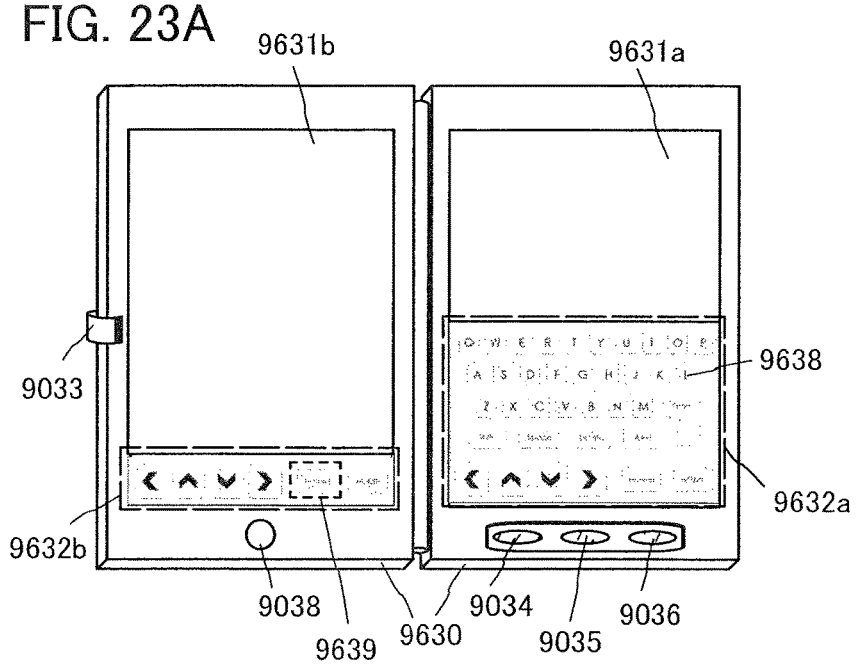
FIGS. 23A to 23C illustrate an electronic device in which a semiconductor device that is an embodiment of the present invention is used.
Figure 23B:
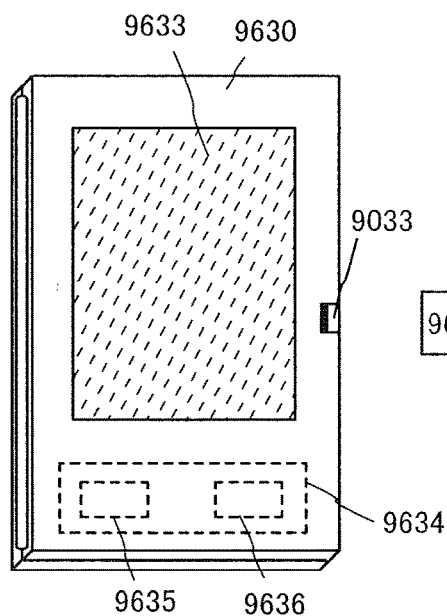

FIGS. 23A and 23B illustrate a foldable tablet terminal. In FIG. 23A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

The semiconductor device described in any of the above embodiments can be used for the display portion 9631a and the display portion 9631b. Thus, the display quality of the tablet terminal can be improved.

Part of the display portion 9631a can be a touch panel region 9632a, and data can be input by touching operation keys 9638 that are displayed. Note that FIG. 23A shows, as an example, that half of the area of the display portion 9631a has only a display function, and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

In the display portion 9631b, as in the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The display-mode switching button 9034 allows switching between a portrait mode and a landscape mode, and between monochrome display and color display, for example. With the power-saving-mode switching button 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 23A, an embodiment of the present invention is not limited to this example. The display portion 9631a and the display portion 9631b may have different areas or different display quality. For example, one of them may be a display panel that can display higher-definition images than the other.

FIG. 23B illustrates the tablet terminal folded, which includes the housing 9630, a solar battery 9633, and a charge and discharge control circuit 9634. Note that FIG. 23B illustrates an example in which the charge and discharge control circuit 9634 includes a battery 9635 and a DCDC converter 9636.

Since the tablet terminal can be foldable, the housing 9630 can be closed when the tablet terminal is not in use. Thus, the display portions 9631a and 9631b can be protected, whereby a tablet terminal with high endurance and high reliability for long-term use can be provided.

The tablet terminal illustrated in FIGS. 23A and 23B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar battery 9633, which is attached to the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently. When a lithium ion battery is used as the battery 9635, there is an advantage of downsizing or the like.

Figure 23C:
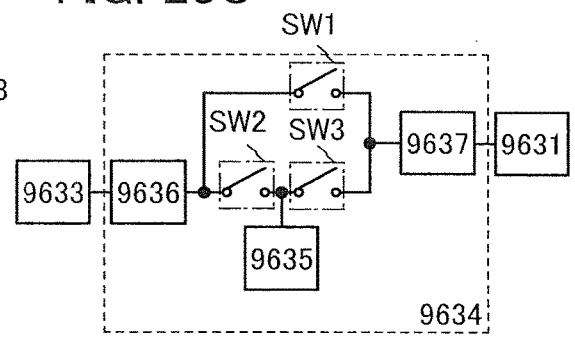

The structure and operation of the charge and discharge control circuit 9634 illustrated in FIG. 23B are described with reference to a block diagram of FIG. 23C. The solar battery 9633, the battery 9635, the DCDC converter 9636, a converter 9637, switches SW1, SW2, and SW3, and the display portion 9631 are illustrated in FIG. 23C, and the battery 9635, the DCDC converter 9636, the converter 9637, and the switches SW1 to SW3 correspond to the charge and discharge control circuit 9634 illustrated in FIG. 23B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and the switch SW2 is turned on so that charge of the battery 9635 may be performed.

Here, the solar battery 9633 is illustrated as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

Note that the structure and the like described in this embodiment can be used as appropriate in combination with any of the structures and the like in the other embodiments.

Example 1

In this example, the resistances of an oxide semiconductor film and a multilayer film are described with reference to FIGS. 24A to 24D and FIG. 25.

First, the structure of a sample is described with reference to FIGS. 24A to 24D.

Figure 24A:
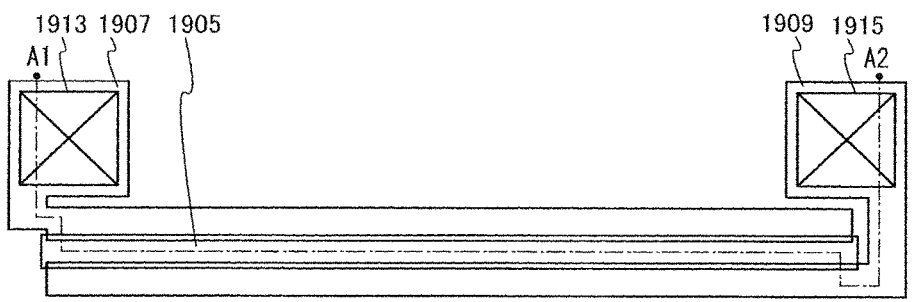
FIGS. 24A to 24D each illustrate a structure of a sample.
Figure 24B:
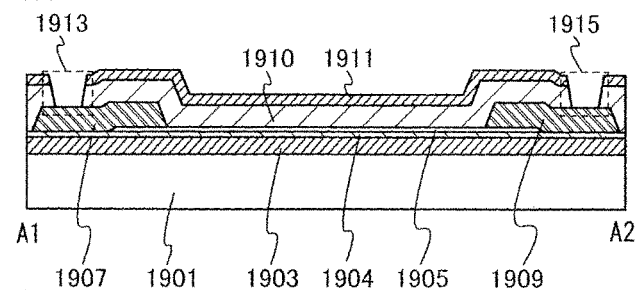
Figure 24C:
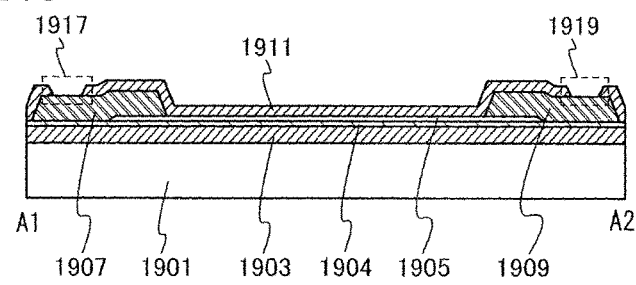
Figure 24D:
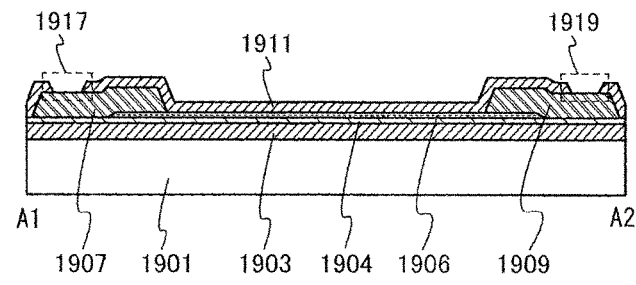

FIG. 24A is a top view of a sample 1, a sample 2, a sample 3, and a sample 4, and FIGS. 24B to 24D are cross-sectional views taken along dashed-and-dotted line A1-A2 of FIG. 24A. Note that the top views of the samples 1 to 4 are the same, and the cross-sectional views thereof are different because the stacked-layer structures of the cross sections are different. The cross-sectional views of the sample 1, the sample 2, and the samples 3 and 4 are illustrated in FIG. 24B, FIG. 24C, and FIG. 24D, respectively.

As for the sample 1, an insulating film 1903 is formed over a glass substrate 1901, an insulating film 1904 is formed over the insulating film 1903, and an oxide semiconductor film 1905 is formed over the insulating film 1904. The both ends of the oxide semiconductor film 1905 are covered with a conductive film 1907 and a conductive film 1909 each serving as an electrode, and the oxide semiconductor film 1905 and the conductive films 1907 and 1909 are covered with an insulating film 1910 and an insulating film 1911. Note that openings 1913 and 1915 are provided in the insulating films 1910 and 1911, and the conductive film 1907 and the conductive film 1909 are exposed through the opening 1913 and the opening 1915, respectively.

As for the sample 2, the insulating film 1903 is formed over the glass substrate 1901, the insulating film 1904 is formed over the insulating film 1903, and the oxide semiconductor film 1905 is formed over the insulating film 1904. The both ends of the oxide semiconductor film 1905 are covered with the conductive films 1907 and 1909 each serving as an electrode, and the oxide semiconductor film 1905 and the conductive films 1907 and 1909 are covered with the insulating film 1911. Note that an opening 1917 and an opening 1919 are provided in the insulating film 1911, and the conductive film 1907 and the conductive film 1909 are exposed through the opening 1917 and the opening 1919, respectively.

In each of the samples 3 and 4, the insulating film 1903 is formed over the glass substrate 1901, the insulating film 1904 is formed over the insulating film 1903, and a multilayer film 1906 is formed over the insulating film 1904. The both ends of the multilayer film 1906 are covered with the conductive films 1907 and 1909 each serving as an electrode, and the multilayer film 1906 and the conductive films 1907 and 1909 are covered with the insulating film 1911. Note that the openings 1917 and 1919 are provided in the insulating film 1911, and the conductive film 1907 and the conductive film 1909 are exposed through the opening 1917 and the opening 1919, respectively.

As described above, the structures of the insulating films in contact with the top surface of the oxide semiconductor film 1905 or the multilayer film 1906 are different in the samples 1 to 4. In the sample 1, the oxide semiconductor film 1905 and the insulating film 1910 are in contact with each other; in the sample 2, the oxide semiconductor film 1905 and the insulating film 1911 are in contact with each other; and in the samples 3 and 4, the multilayer film 1906 and the insulating film 1911 are in contact with each other.

Next, fabrication methods of the samples are described.

First, a fabrication method of the sample 1 is described.

A 400-nm-thick silicon nitride film was formed as the insulating film 1903 over the glass substrate 1901 by a plasma CVD method.

Next, a 50-nm-thick silicon oxynitride film was formed as the insulating film 1904 over the insulating film 1903 by a plasma CVD method.

Next, a 35-nm-thick IGZO film was formed as the oxide semiconductor film 1905 over the insulating film 1904 by a sputtering method using a metal oxide target containing In, Ga, and Zn at an atomic ratio of 1:1:1. Then, etching treatment was performed on the IGZO film with a mask formed through a photolithography process, so that the oxide semiconductor film 1905 was formed.

Next, the conductive films 1907 and 1909 were formed over the insulating film 1903 and the oxide semiconductor film 1905 in such a manner that a 50-nm-thick tungsten film, a 400-nm-thick aluminum film, and a 100-nm-thick titanium film were stacked in this order by a sputtering method, and were then subjected to etching treatment with a mask formed through a photolithography process.

Next, a 450-nm-thick silicon oxynitride film was formed as the insulating film 1910 over the insulating film 1904, the oxide semiconductor film 1905, the conductive film 1907, and the conductive film 1909 by a plasma CVD method, and then heat treatment was performed at 350° C. under a mixed atmosphere of nitrogen and oxygen for one hour.

Next, a 50-nm-thick silicon nitride film was formed as the insulating film 1911 over the insulating film 1910 by a plasma CVD method.

Next, a mask was formed over the insulating film 1911 through a photolithography process and then etching treatment was performed on the insulating film 1911, so that the openings 1913 and 1915 were formed in the insulating films 1910 and 1911.

Through the above process, the sample 1 was fabricated.

Next, a fabrication method of the sample 2 is described.

A 450-nm-thick silicon oxynitride film was formed as the insulating film 1910 over the insulating film 1903, the oxide semiconductor film 1905, the conductive film 1907, and the conductive film 1909 of the sample 1 by a plasma CVD method, and then heat treatment was performed at 350° C. under a mixed atmosphere of nitrogen and oxygen for one hour. After that, the insulating film 1910 was removed.

Next, a 50-nm-thick silicon nitride film was formed as the insulating film 1911 over the insulating film 1904, the oxide semiconductor film 1905, the conductive film 1907, and the conductive film 1909 by a plasma CVD method.

Next, a mask was formed over the insulating film 1911 through a photolithography process and then etching treatment was performed on the insulating film 1911, so that the openings 1917 and 1919 were formed in the insulating film 1911.

Through the above process, the sample 2 was fabricated.

Next, a fabrication method of the sample 3 is described.

As for the sample 3, the only difference with the sample 2 is that the multilayer film 1906 was used instead of the oxide semiconductor film 1905 of the sample 2. The multilayer film 1906 was formed over the insulating film 1904 in such a manner that a 10-nm-thick IGZO film with a metal oxide target containing In, Ga, and Zn at an atomic ratio of 1:3:2, a 10-nm-thick IGZO film with a metal oxide target containing In, Ga, and Zn at an atomic ratio of 1:1:1, and then a 10-nm-thick IGZO film with a metal oxide target containing In, Ga, and Zn at an atomic ratio of 1:3:2 were successively formed by a sputtering method. Then, etching treatment was performed on the stacked IGZO films with a mask formed through a photolithography process, so that the multilayer film 1906 was formed.

Through the above process, the sample 3 was fabricated.

Next, a fabrication method of the sample 4 is described.

As for the sample 4, the only difference with the sample 2 is that the multilayer film 1906 was used instead of the oxide semiconductor film 1905 of the sample 2. The thickness of the IGZO film included in the multilayer film 1906 of the sample 4 is different from that of the sample 3. The multilayer film 1906 was formed over the insulating film 1904 in such a manner that a 20-nm-thick IGZO film with a metal oxide target containing In, Ga, and Zn at an atomic ratio of 1:3:2, a 15-nm-thick IGZO film with a metal oxide target containing In, Ga, and Zn at an atomic ratio of 1:1:1, and then a 10-nm-thick IGZO film using a metal oxide target containing In, Ga, and Zn at an atomic ratio of 1:3:2 were successively formed by a sputtering method. Then, etching treatment was performed on the stacked IGZO films with a mask formed through a photolithography process, so that the multilayer film 1906 was formed.

Through the above process, the sample 4 was fabricated.

Next, the sheet resistance of the oxide semiconductor film 1905 provided in each of the samples 1 and 2 and the sheet resistance of the multilayer film 1906 provided in each of the samples 3 and 4 were measured. In the sample 1, a probe is made contact with the openings 1913 and 1915 to measure the sheet resistance of the oxide semiconductor film 1905. In each of the samples 2 to 4, a probe is made contact with the openings 1917 and 1919 to measure the sheet resistance of the oxide semiconductor film 1905 or the multilayer film 1906. Note that in the oxide semiconductor film 1905 in each of the samples 1 and 2 and the multilayer film 1906 in each of the samples 3 and 4, the widths of the conductive films 1907 and 1909 facing each other were each 1 mm and the distance between the conductive films 1907 and 1909 was 10 μm. Further, in each of the samples 1 to 4, the potential of the conductive film 1907 was a ground potential, and 1 V was applied to the conductive film 1909.

Figure 25:
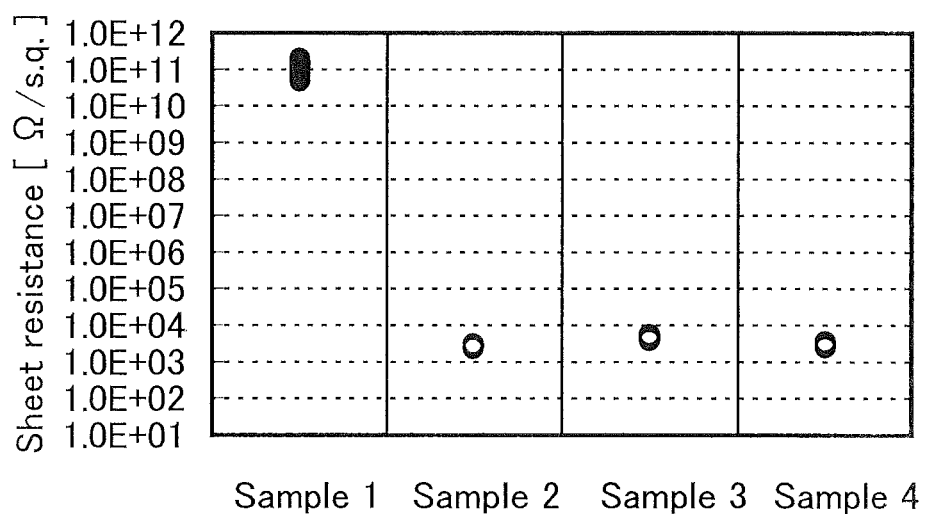
FIG. 25 is a graph showing sheet resistance.

FIG. 25 shows the sheet resistance of the samples 1 to 4.

The sheet resistance of the sample 1 was about $1 \times 10^{11}$ Ω/s.q. The sheet resistance of the sample 2 was about 2620 Ω/s.q. The sheet resistance of the sample 3 was 4410 Ω/s.q. The sheet resistance of the sample 4 was 2930 Ω/s.q.

In the above manner, the oxide semiconductor films 1905 and the multilayer films 1906 have different values of sheet resistance because the insulating films in contact with the oxide semiconductor film 1905 and the insulating films in contact with the multilayer film 1906 were different.

Note that when the above sheet resistances of the samples 1 to 4 were converted into resistivity, the resistivities of the sample 1, the sample 2, the sample 3, and the sample 4 were $3.9 \times 10^5$ Ωcm, $9.3 \times 10^{-3}$ Ωcm, $1.3 \times 10^{-2}$ Ωcm, and $1.3 \times 10^{-2}$ Ωcm, respectively.

In the sample 1, the silicon oxynitride film used as the insulating film 1910 was formed in contact with the top surface of the oxide semiconductor film 1905 and apart from the silicon nitride film used as the insulating film 1911. On the other hand, the silicon nitride film used as the insulating film 1911 was formed in contact with the top surface of the oxide semiconductor film 1905 in the sample 2 and was formed in contact with the top surface of the multilayer film 1906 in each of the samples 3 and 4. When the oxide semiconductor film 1905 or the multilayer film 1906 is thus provided in contact with the silicon nitride film used as the insulating film 1911, defects, typically oxygen vacancies are generated in the oxide semiconductor film 1905 or the multilayer film 1906, and hydrogen contained in the silicon nitride film is transferred to or diffused into the oxide semiconductor film 1905 or the multilayer film 1906. Accordingly, the conductivity of the oxide semiconductor film 1905 or the multilayer film 1906 is improved.

For example, in the case where an oxide semiconductor film is used for a channel formation region of a transistor, it is preferable to employ a structure in which a silicon oxynitride film is provided in contact with the oxide semiconductor film as shown in the sample 1. Further, as a light-transmitting conductive film used for an electrode of a capacitor, it is preferable to employ a structure in which a silicon nitride film is provided in contact with an oxide semiconductor film or a multilayer film as shown in the samples 2 to 4. With such a structure, even when an oxide semiconductor film or a multilayer film which is used for a channel formation region of a transistor and an oxide semiconductor film or a multilayer film which is used for an electrode of a capacitor are formed through the same process, the resistivity of the oxide semiconductor film and the resistivity of the multilayer film can be made different from each other.

Next, the sheet resistance values of the samples 2 and 3 which were preserved under a high-temperature high-humidity environment were measured. The conditions of the samples used here are described below. Note that here, the conditions are partly different from those of the samples 2 and 3. Therefore, samples which have the same structure as the samples 2 and 3 and which were formed under the different formation conditions are referred to as a sample 2a and a sample 3a.

First, a fabrication method of the sample 2a is described.

The insulating film 1903 and the insulating film 1904 were formed over the glass substrate 1901.

Next, a 35-nm-thick IGZO film was formed as the oxide semiconductor film 1905 over the insulating film 1904 by a sputtering method using a metal oxide target containing In, Ga, and Zn at an atomic ratio of 1:1:1. Then, etching treatment was performed on the IGZO film with a mask formed through a photolithography process and then heat treatment was performed at 350° C. or 450° C., so that the oxide semiconductor film 1905 was formed.

Next, the conductive film 1907 and the conductive film 1909 were formed over the insulating film 1903 and the oxide semiconductor film 1905 in such a manner that a 50-nm-thick titanium film and a 400-nm-thick copper film were stacked in this order by a sputtering method, and were then subjected to etching treatment with a mask formed through a photolithography process.

Next, a 450-nm-thick silicon oxynitride film was formed as the insulating film 1910 over the insulating film 1904, the oxide semiconductor film 1905, the conductive film 1907, and the conductive film 1909 by a plasma CVD method, and then heat treatment was performed at 350° C. under a mixed atmosphere of nitrogen and oxygen for one hour.

Next, a 50-nm-thick silicon nitride film was formed as the insulating film 1911 over the insulating film 1904, the oxide semiconductor film 1905, the conductive film 1907, and the conductive film 1909 by a plasma CVD method. Note that the film formation temperature of the silicon nitride film was 220° C. or 350° C.

Next, a mask is formed over the insulating film 1911 through a photolithography process and then etching treatment was performed on the insulating film 1911, so that the opening 1913 and 1915 were formed in the insulating films 1910 and 1911.

Through the above process, the sample 2a was fabricated.

Next, a fabrication method of the sample 3a is described.

As for the sample 3a, the only difference with the sample 2 is that the multilayer film 1906 was used instead of the oxide semiconductor film 1905 of the sample 2a. The multilayer film 1906 was formed over the insulating film 1904 in such a manner that a 10-nm-thick IGZO film with a metal oxide target containing In, Ga, and Zn at an atomic ratio of 1:1:1, and a 10-nm-thick IGZO film with a metal oxide target containing In, Ga, and Zn at an atomic ratio of 1:3:2 were successively formed by a sputtering method. Then, etching treatment was performed on the stacked IGZO films with a mask formed through a photolithography process and then heat treatment was performed at 350° C. or 450° C., so that the multilayer film 1906 was formed.

Through the above process, the sample 3a was fabricated.

Next, the sheet resistance of the oxide semiconductor film 1905 provided in the sample 2a and the sheet resistance of the multilayer film 1906 provided in the sample 3a were measured. In each of the samples 2a and 3a, a probe is made contact with the openings 1917 and 1919 to measure the sheet resistance of the oxide semiconductor film 1905 or the multilayer film 1906. Note that in the oxide semiconductor film 1905 in the sample 2a and the multilayer film 1906 in the sample 3a, the widths of the conductive films 1907 and 1909 facing each other were each 1.5 mm and the distance between the conductive films 1907 and 1909 was 10 μm. Further, in each of the samples 2a and 3a, the potential of the conductive film 1907 was a ground potential, and 1 V was applied to the conductive film 1909. The sheet resistance values of the samples 2a and 3a were measured after the samples 2a and 3a were preserved at 60° C. under an atmosphere with a humidity of 95% for 60 hours and 130 hours.

FIG. 29 shows the sheet resistance values of the samples 2a and 3a. Note that in FIG. 29, the film formation temperature of the silicon nitride film formed as the insulating film 1910 in each sample is 220° C. (a solid line) or 350° C. (a dashed line). In addition, black circle and triangle indicate the samples each subjected to heat treatment at 350° C. after the formation of the oxide semiconductor film 1905 or the multilayer film 1906, and white circle and triangle indicate the samples each subjected to heat treatment at 450° C. after the formation of the oxide semiconductor film 1905 or the multilayer film 1906. The circles indicate the samples including the oxide semiconductor film 1905, i.e. the sample 2a. The triangles indicate the samples including the multilayer film 1906, i.e. the sample 3a. Still, measurements results corresponding to the multilayer film 1906 subjected to a 350° C. thermal treatment, i.e. the sample 3a, are not plotted in the graph of FIG. 29.

FIG. 29 shows that the samples 2a and 3a had low sheet resistance values and satisfied a preferable sheet resistance value for an electrode of a capacitor, which is 0.2 Ω/s.q., and that the amount of change over time in the sheet resistance values of the samples 2a and 3a was small. As described above, the amount of change in the sheet resistance value of the oxide semiconductor film or the multilayer film in contact with the silicon nitride film is small under a high-temperature high-humidity environment; therefore, the oxide semiconductor film or the multilayer film can be used as a light-transmitting conductive film which is used for an electrode of a capacitor.

Next, the sheet resistance values of the samples 2a and 3a when the substrate temperature was 25° C., 60° C., or 150° C. were measured, and the measurement results are shown in FIG. 30. Note that here, as each of the samples 2a and 3a, a sample which includes the silicon nitride film formed as the insulating film 1910 at 220° C. and which was subjected to heat treatment at 350° C. after the formation of the oxide semiconductor film 1905 or the multilayer film 1906 was used. The black circles indicate measurement results regarding the sample 2a while the black triangles indicate measurements results regarding the sample 3a.

FIG. 30 shows that the sheet resistance value of the oxide semiconductor film 1905 or the multilayer film 1906 was not changed even when the substrate temperature was raised. In other words, the oxide semiconductor film or the multilayer film in contact with the silicon nitride film is a degenerated semiconductor. The amount of change in the sheet resistance value of the oxide semiconductor film or the multilayer film in contact with the silicon nitride film was small even when the substrate temperature was changed; therefore, the oxide semiconductor film or the multilayer film can be used as a light-transmitting conductive film which is used for an electrode of a capacitor.

Note that the structure described in this example can be used as appropriate in combination with any of the structures in the other embodiments and examples.

Example 2

In this example, analysis of impurities in an oxide semiconductor film and an insulating film formed over the oxide semiconductor film is described with reference to FIGS. 26A and 26B.

In this example, two kinds of samples (hereinafter a sample 5 and a sample 6) were formed as samples for impurity analysis.

First, a fabrication method of the sample 5 is described below.

As for the sample 5, an IGZO film was formed over a glass substrate and a silicon nitride film was formed thereover. After that, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Note that as for the IGZO film, a 100-nm-thick IGZO film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C.

In addition, as for the silicon nitride film, a 100-nm-thick silicon nitride film was formed by a plasma CVD method under the following conditions: the $SiH_4$ gas flow rate was 50 sccm, the $N_2$ gas flow rate was 5000 sccm, and the $NH_3$ gas flow rate was 100 sccm; the pressure was 100 Pa; the film formation power was 1000 W; and the substrate temperature was 220° C.

Next, a fabrication method of the sample 6 is described below.

An IGZO film was formed over a glass substrate and a silicon oxynitride film and a silicon nitride film were stacked thereover. After that, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Note that the film formation conditions of the IGZO film and the silicon nitride film were similar to those of the sample 5. In addition, as for the silicon oxynitride film, a 50-nm-thick silicon oxynitride film was formed by a plasma CVD method under the following conditions: the $SiH_4$ gas flow rate was 30 sccm and the $N_2O$ gas flow rate was 4000 sccm; the pressure was 40 Pa; the film formation power was 150 W; and the substrate temperature was 220° C. After that, a 400-nm-thick silicon oxynitride film was formed by a plasma CVD method under the following conditions: the $SiH_4$ gas flow rate was 160 sccm and the $N_2O$ gas flow rate was 4000 sccm; the pressure was 200 Pa; the film formation power was 1500 W; and the substrate temperature was 220° C.

Figure 26A:
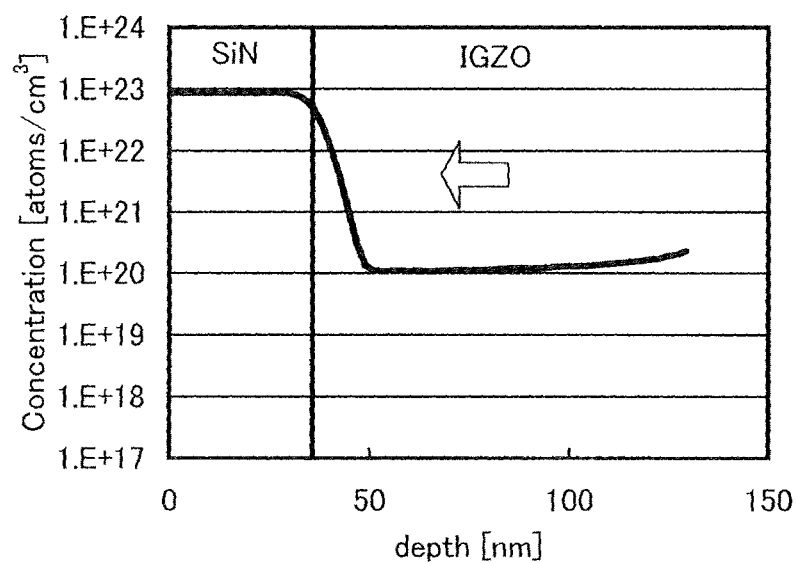
FIGS. 26A and 26B show results of SIMS measurement.
Figure 26B:
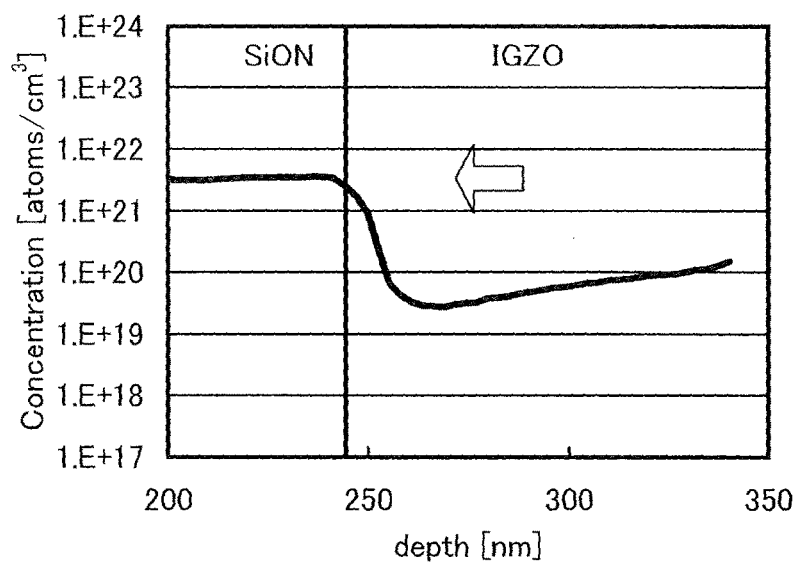

FIGS. 26A and 26B show the results of the impurity analysis of the samples 5 and 6.

Note that the impurity analysis was performed in the direction shown by the arrow in each of FIGS. 26A and 26B by secondary ion mass spectrometry (SIMS). That is, the measurement was performed from the glass substrate side.

FIG. 26A shows the concentration profile of hydrogen (H) which was obtained by measurement of the sample 5. FIG. 26B shows the concentration profile of hydrogen (H) which was obtained by measurement of the sample 6.

FIG. 26A shows that the concentration of hydrogen (H) in the IGZO film was $1.0 \times 10^{20}$ atoms/cm$^3$ and that the concentration of hydrogen (H) in the silicon nitride film was $1.0 \times 10^{23}$ atoms/cm$^3$. In addition, FIG. 26B shows that the concentration of hydrogen (H) in the IGZO film was $5.0 \times 10^{19}$ atoms/cm$^3$ and that the concentration of hydrogen (H) in the silicon oxynitride film was $3.0 \times 10^{21}$ atoms/cm$^3$.

It is known that it is difficult to obtain accurate data in the proximity of a surface of a sample or in the proximity of an interface between stacked films formed using different materials by the SIMS analysis in measurement principle. Thus, in the case where distributions of the concentrations of hydrogen (H) in the film in the thickness direction are analyzed by SIMS, an average value in a region where the film is provided, the value is not greatly changed, and an almost constant level of strength can be obtained is employed as the concentrations of hydrogen (H).

A difference between the IGZO films in the concentration of hydrogen (H) was found in this manner by changing the structure of the insulating film in contact with the IGZO film.

For example, in the case where any of the above IGZO films is formed in a channel formation region of a transistor, it is preferable to employ a structure in which a silicon oxynitride film is provided in contact with the IGZO film as shown in the sample 6. As a light-transmitting conductive film used for an electrode of a capacitor, it is preferable to employ a structure in which a silicon nitride film is provided in contact with the IGZO film as shown in the sample 5. With such a structure, even when an IGZO film which is used for a channel formation region of a transistor and an IGZO film which is used for an electrode of a capacitor are formed through the same process, the hydrogen concentrations of the IGZO films can be made different from each other.

Example 3

In this example, the amounts of defects in an oxide semiconductor film and a multilayer film are described with reference to FIGS. 27A to 27C and FIG. 28.

First, the structure of a sample is described.

A sample 7 includes a 35-nm-thick oxide semiconductor film formed over a quartz substrate and a 100-nm-thick nitride insulating film formed over the oxide semiconductor film.

A sample 8 and a sample 9 each include a 30-nm-thick multilayer film formed over a quartz substrate and a 100-nm-thick nitride insulating film formed over the multilayer film. Note that in the multilayer film of the sample 8, a 10-nm-thick first IGZO film, a 10-nm-thick second IGZO film, and a 10-nm-thick third IGZO film are stacked in this order. In the multilayer film of the sample 9, a 20-nm-thick first IGZO film, a 15-nm-thick second IGZO film, and a 10-nm-thick third IGZO film are stacked in this order. The samples 8 and 9 are different from the sample 7 in that the multilayer film is included instead of the oxide semiconductor film.

A sample 10 includes a 100-nm-thick oxide semiconductor film formed over a quartz substrate, a 250-nm-thick oxide insulating film formed over the oxide semiconductor film, and a 100-nm-thick nitride insulating film formed over the oxide insulating film. The sample 10 is different from the samples 7 to 9 in that the oxide semiconductor film is not in contact with the nitride insulating film but in contact with the oxide insulating film.

Next, fabrication methods of the samples are described.

First, a fabrication method of the sample 7 is described.

A 35-nm-thick IGZO film was formed as the oxide semiconductor film over the quartz substrate. As for the IGZO film, the 35-nm-thick IGZO film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C.

Next, as first heat treatment, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Next, a 100-nm-thick silicon nitride film was formed as the nitride insulating film over the oxide semiconductor film. As for the silicon nitride film, the 100-nm-thick silicon nitride film was formed by a plasma CVD method under the following conditions: the $SiH_4$ gas flow rate was 50 sccm, the $N_2$ gas flow rate was 5000 sccm, and the $NH_3$ gas flow rate was 100 sccm; the pressure was 100 Pa; the film formation power was 1000 W; and the substrate temperature was 350° C.

Next, as second heat treatment, heat treatment was performed at 250° C. under a nitrogen atmosphere for one hour.

Through the above process, the sample 7 was fabricated.

Next, a fabrication method of the sample 8 is described.

As for the sample 8, the multilayer film was formed instead of the oxide semiconductor film of the sample 7. As for the multilayer film, the 10-nm-thick first IGZO film was formed by a sputtering method using a metal oxide target containing In, Ga, and Zn at an atomic ratio of 1:3:2 under the following conditions: the Ar gas flow rate was 180 sccm and the $O_2$ gas flow rate was 20 sccm (the proportion of the $O_2$ gas was 10%); the pressure was 0.6 Pa; the film formation power was 5000 W; and the substrate temperature was 25° C. Then, the 10-nm-thick second IGZO film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C. Then, the 10-nm-thick third IGZO film was formed by a sputtering method using a metal oxide target containing In, Ga, and Zn at an atomic ratio of 1:3:2 under the following conditions: the Ar gas flow rate was 180 sccm and the $O_2$ gas flow rate was 20 sccm (the proportion of the $O_2$ gas was 10%); the pressure was 0.6 Pa; the film formation power was 5000 W; and the substrate temperature was 25° C.

Other steps are similar to those of the sample 7. Through the above process, the sample 8 was fabricated.

Next, a fabrication method of the sample 9 is described.

As for the sample 9, the multilayer film was formed instead of the oxide semiconductor film of the sample 7. As for the multilayer film, the 20-nm-thick first IGZO film was formed over the quartz substrate under the same conditions as the first IGZO film of the sample 8. Then, the 15-nm-thick second IGZO film was formed by a sputtering method under the same conditions as the second IGZO film of the sample 8. Then, the 10-nm-thick second IGZO film was formed under the same conditions as the third IGZO film of the sample 8.

Other steps are similar to those of the sample 7. Through the above process, the sample 9 was fabricated.

Next, a fabrication method of the sample 10 is described.

As for the sample 10, the 100-nm-thick oxide semiconductor film was formed over the quartz substrate under the same conditions as the sample 7.

Next, first heat treatment was performed under conditions similar to those of the sample 7.

Next, a 50-nm-thick first silicon oxynitride film and a 200-nm-thick second silicon oxynitride film were stacked over the oxide semiconductor film as the oxide insulating film. Here, the 50-nm-thick first silicon oxynitride film was formed by a plasma CVD method under the following conditions: the $SiH_4$ gas flow rate was 30 sccm and the $N_2O$ gas flow rate was 4000 sccm; the pressure was 40 Pa; the film formation power was 150 W; and the substrate temperature was 220° C. After that, the 200-nm-thick second silicon oxynitride film was formed by a plasma CVD method under the following conditions: the $SiH_4$ gas flow rate was 160 sccm and the $N_2O$ gas flow rate was 4000 sccm; the pressure was 200 Pa; the film formation power was 1500 W; and the substrate temperature was 220° C. Note that the second silicon oxynitride film is a film containing oxygen at a higher proportion than oxygen in the stoichiometric composition.

Next, a 100-nm-thick silicon nitride film was formed over the oxide insulating film under the same conditions as the sample 7.

Next, second heat treatment was performed under conditions similar to those of the sample 7.

Through the above process, the sample 10 was fabricated.

Next, the samples 7 to 10 were measured by ESR. In the ESR measurement performed at a predetermined temperature, a value of a magnetic field ($H_0$) where a microwave is absorbed is used for an equation $g=hn/bH_0$, so that a parameter of a g-factor can be obtained. Note that the frequency of the microwave is denoted by v, and the Planck constant and the Bohr magneton are denoted by, respectively, h and β which are both constants.

Here, the ESR measurement was performed under the conditions as follows. The measurement temperature was room temperature (25° C.), the high-frequency power (power of microwaves) of 8.92 GHz was 20 mW, and the direction of a magnetic field was parallel to a surface of each sample.

FIG. 27A shows a first derivative curve obtained by ESR measurement of the oxide semiconductor film in the sample 7; and FIGS. 27B and 27C show first derivative curves obtained by ESR measurement of the multilayer films in the samples 8 and 9. FIG. 27A shows the measurement result of the sample 7, FIG. 27B shows the measurement result of the sample 8, and FIG. 27C shows the measurement result of the sample 9.

Figure 28:
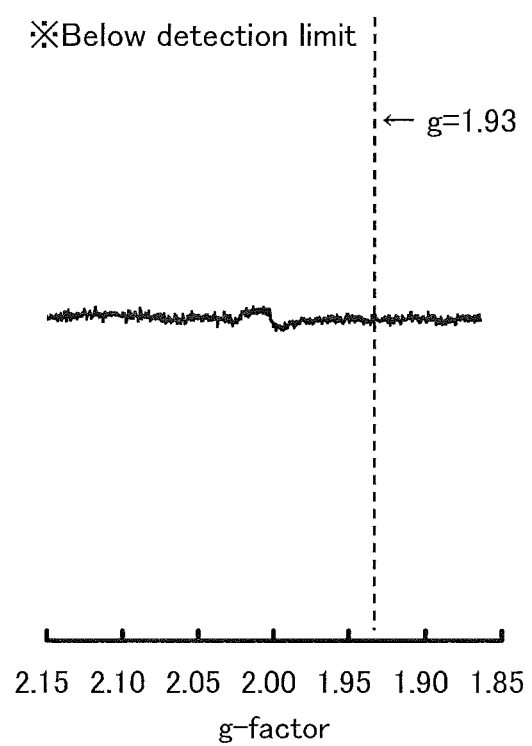
FIG. 28 is a graph showing results of ESR measurement.

FIG. 28 shows a first derivative curve obtained by ESR measurement of the oxide semiconductor film in the sample 10.

In FIGS. 27A to 27C, the sample 7 has signal symmetry due to defects having a g-factor of 1.93 in the oxide semiconductor film. The samples 8 and 9 each have signal symmetry due to defects having a g-factor of 1.95 in the multilayer film. As for the sample 7, the spin density corresponding to a g-factor of 1.93 was $2.5 \times 10^{19}$ spins/$cm^3$, in the sample 8, the total spin densities corresponding to g-factors of 1.93 and 1.95 were $1.6 \times 10^{19}$ spins/cm$^3$, and in the sample 9, the total spin densities corresponding to g-factors of 1.93 and 1.95 were $2.3 \times 10^{19}$ spins/cm$^3$. That is, it is found that the oxide semiconductor film and the multilayer film include defects. Note that an oxygen vacancy is an example of the defect in the oxide semiconductor film and the multilayer film.

Although, in FIG. 28, the thickness of the oxide semiconductor film of the sample 10 is greater than that of the oxide semiconductor film of the sample 7 and those of the multilayer films of the samples 8 and 9, signal symmetry due to a defect was not detected, i.e. the number of defects was less than or equal to the lower limit of detection (here, the lower limit of detection was $3.7 \times 10^{16}$ spins/cm$^3$). Accordingly, it is found that the number of defects in the oxide semiconductor film cannot be detected.

It is found that when a nitride insulating film, here the silicon nitride film formed by a plasma CVD method is in contact with an oxide semiconductor film or a multilayer film, defects, typically oxygen vacancies, are generated in the oxide semiconductor film or the multilayer film. On the other hand, when an oxide insulating film, here the silicon oxynitride film, is provided on an oxide semiconductor film, excess oxygen contained in the silicon oxynitride film, i.e. oxygen contained at a higher proportion than oxygen in the stoichiometric composition is diffused into the oxide semiconductor film and thus the number of defects in the oxide semiconductor film is not increased.

As described above, as shown in the samples 7 to 9, the oxide semiconductor film or the multilayer film which is in contact with the nitride insulating film has a number of defects, typically oxygen vacancies, and has a high conductivity and therefore can be used as an electrode of a capacitor. On the other hand, as shown in the sample 10, an oxide semiconductor film or a multilayer film which is in contact with the oxide insulating film has a small number of oxygen vacancies and low conductivity and therefore can be used as a channel formation region of a transistor.

Here, the cause of a reduction in resistivity of the oxide semiconductor film or the multilayer film which is in contact with the nitride insulating film is described below.
<Energy and Stability Between Existing Modes of Hydrogen (H)>

First, the energy difference and stability in a mode of H which exists in an oxide semiconductor film is described with calculated results. Here, InGaZnO$_4$ was used as the oxide semiconductor film.

The structure used for the calculation is based on a 84-atom bulk model in which twice the number of a hexagonal unit cell of the InGaZnO$_4$ is arranged along the a-axis and b-axis.

Figure 31A:
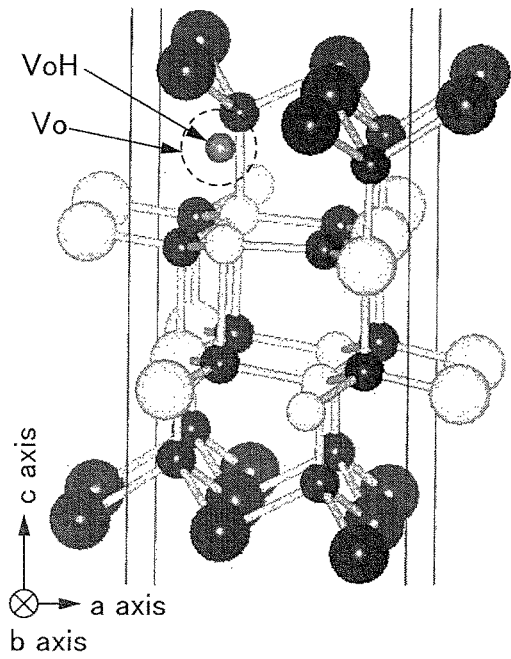
FIGS. 31A to 31D are diagrams describing bulk models of $InGaZnO_4$.
Figure 31B:
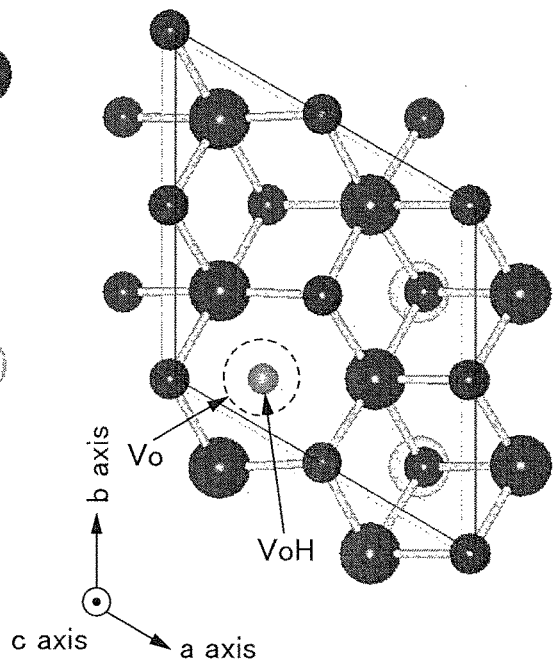

As the bulk model, a model in which one O atom bonded to three In atoms and one Zn atom is substituted with a H atom was prepared (see FIG. 31A). FIG. 31B shows a diagram in which the a-b plane of the InO layer in FIG. 31A is viewed from the c-axis direction. A region from which one O atom bonded to three In atoms and one Zn atom is removed is shown as an oxygen vacancy Vo, which is shown in a dashed line in FIGS. 31A and 31B. In addition, a H atom in the oxygen vacancy Vo is expressed as VoH.

Figure 31C:
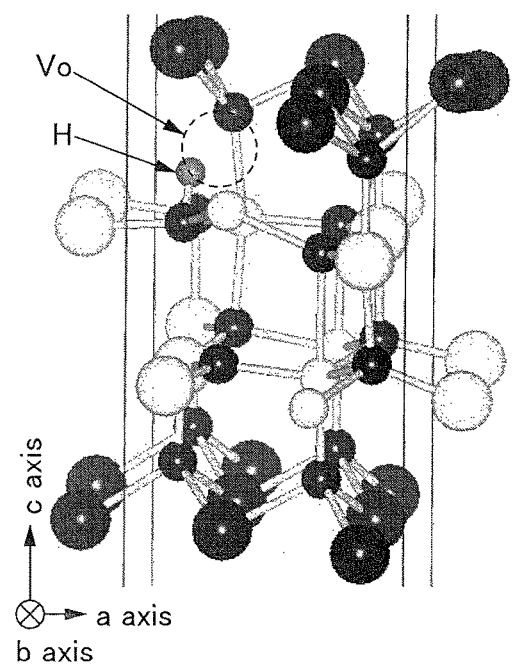
Figure 31D:
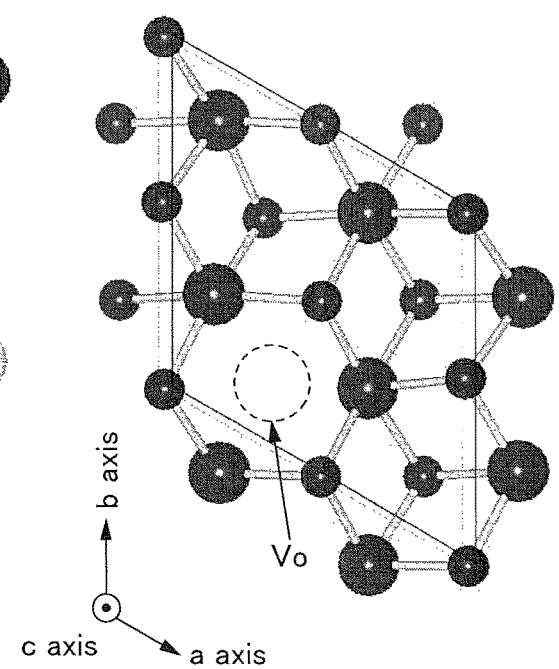

In the bulk model, one O atom bonded to three In atoms and one Zn atom is removed, whereby an oxygen vacancy Vo is formed. A model in which, in the vicinity of the oxygen vacancy Vo, a H atom is bonded to one O atom to which one Ga atom and two Zn atoms are bonded on the a-b plane was prepared (see FIG. 31C). FIG. 31D shows a diagram in which the a-b plane of the InO layer in FIG. 31C is viewed from the c-axis direction. In FIGS. 31C and 31D, an oxygen vacancy Vo is shown in a dashed line. A model in which an oxygen vacancy Vo is formed and, in the vicinity of the oxygen vacancy Vo, a H atom is bonded to one O atom to which one Ga atom and two Zn atoms are bonded on the a-b plane is expressed as Vo+H.

Optimization calculation was performed on the above two models with a fixed lattice constant to calculate the total energy. Note that as the value of the total energy is smaller, the structure becomes more stable.

In the calculation, first principles calculation software VASP (The Vienna Ab initio Simulation Package) was used. The calculation conditions are shown in Table 1.

TABLE 1

| Software | VASP |
|---|---|
| Pseudopotential | PAW |
| Functional | CGA/PBE |
| Cut-off energy | 500 eV |
| K-point | 4 × 4 × 1 |

As pseudopotential calculation of electronic states, a potential generated by a projector augmented wave (PAW) method was used, and as a functional, generalized-gradient-approximation/Perdew-Burke-Emzerhof (GGA/PBE) was used.

In addition, the total energy of the two models which were obtained by the calculations is shown in Table 2.

TABLE 2

| Model | Total Energy |
|---|---|
| VoH | −456.084 eV |
| Vo + H | −455.304 eV |

According to Table 2, the total energy of VoH is lower than that of Vo+H by 0.78 eV. Thus, VoH is more stable than Vo+H. Accordingly, when a H atom comes close to an oxygen vacancy (Vo), the H atom might be easily trapped in the oxygen vacancy (Vo) than bonding with an O atom.
<Thermodynamic State of VoH>

Next, the formation energy and the charge state of VoH which is generated by a H atom trapped in an oxygen vacancy (Vo) is described with calculated results. The formation energy of VoH is different depending on the charge state and also depends on the Fermi energy. Thus, the stable charge state of VoH is different depending on the Fermi energy. Here, (VoH)$^+$ denotes a state in which one electron is discharged by VoH, (VoH)$^-$ denotes a state in which one electron is trapped by VoH, and (VoH)$^0$ denotes a state in which an electron is not transferred. The formation energies of (VoH)$^+$, (VoH)$^-$, and (VoH)$^0$ were calculated.

In the calculation, the first principles calculation software VASP was used. The calculation conditions are shown in Table 3.

TABLE 3

| Software | VASP |
|---|---|
| Pseudopotential | PAW |
| Functional | HSE06 |
| Cut-off energy | 800 eV |
| Number of k-point sampling | 2 × 2 × 1 (opt.) |
| | 4 × 4 × 1 (single) |
| Spin polarization | setup |
| Shielding parameter | 0.2 |
| Fraction of the nonolcal Fock-exchange | 0.25 |
| Number of atoms | 84 |

As pseudopotential calculation of electronic states, a potential generated by a projector augmented wave (PAW) method was used, and as a functional, Heyd-Scuseria-Ernzerhof (HSE) DFT hybrid factor (HSE06) was used.

Note that the formation energy of an oxygen vacancy was calculated as follows: a dilute limit of the concentration of oxygen vacancies was assumed, and excessive expansion of electrons and holes to the conduction band and the valence band was corrected. In addition, shift of the valence band due to the defect structure was corrected using the average electrostatic potential with the top of the valence band of a complete crystal serving as the origin of energy.

Figure 32A:
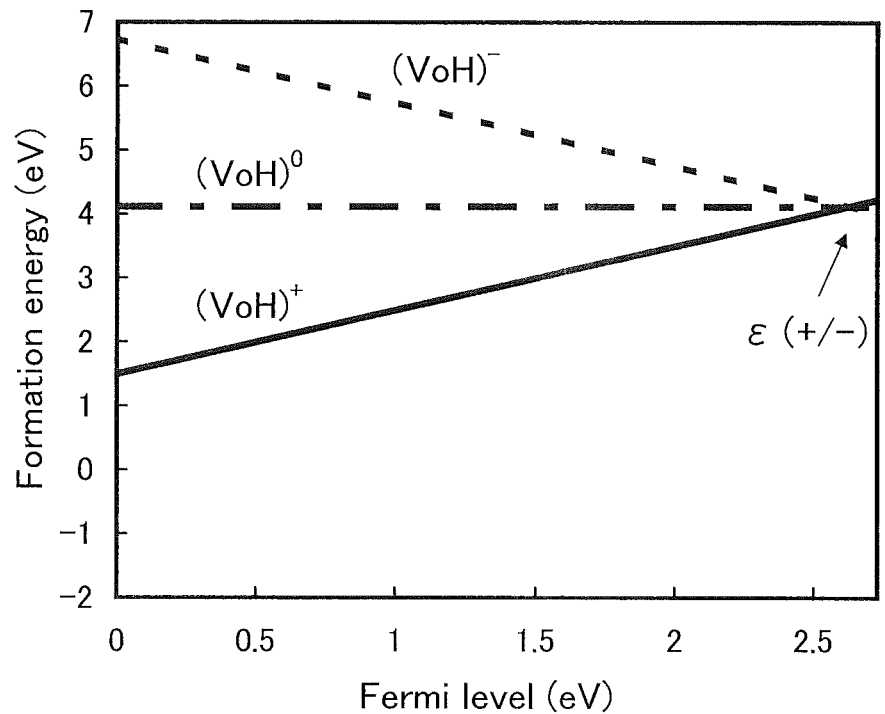
FIGS. 32A and 32B are a graph and a diagram describing formation energy and a thermodynamic transition level of VoH, respectively.

FIG. 32A shows the formation energies of $(VoH)^+$, $(VoH)^-$, and $(VoH)^0$. The horizontal axis represents the Fermi level, and the vertical axis represents the formation energy. The solid line represents the formation energy of $(VoH)^+$, the dashed-dotted line represents the formation energy of $(VoH)^0$, and the dashed line represents the formation energy of $(VoH)^-$. In addition, the transition level of the VoH charge from $(VoH)^+$ to $(VoH)^-$ through $(VoH)^0$ is represented by $\varepsilon\ (+/-)$.

Figure 32B:
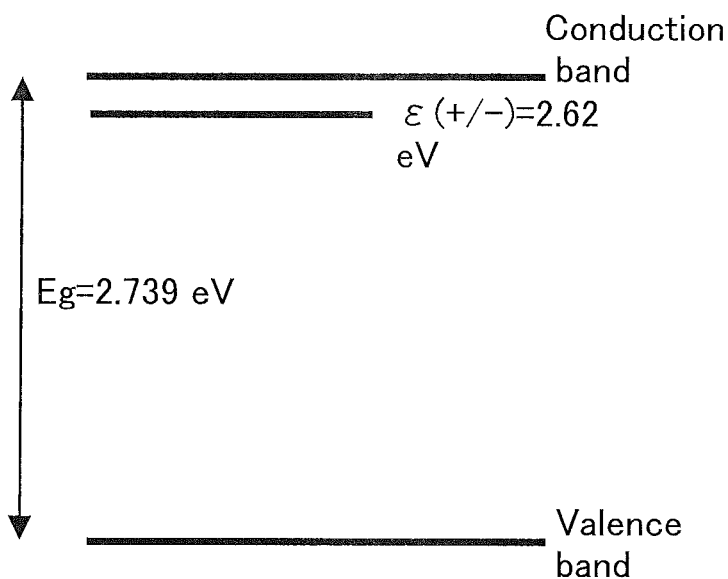

FIG. 32B shows a thermodynamic transition level of VoH. From the calculation result, the energy gap of $InGaZnO_4$ was 2.739 eV. In addition, when the energy of the valence band is 0 eV, the transfer level ($\varepsilon\ (+/-)$) is 2.62 eV, which exists just under the conduction band. This shows that $InGaZnO_4$ is n-type by trapping a H atom in an oxygen vacancy Vo.

When an oxide semiconductor film is exposed to plasma, the oxide semiconductor film is damaged and defects, typically oxygen vacancies are generated in the oxide semiconductor film. In addition, when a nitride insulating film is in contact with an oxide semiconductor film, hydrogen contained in the nitride insulating film is transferred to the oxide semiconductor film. As a result, VoH is formed in an oxide semiconductor film by entry of hydrogen into an oxygen vacancy in the oxide semiconductor film, so that the oxide semiconductor film becomes n-type film and the resistivity thereof is reduced. As described above, the oxide semiconductor film in contact with the nitride insulating film can be used as an electrode of a capacitor.

This application is based on Japanese Patent Application serial No. 2012-192214 filed with Japan Patent Office on Aug. 31, 2012 and Japanese Patent Application serial No. 2013-054021 filed with Japan Patent Office on Mar. 15, 2013, the entire contents of which are hereby incorporated by reference.

What is claimed is:

1. A semiconductor device comprising:
a first insulating film;
a first metal oxide film portion on and in contact with the first insulating film;
a second metal oxide film portion on and in contact with the first insulating film;
a transistor comprising the first metal oxide film portion as a channel formation region; and
a pixel electrode overlapping the second metal oxide film portion,
wherein a second insulating film is on and in direct contact with the second metal oxide film portion and overlaps the first metal oxide film portion,
wherein a third insulating film is interposed between the first metal oxide film portion and the second insulating film and overlaps the second metal oxide film portion, and
wherein a concentration in hydrogen of the second metal oxide film portion is greater than or equal to $8 \times 10^{19}$ atoms/cm$^3$.

2. The semiconductor device according to claim 1, wherein the concentration in hydrogen of the second metal oxide film portion is greater than or equal to $10^{20}$ atoms/cm$^3$.

3. The semiconductor device according to claim 1, wherein the concentration in hydrogen of the second metal oxide film portion is greater than or equal to $5 \times 10^{20}$ atoms/cm$^3$.

4. The semiconductor device according to claim 1, wherein the second insulating film comprises more nitrogen than oxygen, and
wherein the third insulating film comprises more oxygen than nitrogen.

5. The semiconductor device according to claim 1, further comprising a pixel portion,
wherein the first metal oxide film portion and the second metal oxide film portion are part of a pixel circuit localized in the pixel portion.

6. The semiconductor device according to claim 1, wherein the first metal oxide film portion and the second metal oxide film portion belong to two physically separate island-shaped metal oxide films.

7. The semiconductor device according to claim 1, wherein each of the first metal oxide film portion and the second metal oxide film portion contains more indium than gallium and more indium than zinc in atomic percentages.

8. The semiconductor device according to claim 1, wherein an indium proportion is about equal as an addition of a gallium proportion and a zinc proportion in each of the first metal oxide film portion and the second metal oxide film portion, in atomic percentages.

9. The semiconductor device according to claim 1, wherein each of the first metal oxide film portion and the second metal oxide film portion is formed from an In—Ga—Zn-based metal oxide containing In, Ga, and Zn at an atomic ratio of 3:1:2.

10. The semiconductor device according to claim 1, wherein a concentration in hydrogen of the first metal oxide film portion is more than $1 \times 10^{16}$ atoms/cm$^3$ and less than $5 \times 10^{19}$ atoms/cm$^3$.

11. The semiconductor device according to claim 1, wherein the third insulating film is on and in direct contact with the second metal oxide film portion.

12. A semiconductor device comprising:
a first insulating film;
a first metal oxide film portion on and in contact with the first insulating film;
a second metal oxide film portion on and in contact with the first insulating film;
a transistor comprising the first metal oxide film portion as a channel formation region; and
a pixel electrode overlapping the second metal oxide film portion,
wherein a second insulating film is on and in direct contact with the second metal oxide film portion and overlaps the first metal oxide film portion,
wherein a third insulating film is interposed between the first metal oxide film portion and the second insulating film and overlaps the second metal oxide film portion,
wherein a concentration in hydrogen of the second metal oxide film portion is greater than or equal to $8 \times 10^{19}$ atoms/cm$^3$, and
wherein a resistivity of the second metal oxide film portion is greater than or equal to $1 \times 10^{-8}$ times and less than or equal to $1 \times 10^{-1}$ times a resistivity of the first metal oxide film portion.

13. The semiconductor device according to claim 12, wherein a conductivity of the second metal oxide film portion is greater than or equal to 10 S/cm and less than or equal to 1000 S/cm.

14. The semiconductor device according to claim 12, wherein a conductivity of the second metal oxide film portion is greater than or equal to 100 S/cm and less than or equal to 1000 S/cm.

15. The semiconductor device according to claim 12, wherein the second insulating film comprises more nitrogen than oxygen, and
wherein the third insulating film comprises more oxygen than nitrogen.

16. The semiconductor device according to claim 12, further comprising a pixel portion,
wherein the first metal oxide film portion and the second metal oxide film portion are part of a pixel circuit localized in the pixel portion.

17. The semiconductor device according to claim 12, wherein the first metal oxide film portion and the second metal oxide film portion belong to two physically separate island-shaped metal oxide films.

18. The semiconductor device according to claim 12, wherein each of the first metal oxide film portion and the second metal oxide film portion contains more indium than gallium and more indium than zinc in atomic percentages.

19. The semiconductor device according to claim 12, wherein an indium proportion is about equal as an addition of a gallium proportion and a zinc proportion in each of the first metal oxide film portion and the second metal oxide film portion, in atomic percentages.

20. The semiconductor device according to claim 12, wherein each of the first metal oxide film portion and the second metal oxide film portion is formed from an In—Ga—Zn-based metal oxide containing In, Ga, and Zn at an atomic ratio of 3:1:2.

21. The semiconductor device according to claim 12, wherein a concentration in hydrogen of the first metal oxide film portion is more than $1\times10^{16}$ atoms/cm$^3$ and less than $5\times10^{19}$ atoms/cm$^3$.

22. The semiconductor device according to claim 12, wherein the third insulating film is on and in direct contact with the second metal oxide film portion.

* * * * *